US012615914B2

(12) United States Patent
Zhou et al.

(10) Patent No.: US 12,615,914 B2
(45) Date of Patent: Apr. 28, 2026

(54) DISPLAY PANEL AND DISPLAY DEVICE

(71) Applicant: Wuhan Tianma Microelectronics Co., Ltd., Wuhan (CN)

(72) Inventors: Hongbo Zhou, Wuhan (CN); Huangyao Wu, Wuhan (CN); Sha Lin, Wuhan (CN); Gaojun Huang, Wuhan (CN); Chunmei Gao, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 776 days.

(21) Appl. No.: 17/835,030

(22) Filed: Jun. 8, 2022

(65) Prior Publication Data

US 2022/0302238 A1    Sep. 22, 2022

(30) Foreign Application Priority Data

Jun. 30, 2021    (CN) .......................... 202110736811.8

(51) Int. Cl.
| | |
|---|---|
| *H10K 59/121* | (2023.01) |
| *G09G 3/32* | (2016.01) |
| *G09G 3/3233* | (2016.01) |
| *H10K 59/131* | (2023.01) |

(52) U.S. Cl.
CPC ........... *H10K 59/1213* (2023.02); *G09G 3/32* (2013.01); *G09G 3/3233* (2013.01); *H10K 59/131* (2023.02); *G09G 2300/0426* (2013.01); *G09G 2300/0819* (2013.01);
(Continued)

(58) Field of Classification Search
CPC ......... G09G 3/3233; G09G 2300/0819; G09G 2300/0852; G09G 2300/0861; G09G 2320/043
See application file for complete search history.

(56) References Cited

U.S. PATENT DOCUMENTS

| | | | |
|---|---|---|---|
| 2004/0263057 A1* | 12/2004 | Uchino | ................ G09G 3/3233 313/500 |
| 2017/0317155 A1 | 11/2017 | Oh | |
| 2018/0130420 A1* | 5/2018 | Gao | ..................... G09G 3/3258 |

(Continued)

FOREIGN PATENT DOCUMENTS

| | | | | |
|---|---|---|---|---|
| CN | 105336295 A | 2/2016 | | |
| CN | 108695371 A | * 10/2018 | ........... | G09G 3/3291 |

(Continued)

*Primary Examiner* — Shaheda A Abdin

(74) *Attorney, Agent, or Firm* — KDW Firm PLLC

(57) ABSTRACT

A display panel and a display device are provided, and the display panel includes an array substrate. The array substrate includes a plurality of pixel circuits, a plurality of reference signal lines and a plurality of pixel connecting semiconductor portions. The plurality of pixel circuits is arranged in an array in a row direction and a column direction, each pixel circuit includes a pixel driving semiconductor portion which includes two fixed potential nodes, and the row direction intersects the column direction. The fixed potential nodes are electrically connected to one of the plurality of reference signal lines. Two fixed potential nodes adjacent in a first direction are electrically connected by one of the plurality of the pixel connecting semiconductor portions, and the first direction is parallel to a plane where the array substrate is located.

26 Claims, 41 Drawing Sheets

(52) U.S. Cl.
  CPC .............. *G09G 2300/0842* (2013.01); *G09G 2300/0861* (2013.01); *G09G 2310/08* (2013.01)

(56) References Cited

U.S. PATENT DOCUMENTS

| | | | | |
|---|---|---|---|---|
| 2019/0206969 | A1 | 7/2019 | Hwang | |
| 2020/0286432 | A1 | 9/2020 | Zhang | |
| 2021/0335258 | A1* | 10/2021 | Bao | ...................... G09G 3/3233 |

FOREIGN PATENT DOCUMENTS

| | | | |
|---|---|---|---|
| CN | 110335564 | A | 10/2019 |
| CN | 111697040 | A | 9/2020 |
| CN | 111951729 | A | 11/2020 |
| CN | 113013218 | A | 6/2021 |
| CN | 113078174 | A | 7/2021 |

* cited by examiner

200

DISPLAY PANEL AND DISPLAY DEVICE

CROSS-REFERENCE TO RELATED APPLICATION

This application claims priority to Chinese Patent Application No. 202110736811.8 filed Jun. 30, 2021, the disclosure of which is incorporated herein by reference in its entirety.

FIELD

Embodiments of the present disclosure relate to the field of display technologies and, in particular, relate to a display panel and a display device.

BACKGROUND

Organic light emitting diodes (OLED) are one of hot topics in the field of display research. Compared with liquid crystal displays (LCDs), OLED display screens have advantages of low energy consumption, low production cost, self-luminance, wide viewing angle and fast response speed. At present, OLED array substrates in display fields such as mobile phones, personal digital assistants (PDAs) and digital cameras have begun to replace conventional LCD array substrates.

Pixel circuits are provided in the OLED array substrate to drive the OLED light-emitting elements, and the pixel circuits still need to be improved.

SUMMARY

A display panel and a display device are provided according to embodiments of the present disclosure. The display panel includes a pixel circuit, and the pixel circuit is improved so that the performance of the pixel circuit is improved, and thereby, the display performance is improved.

In a first aspect, a display panel is provided according to an embodiment of the present disclosure. The display panel includes an array substrate, and the array substrate includes multiple pixel circuits, a reference signal line and a pixel connecting semiconductor portion.

The multiple pixel circuits are arranged in an array in a row direction and a column direction, each of the multiple pixel circuits includes a pixel driving semiconductor portion, the pixel driving semiconductor portion includes two fixed potential nodes, and the row direction intersects the column direction.

The fixed potential nodes are electrically connected to the reference signal line.

Two fixed potential nodes adjacent in a first direction are electrically connected by the pixel connecting semiconductor portion, and the first direction is parallel to a plane where the array substrate is located.

In a second aspect, a display device is further provided according to an embodiment of the present disclosure and the display device includes the display panel described in the first aspect.

BRIEF DESCRIPTION OF DRAWINGS

In order that technical solutions in embodiments of the present disclosure or the related art are described more clearly, drawings to be used in the description of the embodiments or the related art are briefly described hereinafter. Apparently, while the drawings in the description hereinafter are some embodiments of the present disclosure, for the person skilled in the art, these drawings may be expanded and extended to other structures and drawings according to the basic concepts of the device structure, driving method, and manufacturing method disclosed and indicated in embodiments of the present disclosure. These are undoubtedly all within the scope of the claims of the present disclosure.

DETAILED DESCRIPTION

In order for the object, technical solutions and advantages of the present disclosure to be clearer, the technical schemes of the present disclosure are described clearly and completely hereinafter with reference to the drawings through the embodiments. Apparently, the embodiments described below are part, not all, of the embodiments of the present disclosure. All other embodiments acquired by the person skilled in the art on the basis of basic concepts disclosed and suggested by the embodiments of the present disclosure fall within the scope of protection of the present disclosure.

Figure 1:
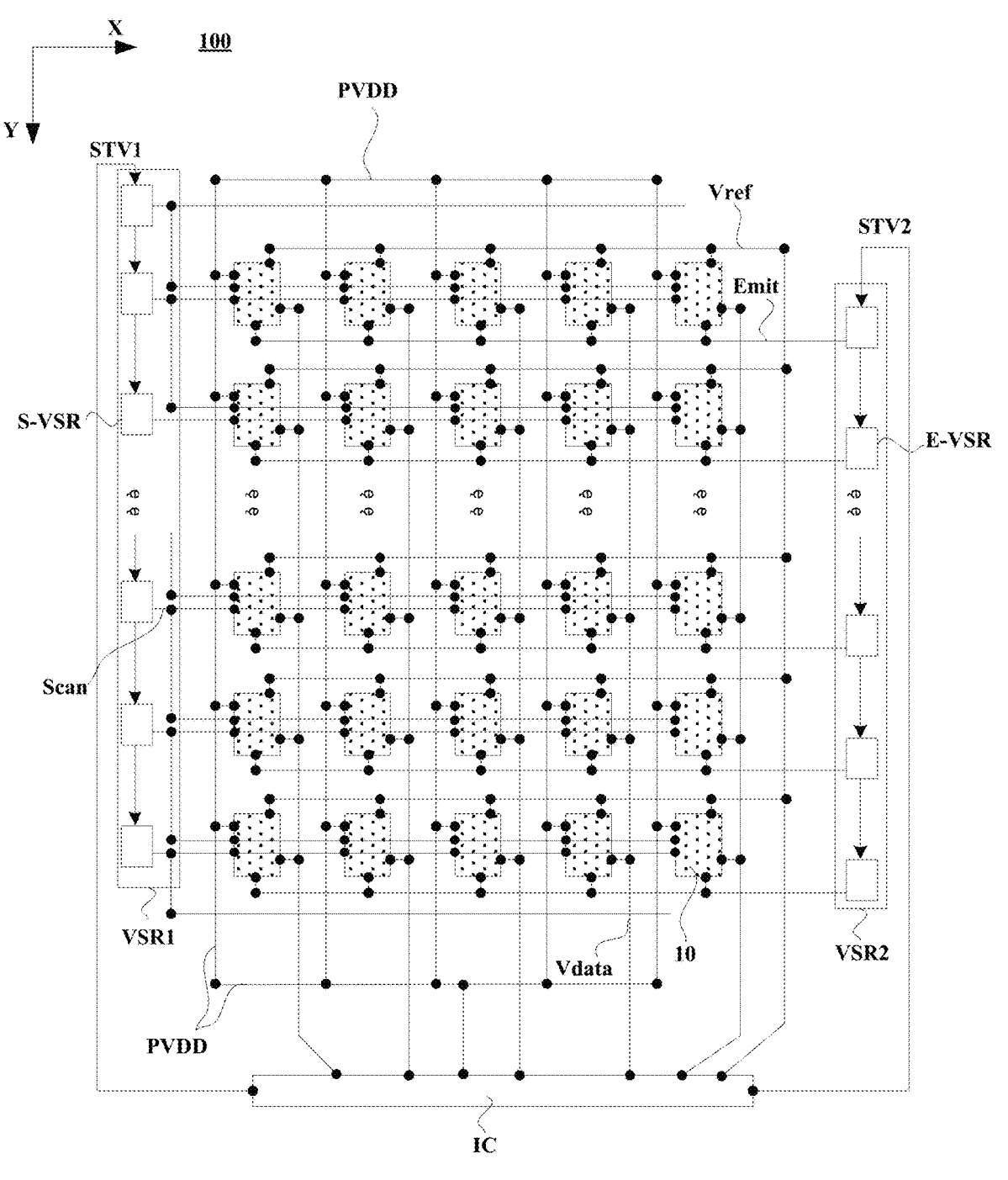
FIG. 1 is a structural diagram of a display panel according to an embodiment of the present disclosure.
Figure 2:
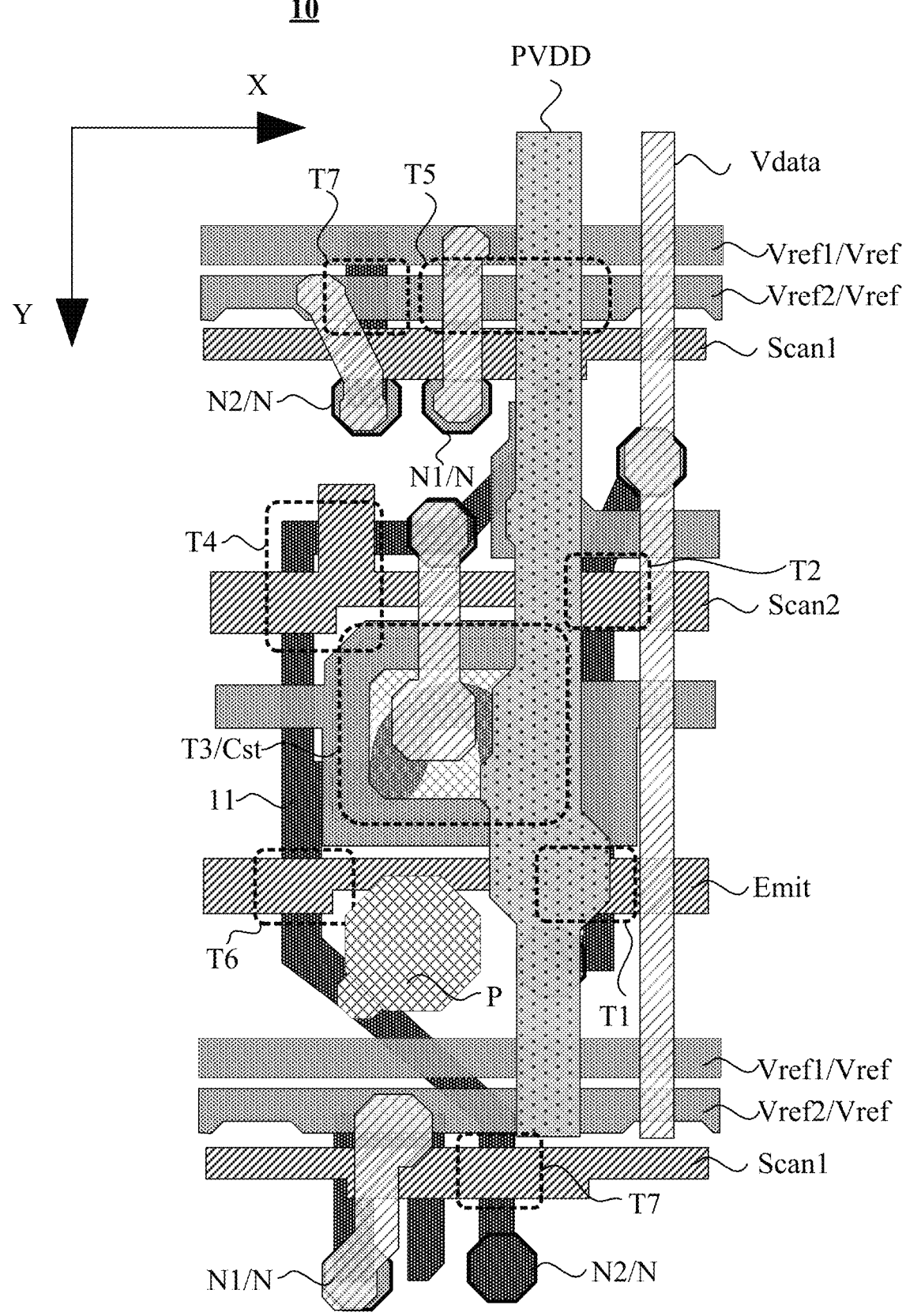
FIG. 2 is a schematic diagram of a structural layout of a pixel circuit according to an embodiment of the present disclosure.
Figure 3:
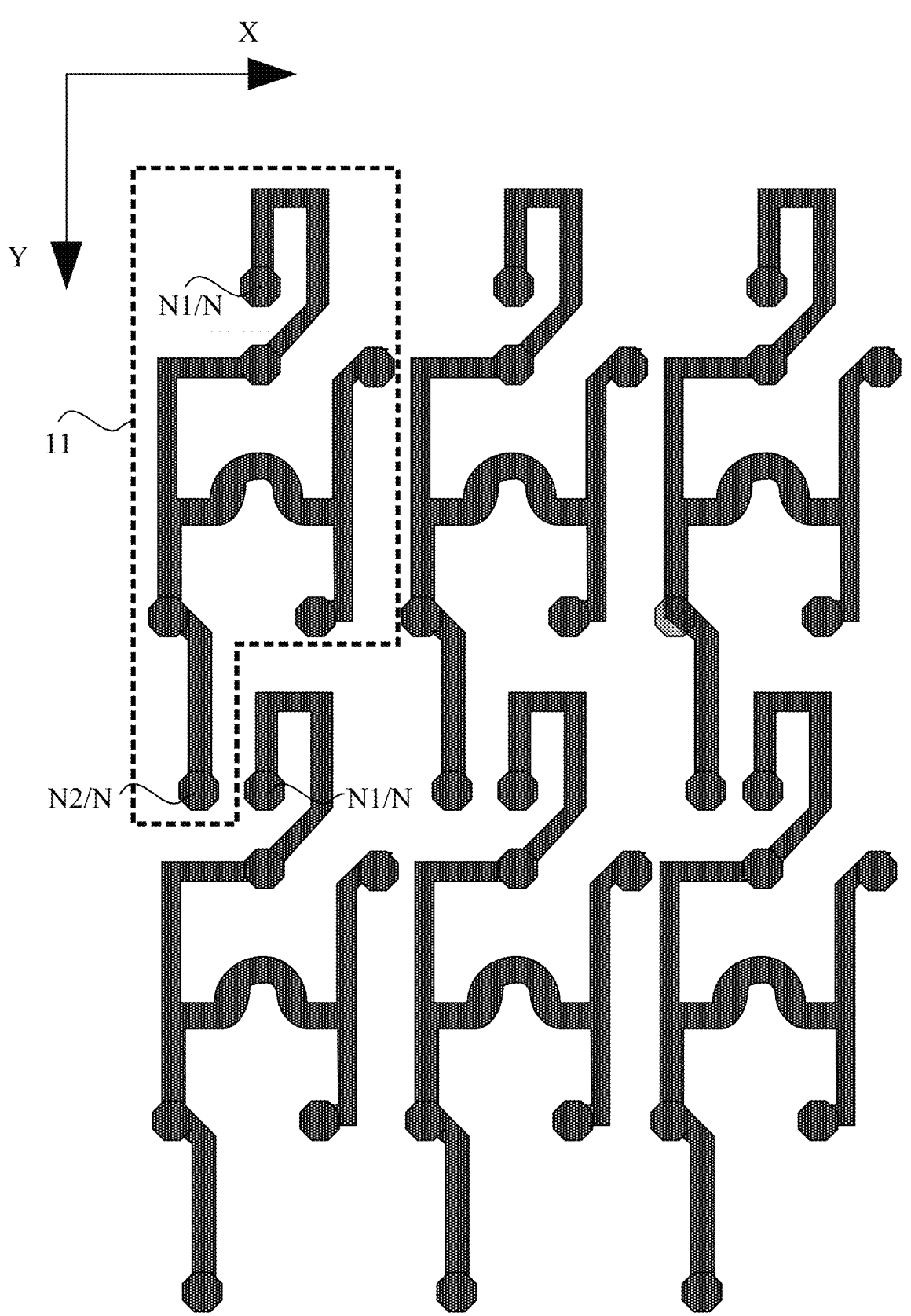
FIG. 3 is a structural diagram of a pixel driving semiconductor portion according to an embodiment of the present disclosure.

FIG. 1 is a structural diagram of a display panel according to an embodiment of the present disclosure, FIG. 2 is a schematic diagram of a structural layout of a pixel circuit according to an embodiment of the present disclosure, and FIG. 3 is a structural diagram of a pixel driving semiconductor portion according to an embodiment of the present disclosure. As shown in FIG. 1, FIG. 2, and FIG. 3, the display panel according to the embodiment of the present disclosure includes an array substrate 100, and the array substrate 100 includes multiple pixel circuits 10, a reference signal line Vref, and a pixel connecting semiconductor portion. The multiple pixel circuits are arranged in an array in a row direction (a direction X as shown in the figures) and a column direction (a direction Y as shown in the figures), each of the pixel circuits 10 includes a pixel driving semiconductor portion 11 including two fixed potential nodes N (N1 and N2 as shown in the figures), and the row direction intersects the column direction.

The fixed potential nodes N are electrically connected to the reference signal line Vref.

Two fixed potential nodes N adjacent in a first direction are connected by the pixel connecting semiconductor portion, and the first direction is parallel to a plane where the array substrate is located.

First, the basic structure of the display panel is described with reference to the structural diagram of the display panel shown in FIG. 1. As shown in FIG. 1, the array substrate 100 according to the embodiment of the present application includes multiple pixel circuits 10 which may be arranged in an array. For example, the multiple pixel circuits 10 may be arranged in an array in the row direction X and the column direction Y which intersect with each other.

Exemplarily, the array substrate 100 may further include a drive chip IC, a first gate driving circuit VSR1, a second gate driving circuit VSR2, a power signal line PVDD, a data signal line Vdata, a reference signal line Vref, scan signal lines Scan1 and Scan2, and a light emission control signal line Emit.

The first gate driving circuit VSR1 may include multiple cascaded shift registers S-VSRs, each shift register S-VSR is connected to pixel circuits 10 by a scan signal line, and the first gate driving circuit VSR1 is configured to provide a scan signal to the pixel circuits 10. The drive chip IC provides a first start signal STV1 to the first gate driving circuit VSR1. In addition, as shown in FIG. 1, in the multiple cascaded shift registers S-VSRs, except for a first stage of shift register S-VSR and a last stage of shift register S-VSR, the other shift registers S-VSR may provide scan signals for adjacent two rows of pixel circuits. In this case, two rows of dummy pixel circuits (not shown in FIG. 1) may be provided on the array substrate, which are respectively connected to a scanning line of the first stage of shift register S-VSR and a scanning line of the last stage of shift register S-VSR, but the dummy pixel circuits are not used for display.

The second gate driving circuit VSR2 may include multiple cascaded shift registers E-VSRs, each shift register E-VSR is connected to pixel circuits 10 by a light emission control signal line Emit, and the second gate driving circuit VSR2 is configured to provide a light emission control signal to the pixel circuits 10. The drive chip IC provides a second start signal STV2 to the second gate driving circuit VSR2.

In addition, a clock signal line (not shown in FIG. 1), a high-level signal line (VGH) (not shown in FIG. 1), and a low-level signal line (VGL) (not shown in FIG. 1) may be connected between the first gate driving circuit VSR1 and the drive chip IC and between the second gate driving circuit VSR2 and the drive chip IC. The drive chip IC provides clock signals, high-level signals, and low-level signals to the first gate driving circuit VSR1 and the second gate driving circuit VSR2 to ensure that the first gate driving circuit VSR1 can normally output scan signals, and the second gate driving circuit VSR2 can normally output light emission control signals.

Multiple different arrangements may be provided to the first gate driving circuit VSR1 and the second gate driving circuit VSR2. Exemplarily, as shown in FIG. 1, the array substrate 100 may include one first gate driving circuit VSR1 and one second gate driving circuit VSR2. The first gate driving circuit VSR1 and the second gate driving circuit VSR2 may be arranged on two opposite sides of the array substrate 100 in a second direction Y. The first gate driving circuit VSR1 and the second gate driving circuit VSR2 may also be arranged on the same side. For another example, the array substrate 100 may include two first gate driving circuits VSR1s and two second gate driving circuits VSR2s. Each of two ends of the scan signal line is electrically connected to one first gate driving circuit VSR1, and each of two ends of the light emission control signal line Emit is electrically connected to one second gate driving circuit VSR2, so as to ensure good consistency of the scan signal in the scan signal line and the light emission control signal in the light emission control signal line. For another example, the array substrate 100 includes two first gate driving circuits VSR1s, one of the first gate driving circuits VSR1s is electrically connected to pixel circuits in odd-numbered rows through scan signal lines, and the other one of first gate driving circuit VSR1 is electrically connected to pixel circuits in even-numbered rows through scan signal lines, thereby ensuring that the first gate driving circuits VSR1s each have a simple structure. For another example, the array substrate 100 includes two second gate driving circuits VSR2s, one of the second gate driving circuits VSR2s is electrically connected to pixel circuits in odd-numbered rows through light emission control signal lines, and the other one of second gate driving circuits VSR2s is electrically connected to pixel circuits in even-numbered rows through light emission control signal lines, thereby ensuring that the second gate driving circuits VSR2s each have a simple structure. The specific arrangements of the first gate driving circuit VSR1 and the second gate driving circuit VSR2 are not described in the embodiments of the present disclosure. The above description of the first gate driving circuit VSR1 and the second gate driving circuit VSR2 is merely a few examples and is not intended to limit the present application. It is only necessary to ensure that the scan signal and the light emission control signal can be normally provided. Exemplarily, a gate driving circuit capable of generating both a scan signal and a light emission control signal may be provided.

Figure 4:
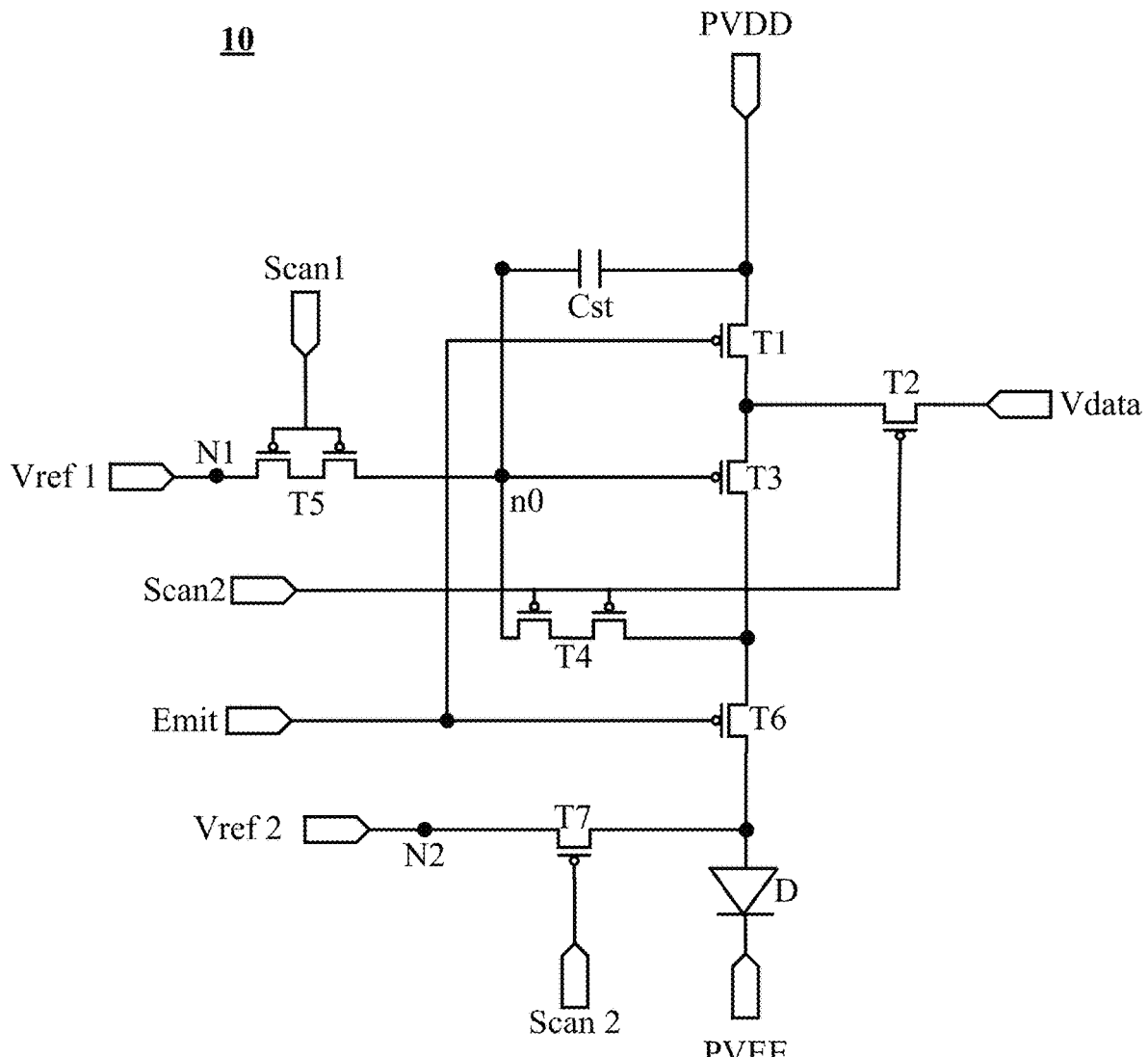
FIG. 4 is a schematic diagram of a circuit structure of a pixel circuit according to an embodiment of the present disclosure.
Figure 5:
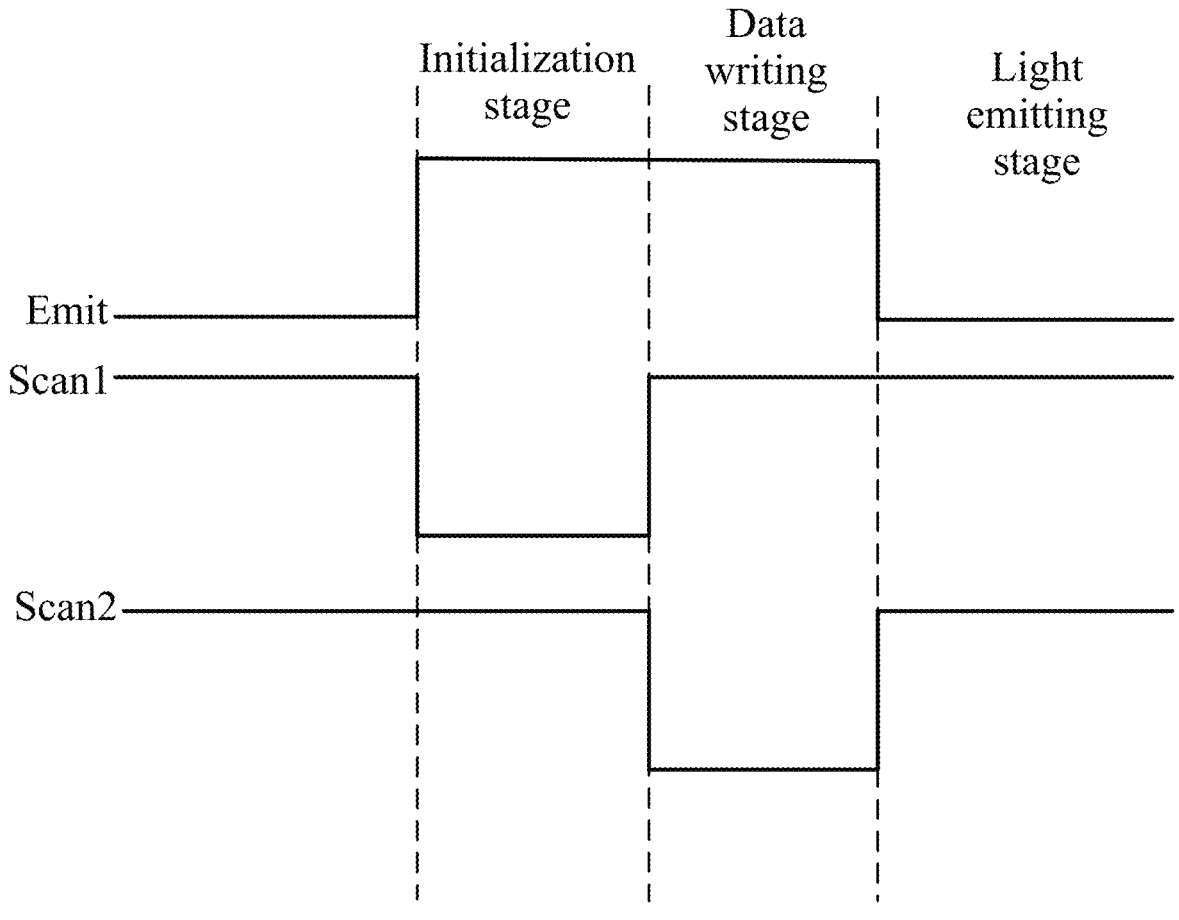
FIG. 5 is a schematic diagram of timing sequences of a scan signal and a light emission control signal in the pixel circuit of FIG. 4.

Further, FIG. 4 is a structural diagram of a circuit structure of a pixel circuit according to an embodiment of the present disclosure, and FIG. 5 is a schematic diagram of timing sequences of a scan signal and a light emission control signal in the pixel circuit in FIG. 4. Referring to FIG. 2, FIG. 4, and FIG. 5, each pixel circuit may include multiple thin-film transistors. In FIG. 2 and FIG. 4, it is taken as an example for illustration that the pixel circuit includes seven thin-film transistors and one storage capacitor, that is, a 7T1C circuit. With reference to FIG. 2, FIG. 4, and FIG. 5, the operation process of the pixel circuit is briefly described hereinafter. Referring to FIG. 2 and FIG. 4, taking any row of pixel circuits as an example, a first scan signal line Scan1 controls a first reset transistor T5 of the pixel circuit to be turned on or turned off and resets a gate potential of a drive transistor T3 when the first reset transistor T5 is turned on. A second scan signal line Scan2 controls a data writing transistor T2 and a threshold compensation transistor T4 of the pixel circuit to be turned on and turned off, and writes a data signal on the data signal line Vdata to a gate of the drive transistor T3 and compensates a threshold voltage of the drive transistor T3 when the data writing transistor T2 and the threshold compensation transistor T4 are turned on. In some pixel circuit designs, the scan signal Scan n may also be used for controlling a second reset transistor T7 of the pixel circuit to be turned on or turned off and to reset an anode potential of a light-emitting element when the second reset transistor T7 is turned on. In this case, it is not necessary to provide a scan signal line for the second reset transistor T7 separately.

In other words, the first scan signal line may be understood as a scan signal line connected to a control terminal of the first reset transistor in the pixel circuit 10, and the second scan signal line may be understood as a scan signal line connected to a control terminal of the data writing transistor, a control terminal of the compensation transistor and a control terminal of the second reset transistor in the pixel circuit 10. Generally, each row of pixel circuits 10 for display is connected to at least the first scan signal line and the second scan signal line correspondingly.

The power signal line PVDD is configured to provide a power voltage to the drive transistor T3, and the voltage on the power signal line PVDD may be a positive voltage. The voltage on a common power signal terminal PVEE may be a negative voltage. The reference signal line Vref is configured to provide a reset voltage signal, and the voltage on the reference signal line Vref may be a negative voltage.

The above-described embodiment is described by taking each transistor in the pixel circuit 10 being a P-type transistor as an example. In another optional embodiment, each transistor in the pixel circuit 10 may be an N-type transistor or a part of the transistors in the pixel circuit 10 may be P-type transistors and a part of the transistors in the pixel circuit 10 may be N-type transistors. Different enable levels may be provided according to different types of transistors, where the enable level is a level capable of turning on the transistor. Exemplarily, the enable level is a high level for an N-type transistor and a low level for a P-type transistor.

As shown in FIG. 5, a driving process of the pixel circuit 10 may include an initialization stage, a data writing stage and a light emitting stage. In the initialization stage, the first scan signal line Scan1 provides a low-level signal and the first reset transistor T5 is turned on to reset the gate potential of the drive transistor T3. In the data writing stage, the second scan signal line Scan2 provides a low-level signal, the data writing transistor T2 and the threshold compensation transistor T4 are turned on, and the data signal on the data signal line Vdata is written to the gate of the drive transistor T3 to compensate the threshold voltage of the drive transistor T3; and the second reset transistor T7 is not turned on to rest the anode potential of the light-emitting element. In the light emitting stage, the light emission control signal line Emit provides a low-level signal, the light emission control transistors T1 and T6 are turned on, a driving current generated by the drive transistor T3 is transmitted to the light-emitting element, and the light-emitting element emits light.

It is to be noted that FIG. 2, FIG. 4 and FIG. 5 are merely examples and are not intended to limit the present application.

On the basis of the above-described embodiment, with continued reference to FIG. 2 and FIG. 3, the pixel driving semiconductor portion 11 may be an active layer in a thin-film transistor FIG. 3 exemplarily shows the pixel driving semiconductor portion 11 in 2 rows*3 columns of pixel circuits 10. Referring to FIG. 2 and FIG. 3, the pixel driving semiconductor portion 11 includes two fixed potential nodes N such as N1 and N2 shown in FIGS. 2 and 3, and the two fixed potential nodes N1 and N2 may be connected to input terminals of different thin-film transistors, for example, the first node N1 is connected to an input terminal (a source or a drain) of the first reset transistor T5, and the second node N2 is connected to an input terminal (a source or a drain) of the second reset transistor T7. The two fixed potential nodes N1 and N2 are electrically connected to the reference signal line Vref and are configured to receive a reference signal provided by the reference signal line Vref and reset the gate of the drive transistor T3 in the pixel circuit and reset the light-emitting element D in the display panel, so as to ensure that the current display state of the display panel is not affected by the previous display state and ensure that the display effect is good. In this embodiment of the present disclosure, the pixel driving semiconductor portion 11 includes two fixed potential nodes N1 and N2, so that a large adjustment space in adjusting the pixel driving semiconductor portion can be ensured by adjusting the N1 and N2. Thus, the performance of the pixel driving semiconductor portion can be improved from multiple dimensions, which facilitates the improvement of the performance of the pixel driving semiconductor portion from the multiple dimensions and the improvement of the performance of the entire pixel circuit and the display panel. Moreover, the display panel according to the embodiment of the present disclosure further includes the pixel connecting semiconductor portion (not shown in FIG. 2 and FIG. 3), two adjacent fixed potential nodes arranged in the first direction are electrically connected by the pixel connecting semiconductor portion, so as to facilitate the signal transmission between the two fixed potential nodes, the improvement of signal consistency in the pixel driving semiconductor portion and the improvement of the display effect of the display panel.

It should be noted that the specific orientation of the first direction is not limited in the embodiment of the present disclosure, and the first direction may be the row direction, the column direction, or a direction whose included angle with the row direction or the column direction is an acute angle. The first direction will be described in detail in accordance with specific arrangements of the pixel connecting semiconductor portion subsequently.

In summary, in the display panel according to the embodiment of the present disclosure, two fixed potential nodes are provided for the pixel driving semiconductor portion, and both of the two fixed potential nodes are electrically connected to the reference signal line to reset the light-emitting element and some nodes in the pixel circuit, thereby ensuring that the current display state of the display panel is not affected by the previous display state and ensuring that the display effect is good. Further, the pixel driving semiconductor portion includes two fixed potential nodes so that the adjustment space in the later adjustment of the pixel driving semiconductor portion is relatively large, which facilitates improving the performance of the pixel driving semiconductor portion from multiple dimensions and improving the performance of the entire pixel circuit and the display panel. Moreover, the display panel according to the embodiment of the present disclosure further includes the pixel connecting semiconductor portion, and two adjacent fixed potential nodes arranged in the first direction are electrically connected by the pixel connecting semiconductor portion, so as to facilitate the signal transmission between the two fixed potential nodes and improving the signal consistency in the pixel driving semiconductor portion and the display effect of the display panel.

On the basis of the above embodiment, with continued reference to FIG. 2 and FIG. 4, the pixel circuit 10 includes the drive transistor T3, the light-emitting element D, the first reset transistor T5 and the second reset transistor T7. The drive transistor T3 is configured to control the light-emitting element D to light up, the first reset transistor T5 is configured to control the reference signal to reset the gate potential of the drive transistor T3, and the second reset transistor T7 is configured to control the reference signal to reset the anode potential of the light-emitting element D.

The array substrate 100 further includes the first scan signal line Scan1 extending in the row direction, there are two overlapping regions between the first scan signal line Scan1 and the pixel driving semiconductor portions 11 in a direction perpendicular to a plane where the array substrate 100 is located, and a channel of the first reset transistor T5 and a channel of the second reset transistor T7 respectively include pixel driving semiconductor portions where the two overlapping regions are located.

The two fixed potential nodes N include the first node N1 and the second node N2. One terminal of the first reset transistor T5 is electrically connected to the first node N1, and another terminal of the first reset transistor T5 is electrically connected to the gate of the drive transistor T3. One terminal of the second reset transistor T7 is electrically connected to the second node N2, and another terminal of the second reset transistor T7 is electrically connected to the anode of the light-emitting element D.

Exemplarily, as shown in FIG. 2, the regions where the first scan signal line Scan1 overlaps with the pixel driving semiconductor portions 11 in the direction perpendicular to the plane where the array substrate 100 is located are the first reset transistor T5 and the second reset transistor T7. It is to be noted that the first reset transistor T5 and the second reset transistor T7 are the first reset transistor T5 and the second reset transistor T7 in two pixel circuits adjacent in the column direction, that is, the first reset transistor T5 is the first reset transistor T5 in the pixel circuit at the present stage, and the second reset transistor T7 is the second reset transistor T7 in the pixel circuit at the previous stage. When a scan signal is transmitted on the first scan signal line Scan1, the first reset transistor T5 in the pixel circuit at the present stage is configured to reset the gate of the drive transistor T3 in the pixel circuit at the present stage according to a received reference signal, and meanwhile, the second reset transistor T7 in the pixel circuit at the previous stage is configured to reset the anode of the light-emitting element corresponding to the pixel circuit at the previous stage according to a received reference signal.

Next, in accordance with the foregoing description of the pixel circuit and the pixel driving semiconductor portion, the specific arrangements of the reference signal line and the pixel connecting semiconductor portion are described in detail.

Figure 6:
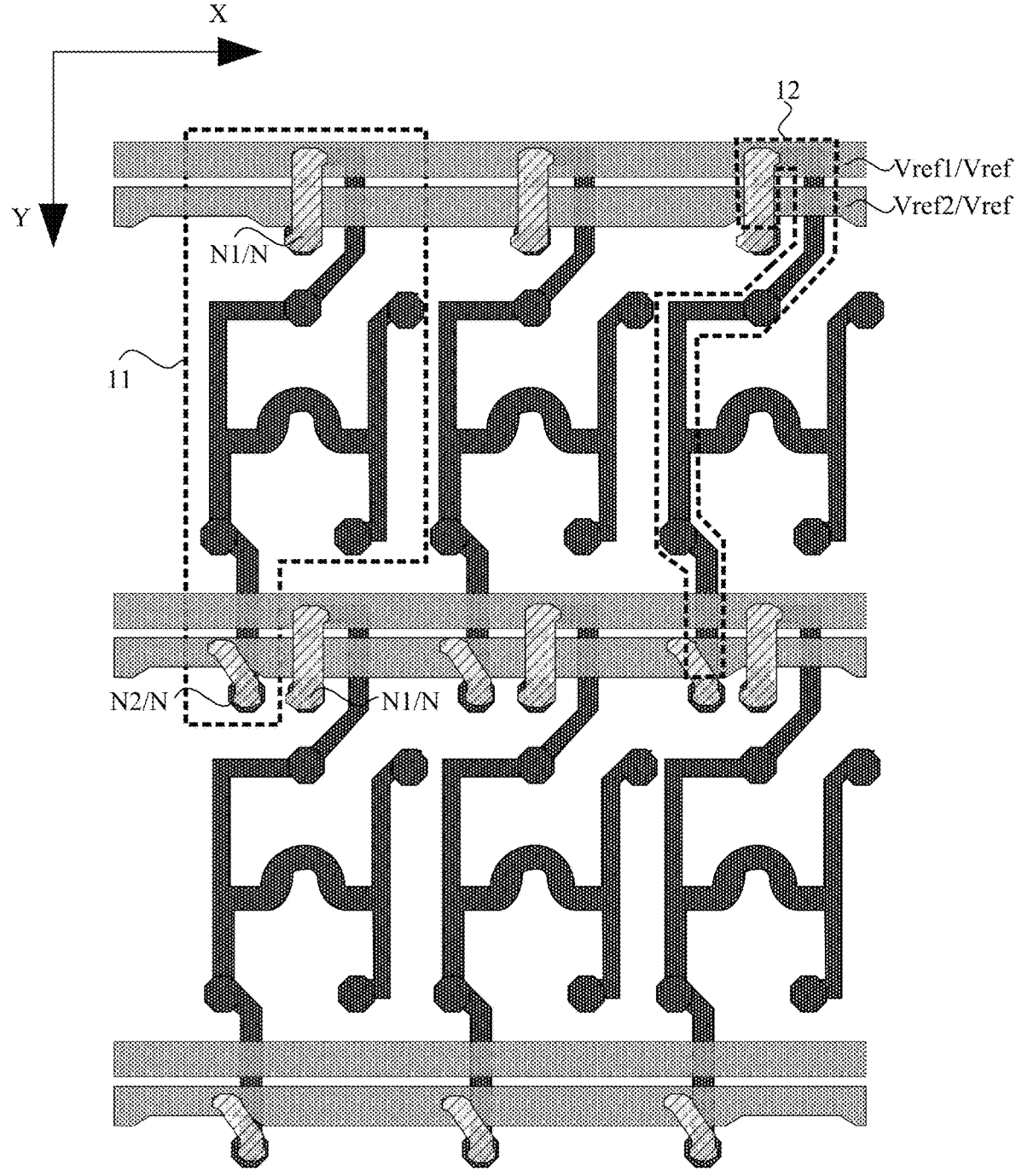
FIG. 6 is a structural diagram of a pixel driving semiconductor portion, a pixel connecting semiconductor portion, and a reference signal line according to an embodiment of the present disclosure.

As an implementable embodiment, FIG. 6 is a structural diagram of a pixel driving semiconductor portion, a pixel connecting semiconductor portion, and a reference signal line according to an embodiment of the present disclosure. Referring to FIG. 2 and FIG. 6, the reference signal line Vref includes a first reference signal line Vref1 and a second reference signal line Vref2 that extend in the row direction and are parallel to each other; the two fixed potential nodes include the first node N1 and the second node N2; and in the same pixel driving semiconductor portion 11, the first node N1 is electrically connected to the first reference signal line Vref1, and the second node N2 is electrically connected to the second reference signal line Vref2.

The pixel driving semiconductor portion 11 includes the pixel connecting semiconductor portion 12, and the first node N1 and the second node N2 in the same pixel driving semiconductor portion 11 are electrically connected by the pixel connecting semiconductor portion 12.

Exemplarily, it can be known from the above description that the reference signal received by the first node N1 is used for resetting the gate of the drive transistor T3, and the reference signal received by the second node N2 is used for resetting the anode of the light-emitting element. Therefore, the first node N1 and the second node N2 are required to receive different reference signals due to the different structures to be reset. Accordingly, in the embodiment of the present disclosure, the reference signal line Vref includes the first reference signal line Vref1 and the second reference signal line Vref2 that extend in the row direction and are parallel to each other; and the two fixed potential nodes include the first node N1 and the second node N2; and in the same pixel driving semiconductor portion 11, the first node N1 is electrically connected to the first reference signal line Vref1, the second node N2 is electrically connected to the second reference signal line Vref2, and the first reference signal line Vref1 and the second reference signal line Vref2 can provide different reference signals to ensure separate reset of the gate of the drive transistor T3 and the anode of the light-emitting element and ensure good reset effect of the gate of the drive transistor T3 and the anode of the light-emitting element.

Further, with continued reference to FIG. 2 and FIG. 6, the pixel driving semiconductor portion 11 may include the pixel connecting semiconductor portion 12, that is, the pixel connecting semiconductor portion 12 is a part of the pixel driving semiconductor portion 11. In an embodiment, the pixel connecting semiconductor portion 12 is a part of the same pixel driving semiconductor portion 11 for connecting the first node N1 and the second node N2. In this way, it is not necessary to add a fabrication process of the pixel connecting semiconductor portion 12, the pixel connecting semiconductor portion 12 is provided in a simple manner, and the fabrication process is simple.

Figure 7:
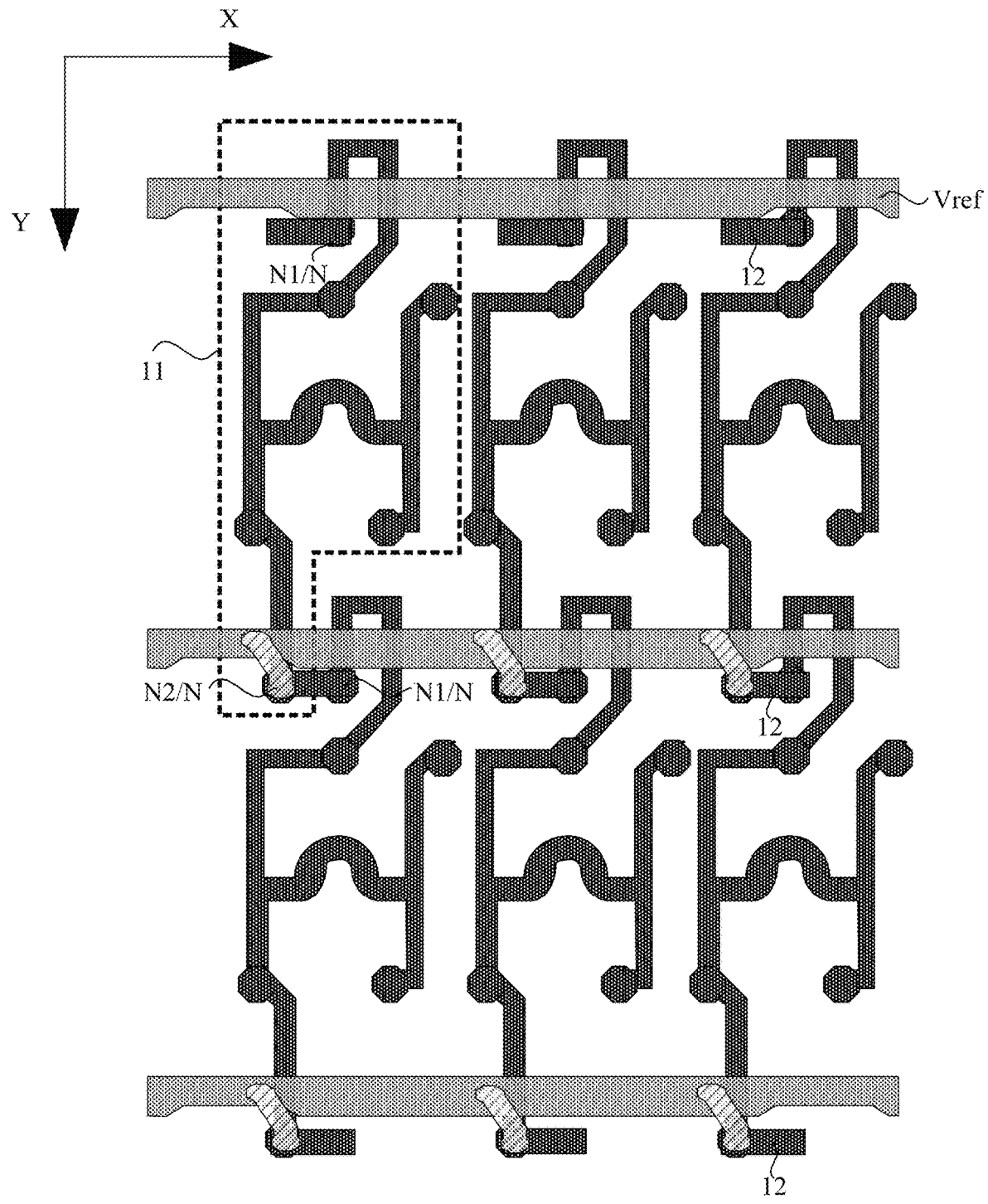
FIG. 7 is a structural diagram of another pixel driving semiconductor portion, pixel connecting semiconductor portion and reference signal line according to an embodiment of the present disclosure.
Figure 8:
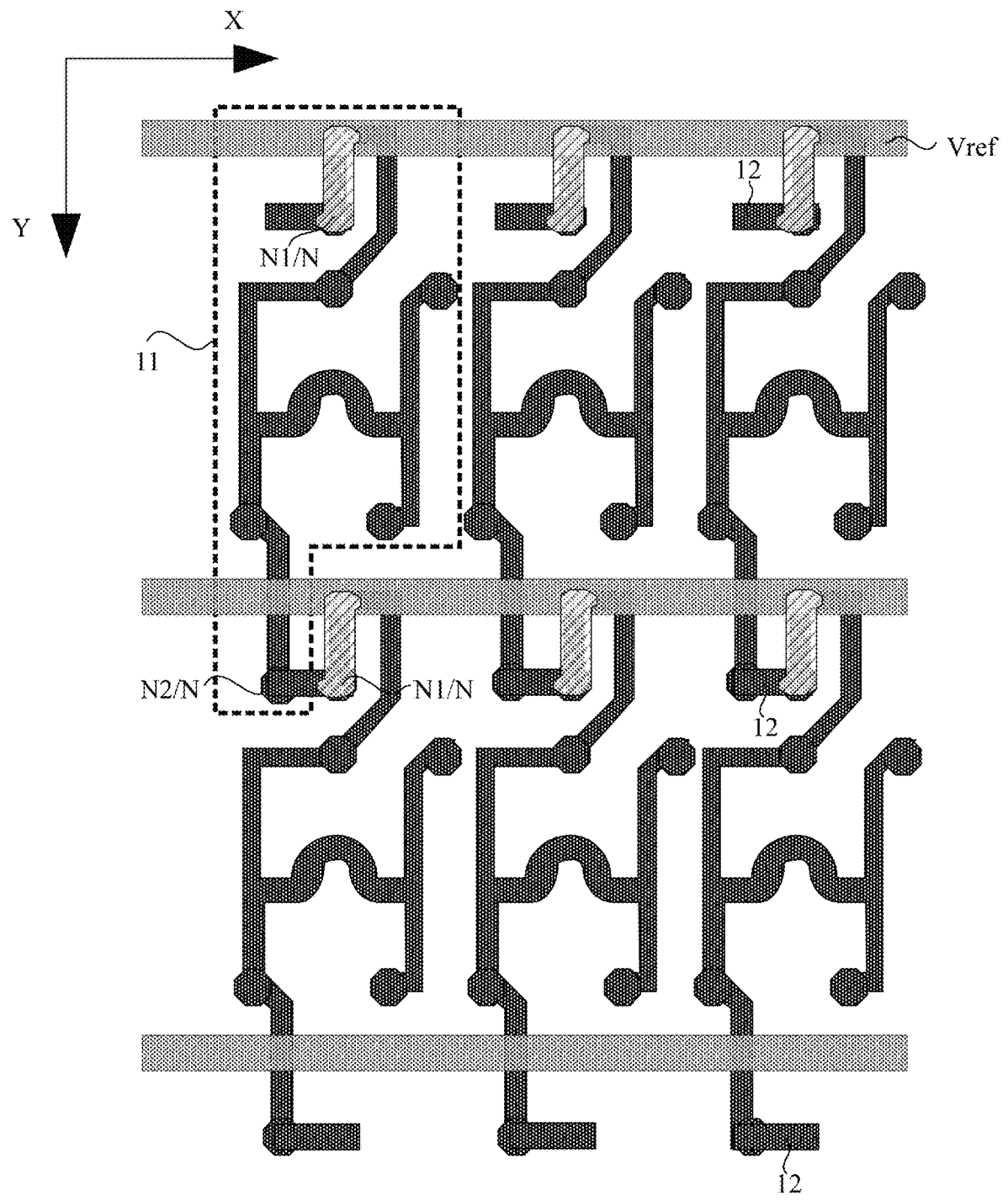
FIG. 8 is a structural diagram of another pixel driving semiconductor portion, pixel connecting semiconductor portion and reference signal line according to an embodiment of the present disclosure.

As another implementable embodiment, FIG. 7 is a structural diagram of another pixel driving semiconductor portion, pixel connecting semiconductor portion and reference signal line according to an embodiment of the present disclosure, and FIG. 8 is a structural diagram of another pixel driving semiconductor portion, pixel connecting semiconductor portion and reference signal line according to an embodiment of the present disclosure. As shown in FIG. 7 and FIG. 8, two fixed potential nodes N include the first node N1 and the second node N2. As shown in FIG. 7, the second node N2 is electrically connected to the reference signal line Vref, and the first node N1 is electrically connected to the reference signal line Vref through the pixel connecting semiconductor portion 12 and the second node N2; alternatively, as shown in FIG. 8, the first node N1 is electrically connected to the reference signal line Vref, and the second node N2 is electrically connected to the reference signal line Vref through the pixel connecting semiconductor portion 12 and the first node N1.

Among multiple pixel driving semiconductor portions 11 arranged sequentially in the column direction, the second node N2 in the pixel driving semiconductor portion 11 at the current stage is electrically connected to the first node N1 in the pixel driving semiconductor portion 11 at the next stage by the pixel connecting semiconductor portion 12.

It can be known from the above that the reference signal provided by the reference signal line Vref may be a negative potential signal which may reset both the first node N1 and the second node N2. As shown in FIG. 7 and FIG. 8, only one reference signal line Vref is provided, which can ensure that the arrangement manner of the reference signal line Vref is simple.

Further, the first node N1 may be directly electrically connected to the reference signal line Vref, and in this case, the second node N2 may be electrically connected to the reference signal line Vref through the pixel connecting semiconductor portion 12 and the first node N1, as shown in FIG. 8; alternatively, the second node N2 may be directly electrically connected to the reference signal line Vref, and in this case, the first node N1 may be electrically connected to the reference signal line Vref through the pixel connecting semiconductor portion 12 and the second node N2, as shown in FIG. 7. Thus, it can be achieved that both the first node N1 and the second node N2 are electrically connected to the reference signal line Vref, so as to ensure that the gate of the drive transistor and the anode of the light-emitting element can be reset and ensure that the display panel can display normally.

Further, with continued reference to FIG. 7 and FIG. 8, among the multiple pixel driving semiconductor portions 11 arranged sequentially in the column direction, the second node N2 in the pixel driving semiconductor portion 11 at the current stage is electrically connected to the first node N1 in the pixel driving semiconductor portion 11 at the next stage by the pixel connecting semiconductor portion 12, and thus the multiple pixel driving semiconductor portions 11 are connected in the column direction by the pixel connecting semiconductor portions 12 to form a continuous semiconductor trace. In this way, static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved.

Further, the pixel connecting semiconductor portion 12 and the pixel driving semiconductor portion 11 may be disposed in the same layer, made of the same material and fabricated in the same process, thereby ensuring that the display panel has a simple structure and a simple fabrication process.

Figure 9:
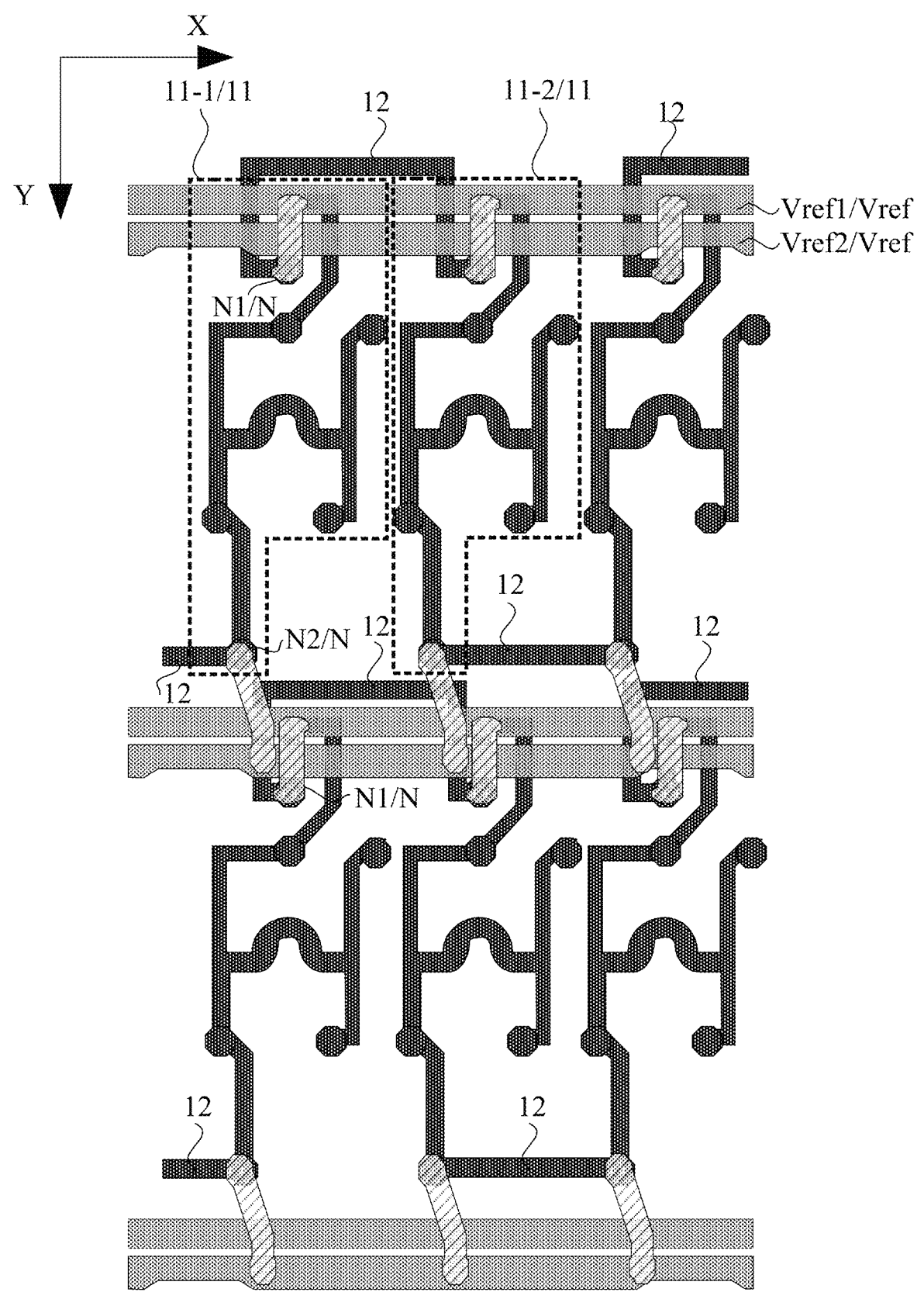
FIG. 9 is a structural diagram of another pixel driving semiconductor portion, pixel connecting semiconductor portion and reference signal line according to an embodiment of the present disclosure.
Figure 10:
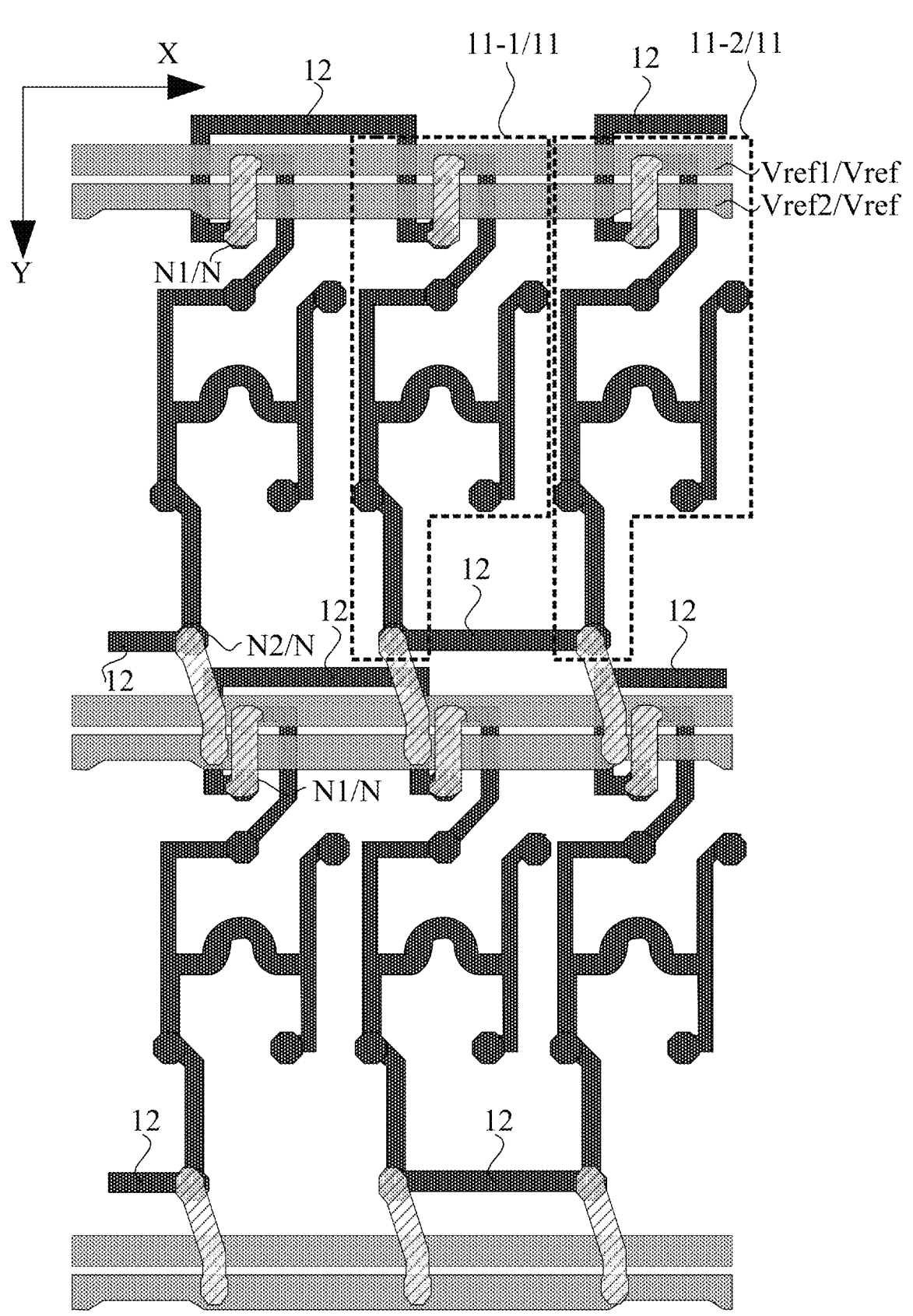
FIG. 10 is a structural diagram of another pixel driving semiconductor portion, pixel connecting semiconductor portion and reference signal line according to an embodiment of the present disclosure.

As another implementable embodiment, FIG. 9 is a structural diagram of another pixel driving semiconductor portion, pixel connecting semiconductor portion and reference signal line according to an embodiment of the present disclosure, and FIG. 10 is a structural diagram of another pixel driving semiconductor portion, pixel connecting semiconductor portion and reference signal line according to an embodiment of the present disclosure. As shown in FIG. 9 and FIG. 10, the reference signal line Vref includes the first reference signal line Vref1 and the second reference signal line Vref2 that extend in the row direction and are parallel to each other, and two fixed potential nodes N include the first node N1 and the second node N2. In the same pixel driving semiconductor portion 11, the first node N1 is electrically connected to the first reference signal line Vref1, and the second node N2 is electrically connected to the second reference signal line Vref2.

Two pixel driving semiconductor portions 11 adjacent in the row direction include a first pixel driving semiconductor portion 11-1 and a second pixel driving semiconductor portion 11-2, and the first node N1 in the first pixel driving semiconductor portion 11-1 is electrically connected to the first node N1 in the second pixel driving semiconductor portion 11-2 by the pixel connecting semiconductor portion 12, or the second node N2 in the first pixel driving semiconductor portion 11-1 is electrically connected to the second node N2 in the second pixel driving semiconductor portion 11-2 by the pixel connecting semiconductor portion.

Exemplarily, it can be known from the above description that the reference signal received by the first node N1 is used for resetting the gate of the drive transistor T3, and the reference signal received by the second node N2 is used for resetting the anode of the light-emitting element. Therefore, the first node N1 and the second node N2 are required to receive different reference signals due to the different structures to be reset. Accordingly, in the embodiment of the present disclosure, the reference signal line Vref includes the first reference signal line Vref1 and the second reference signal line Vref2 that extend in the row direction and are parallel to each other; and the two fixed potential nodes include the first node N1 and the second node N2; and in the same pixel driving semiconductor portion 11, the first node N1 is electrically connected to the first reference signal line Vref1, the second node N2 is electrically connected to the second reference signal line Vref2, and the first reference signal line Vref1 and the second reference signal line Vref2 can provide different reference signals to ensure separate reset of the gate of the drive transistor T3 and the anode of the light-emitting element and ensure good reset effect of the gate of the drive transistor T3 and the anode of the light-emitting element.

Further, as shown in FIG. 9, in two adjacent pixel driving semiconductor portions 11 arranged in the row direction, the first node N1 in the first pixel driving semiconductor portion 11-1 is electrically connected to the first node N1 in the second pixel driving semiconductor portion 11-2 by the pixel connecting semiconductor portion 12; and as shown in FIG. 10, in the two adjacent pixel driving semiconductor portions 11 arranged in the row direction, the second node N2 in the first pixel driving semiconductor portion 11-1 is electrically connected to the second node N2 in the second pixel driving semiconductor portion 11-2 by the pixel connecting semiconductor portion. Thus, multiple pixel driving semiconductor portions 11 are connected to each other in the row direction by the pixel connecting semiconductor portions 12 to form a continuous semiconductor trace. In this way, static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved.

It is to be noted that the difference between FIG. 9 and FIG. 10 is only in that the first pixel driving semiconductor portion 11-1 and the second pixel driving semiconductor portion 11-2 are determined in different manners. It can be known from FIG. 9 and FIG. 10 that the difference between FIG. 9 and FIG. 10 is only in that the first pixel driving semiconductor portion 11-1 in FIG. 9 corresponds to the second pixel driving semiconductor portion 11-2 in FIG. 10, and the second pixel driving semiconductor portion 11-2 in FIG. 9 corresponds to the first pixel driving semiconductor portion 11-1 in FIG. 10. Therefore, in the structure shown in FIG. 9 and the structure shown in FIG. 10, multiple pixel driving semiconductor portions 11 can be connected to each other in the row direction by the pixel connecting semiconductor portions 12 to form a continuous semiconductor trace, thereby ensuring that the driving capabilities of the pixel circuits are substantially consistent, achieving the display uniformity, and improving the display effect.

Further, the pixel connecting semiconductor portion 12 and the pixel driving semiconductor portion 11 may be disposed in the same layer, made of the same material and are fabricated in the same process, thereby ensuring that the display panel has a simple structure and a simple fabrication process.

On the basis of the above-described embodiments, there may be multiple different arrangement manners in which multiple pixel driving semiconductor portions 11 can be connected to each other in the row direction by the pixel connecting semiconductor portion 12, which are described by taking implementable arrangement manners among those arrangement manners as examples.

As an implementable embodiment, with continued reference to FIG. 9 and FIG. 10, the first node N1 and the second node N2 in the pixel driving semiconductor portion 11 are respectively located on two opposite sides of the pixel driving semiconductor portion 11 in the first direction, the first direction is parallel to the column direction or the angle between the first direction and the column direction is an acute angle, and the pixel driving semiconductor portions 11 in the two pixel circuits have the same pattern.

Exemplarily, the first direction is not limited in the embodiments of the present disclosure, and the first direction may be parallel to the column direction Y or the angle between the first direction and the column direction Y is an acute angle. In FIG. 9 and FIG. 10, it is taken as an example for illustration that the first direction is approximately parallel to the column direction Y, that is, the included angle between the first direction and the column direction Y is an acute angle. Further, as shown in FIG. 9 and FIG. 10, patterns of the pixel driving semiconductor portions 11 in any two pixel circuits are the same so that the driving capabilities of any two driving circuits can be the same, thereby ensuring good display uniformity of the display panel. Moreover, patterns of the pixel driving semiconductor portions 11 in any two pixel circuits being the same may further ensure that the pixel driving semiconductor portions 11 can be provided in a simple way and the mask reticle has a simple structure in the mask process. Therefore, in the scheme of the embodiment of the present disclosure, the gate of the drive transistor T3 and the anode of the light-emitting element are reset separately so that the good effect of resetting of both the gate of the drive transistor T3 and the anode of the light-emitting element can be ensured, and multiple pixel driving semiconductor portions 11 can be connected in the row direction by the pixel connecting semiconductor portions 12 to form a continuous semiconductor trace so that the basic consistency of the driving capabilities of the pixel circuits can be ensured, and the display uniformity can be improved on the basis of achieving the display uniformity, and it can be ensured that the pixel driving semiconductor portion 11 can be provided in a simple way and the mask reticle has a simple structure in the mask process.

It is to be noted that, in FIG. 9 and FIG. 10, in pixel driving semiconductor portions 11 at two adjacent stages, the first node N1 and the second node N2 are staggered in the column direction Y. Exemplarily, the second node N2 in the pixel driving semiconductor portion 11 at the previous stage is located at a position above the first node N1 in the pixel driving semiconductor portion 11 at the current stage. This arrangement is only for the sake of a simpler illustration of the pixel connecting semiconductor portion 12 in FIG. 9 and FIG. 10, rather than limiting the scheme of the embodiment. For example, in pixel driving semiconductor portions 11 at two adjacent stages, the first node N1 and the second node N2 may also be staggered in the column direction Y. By adjusting the arrangements of the pixel connecting semiconductor portions 12, it is ensured that the first node N1 in the first pixel driving semiconductor portion 11-1 is electrically connected to the first node N1 in the second pixel driving semiconductor portion 11-2 by the pixel connecting semiconductor portion 12, or in two adjacent pixel driving semiconductor portions 11 arranged in the row direction, the second node N2 in the first pixel driving semiconductor portion 11-1 is electrically connected to the second node N2 in the second pixel driving semiconductor portion 11-2 by the pixel connecting semiconductor portion.

Figure 11:
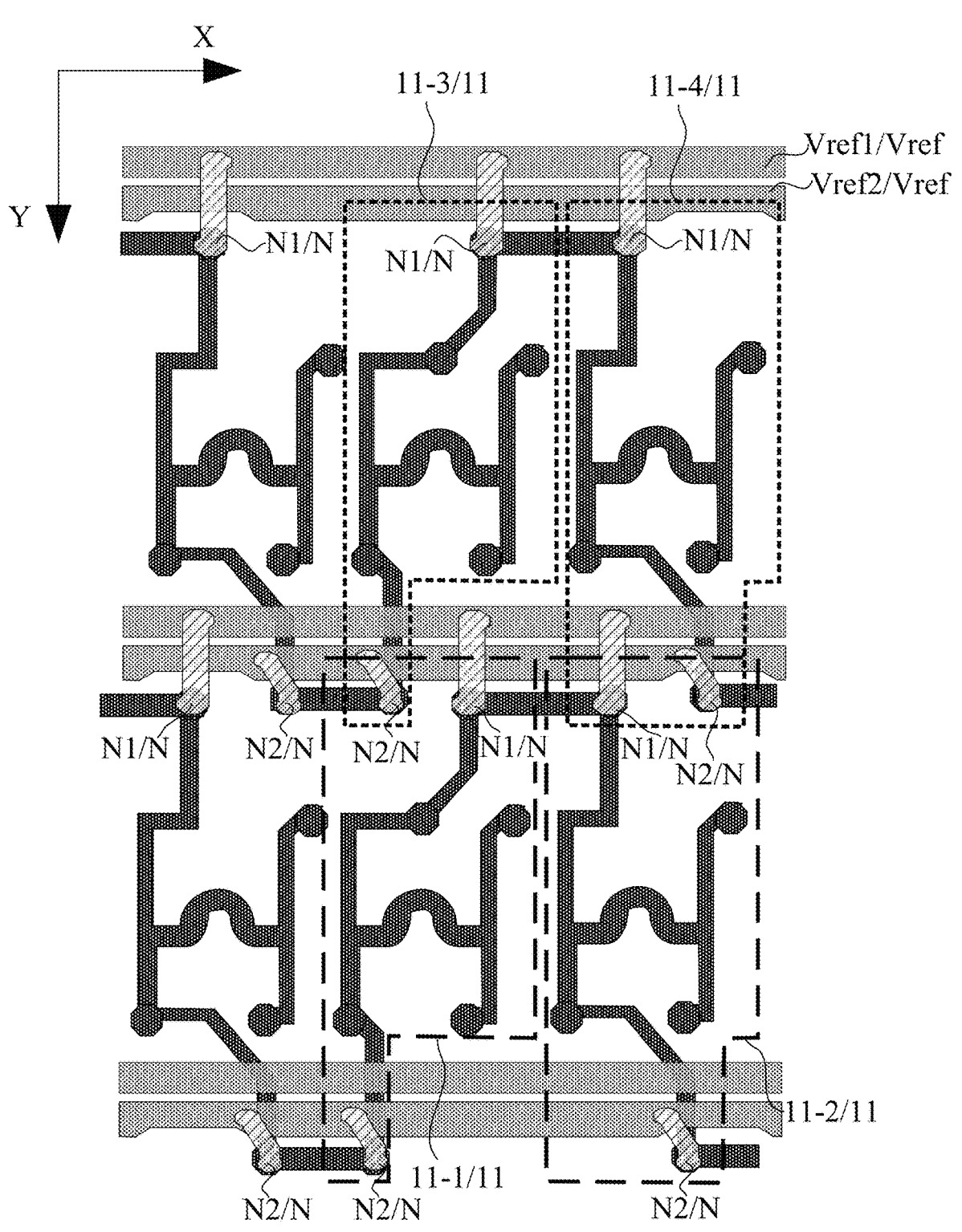
FIG. 11 is a structural diagram of another pixel driving semiconductor portion, pixel connecting semiconductor portion and reference signal line according to an embodiment of the present disclosure.
Figure 12:
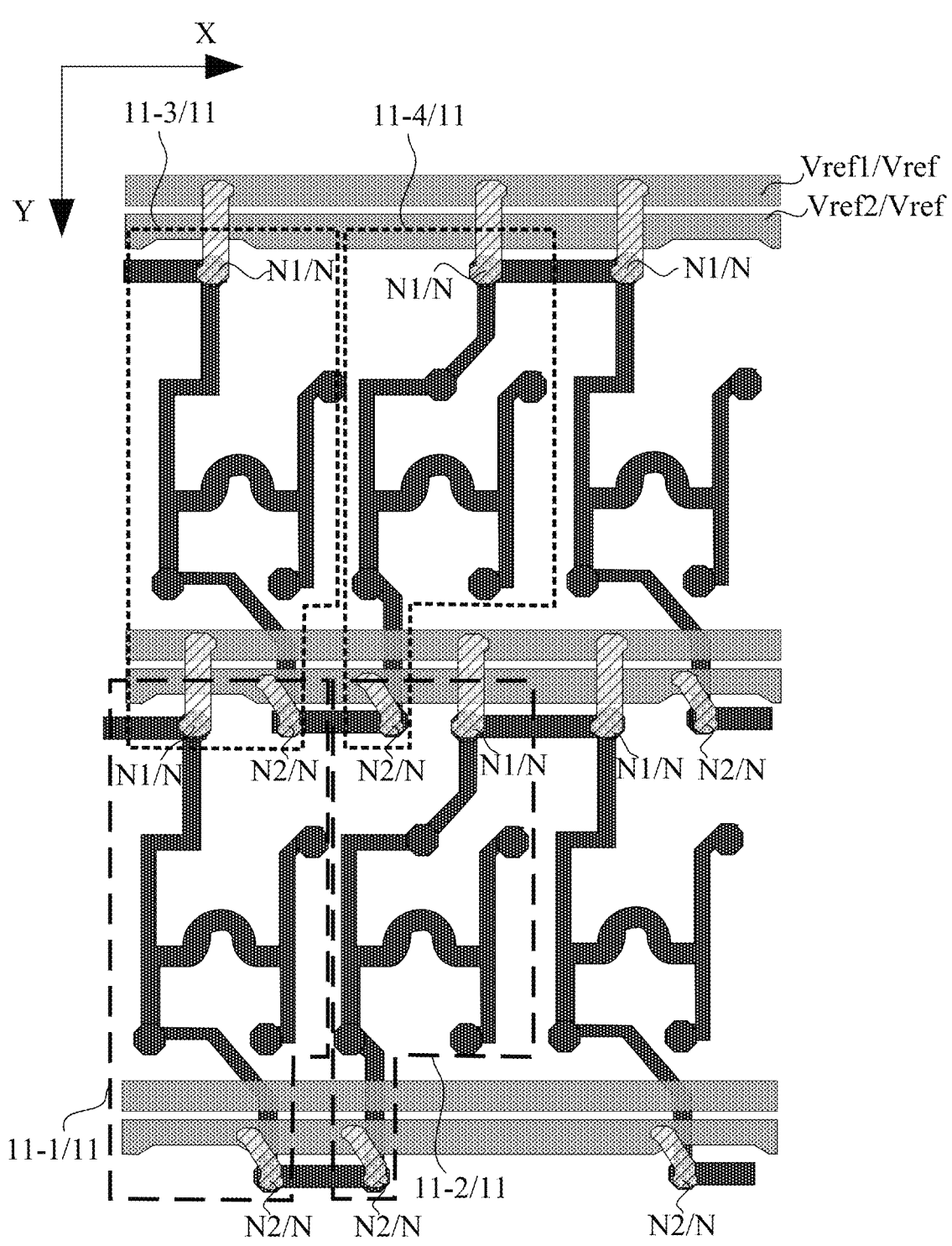
FIG. 12 is a structural diagram of another pixel driving semiconductor portion, pixel connecting semiconductor portion and reference signal line according to an embodiment of the present disclosure.
Figure 13:
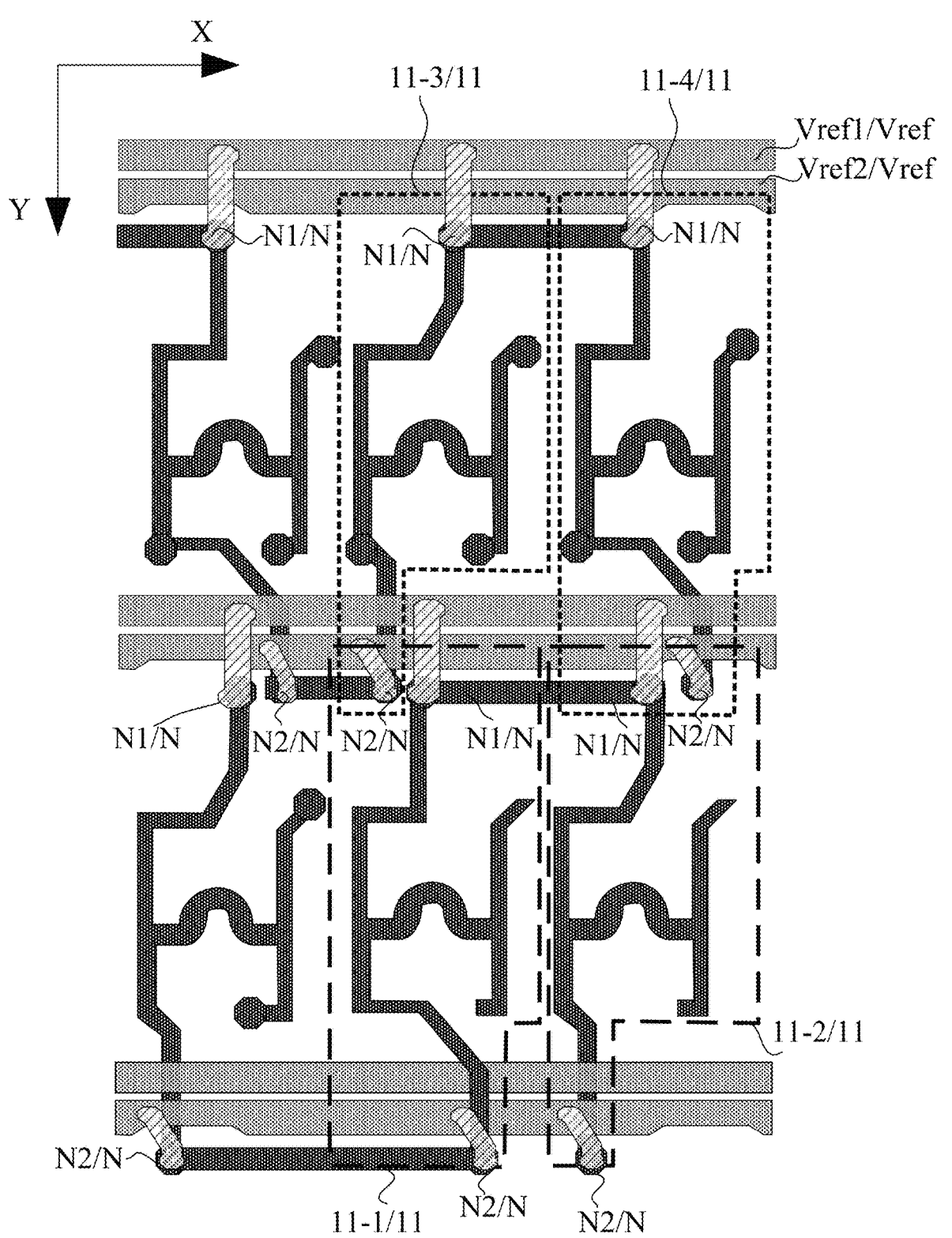
FIG. 13 is a structural diagram of another pixel driving semiconductor portion, pixel connecting semiconductor portion and reference signal line according to an embodiment of the present disclosure.
Figure 14:
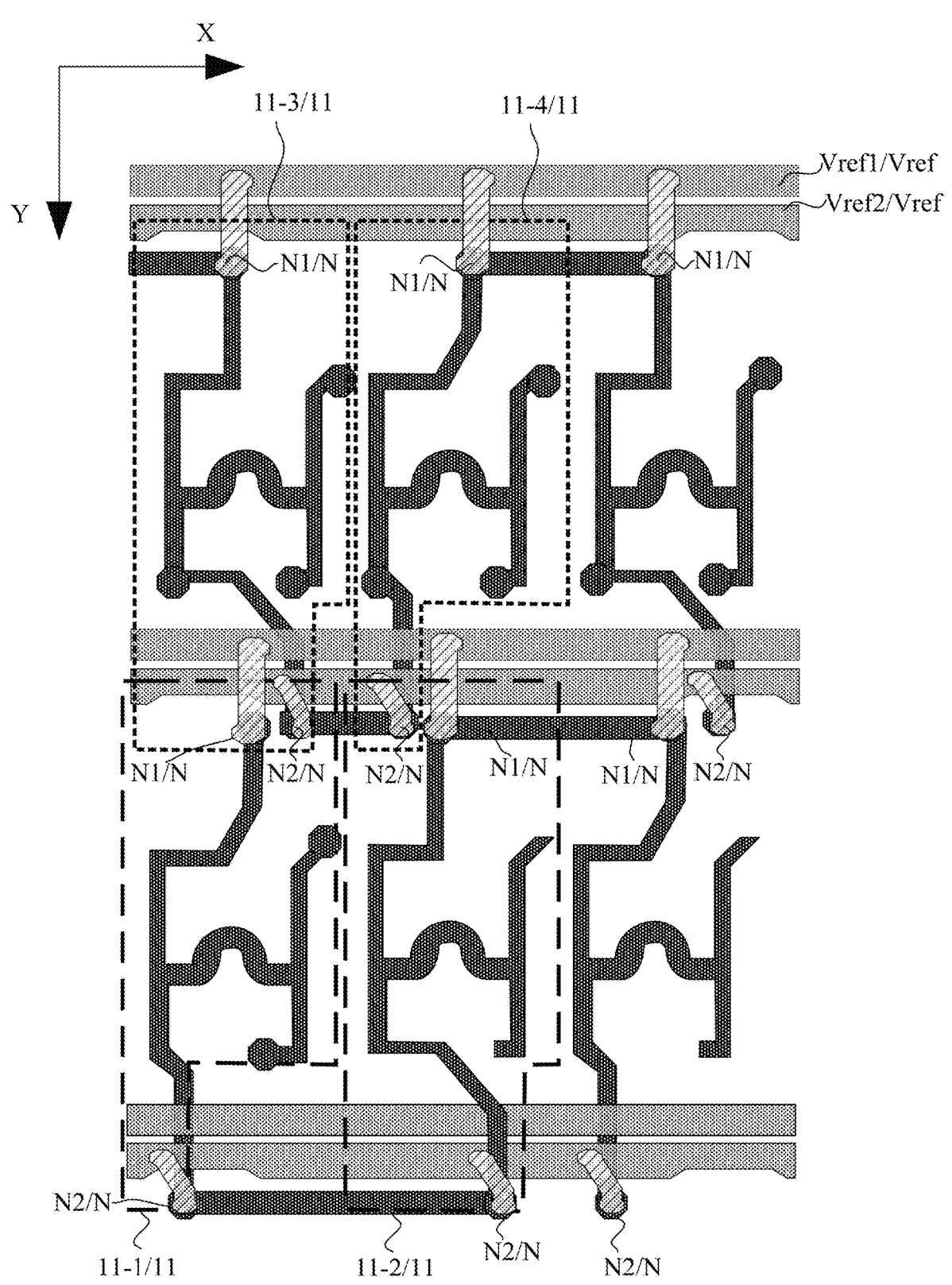
FIG. 14 is a structural diagram of another pixel driving semiconductor portion, pixel connecting semiconductor portion and reference signal line according to an embodiment of the present disclosure.

As another implementable embodiment, FIG. 11 is a structural diagram of another pixel driving semiconductor portion, pixel connecting semiconductor portion and reference signal line according to an embodiment of the present disclosure, FIG. 12 is a structural diagram of another pixel driving semiconductor portion, pixel connecting semiconductor portion and reference signal line according to an embodiment of the present disclosure, FIG. 13 is a structural diagram of another pixel driving semiconductor portion, pixel connecting semiconductor portion and reference signal line according to an embodiment of the present disclosure, and FIG. 14 is a structural diagram of another pixel driving semiconductor portion, pixel connecting semiconductor portion and reference signal line according to an embodiment of the present disclosure. With reference to FIG. 11 to FIG. 14, the first node N1 and the second node N2 in the pixel driving semiconductor portion 11 are respectively located on two opposite sides of the pixel driving semiconductor portion 11 in a second direction, and the second direction is parallel to the plane where the array substrate is located and the second direction is parallel to the column direction or the included angle between the second direction and the column direction is an acute angle. In the row direction, patterns of the pixel driving semiconductor portions 11 in two adjacent pixel circuits arranged sequentially are different, and patterns of two pixel driving semiconductor portions 11 spaced apart by one pixel driving semiconductor portion 11 are the same.

Exemplarily, the second direction is not limited in the embodiments of the present disclosure, and the second direction may be parallel to the row direction X or the included angle between the second direction and the row direction X is an acute direction. In FIG. 11 to FIG. 14, it is taken as an example for illustration that the included angle between the second direction and the row direction X is an acute direction. Further, as shown in FIG. 11 to FIG. 14, the first node N1 and the second node N2 in the pixel driving semiconductor portion 11 are respectively located on two opposite sides of the pixel driving semiconductor portion 11 in the second direction, and thus in pixel driving semiconductor portions 11 at two adjacent stages, the first node N1 in the pixel driving semiconductor portion 11 at the current stage does not overlap with the second node N2 in the pixel driving semiconductor portion 11 at the previous stage. In this way, the first node N1 in the pixel driving semiconductor portion 11 at the current stage and the second node N2 in the pixel driving semiconductor portion 11 at the previous stage can be arranged side by side in the row direction, so that the distance between the pixel driving semiconductor portions 11 at two adjacent stages in the column direction can be reduced, and the compact arrangement of the pixel driving semiconductor portions 11 can be ensured, which facilitates increasing the number of pixel driving semiconductor portions 11 per unit area, that is, the increasing the resolution of the display panel. Thus, the display effect of the display panel is improved. Further, in the row direction, the patterns of the pixel driving semiconductor portions 11 in two adjacent pixel circuits arranged sequentially are different, and the patterns of two pixel driving semiconductor portions 11 spaced apart by one pixel driving semiconductor portion 11 are the same. In this way, the first node N1 and/or the second node N2 in two adjacent pixel driving semiconductor portions 11 in the row direction can be closer to each other, which facilitates reducing the extension length of the pixel connecting semiconductor portion 12, and reducing the area of multiple pixel driving semiconductor portions 11 in the display panel while reducing the loss of signal when being transmitted in the pixel connecting semiconductor portions 12. Moreover, it facilitates improving the resolution of the display panel and improving the display effect. Therefore, in the scheme of the embodiment of the present disclosure, the gate of the drive transistor T3 and the anode of the light-emitting element are set separately so that the good effect of resetting of both the gate of the drive transistor T3 and the anode of the light-emitting element is ensured, and multiple pixel driving semiconductor portions 11 can be connected in the row direction by the pixel connecting semiconductor portions 12 to form a continuous semiconductor trace so that the basic consistency of the driving capabilities of the pixel circuits is ensured, the resolution of the display panel can be improved on the basis of achieving the display uniformity, and the display effect of the display panel can be improved.

Further, in the row direction, the patterns of the pixel driving semiconductor portions 11 in the two adjacent pixel circuits arranged sequentially are different, and the patterns of two pixel driving semiconductor portions 11 spaced apart by one pixel driving semiconductor portion 11 are the same, that is, in any row, the pixel driving semiconductor portions 11 at positions of odd-numbered columns have the same structure, and the pixel driving semiconductor portions 11 at positions of even-numbered columns have the same structure, as shown in FIG. 11 to FIG. 14. Further, on the basis of the above-described embodiment, as shown in FIG. 11 and FIG. 12, in any two rows, the pixel driving semiconductor portions 11 at positions of odd-numbered columns have the same structure, and the pixel driving semiconductor portions 11 at positions of even-numbered columns have the same structure. Alternatively, as shown in FIG. 13 and FIG. 14, in two adjacent rows, the pixel driving semiconductor portions 11 at positions of odd-numbered columns in the first row and the pixel driving semiconductor portions 11 at positions of even-numbered columns in the second row have the same structure and the pixel driving semiconductor portions 11 at positions of even-numbered columns in the first row and the pixel driving semiconductor portions 11 at positions in odd-numbered columns in the second row have the same structure. In the embodiments of the present disclosure, the specific arrangement of the pixel driving semiconductor portions 11 is not limited, as long as it can be ensured that in the row direction, the patterns of the pixel driving semiconductor portions 11 in two adjacent pixel circuits arranged sequentially are different and the patterns of two pixel driving semiconductor portions 11 spaced apart by one pixel driving semiconductor portion 11 are the same, which ensures that the pixel driving semiconductor portions 11 can be arranged in a compact manner, facilitates the improvement of the number of pixel driving semiconductor portions 11 per unit area, that is, the improvement of the resolution of the display panel.

The above embodiments are described hereinafter by taking the first reset transistor being a single gate transistor as an example.

On the basis of the above-described embodiments, with continued reference to FIG. 11 to FIG. 14, any two adjacent pixel driving semiconductor portions 11 arranged sequentially in the row direction X include the first pixel driving semiconductor portion 11-1 and the second pixel driving semiconductor portion 11-2; the pixel driving semiconductor portion 11 located on a first side of the first pixel driving semiconductor portion 11-1 in the column direction Y is a third pixel driving semiconductor portion 11-3, and the pixel driving semiconductor portion 11 located on a first side of the second pixel driving semiconductor portion 11-2 in the column direction Y is a fourth pixel driving semiconductor portion 11-4.

The first node N1 in the first pixel driving semiconductor portion 11-1, the first node N1 in the second pixel driving semiconductor portion 11-2, the second node N2 in the third pixel driving semiconductor portion 11-3 and the second node N2 in the fourth pixel driving semiconductor portion 11-4 are arranged in the row direction X. The first node N1 in the first pixel driving semiconductor portion 11-1 and the first node N1 in the second pixel driving semiconductor portion 11-2 are located between the second node in the third pixel driving semiconductor portion 11-3 and the second node in the fourth pixel driving semiconductor portion 11-4 in the row direction X; or, the second node N2 in the third pixel driving semiconductor portion 11-3 and the second node N2 in the fourth pixel driving semiconductor portion 11-4 are located between the first node N1 in the first pixel driving semiconductor portion 11-1 and the first node N1 in the second pixel driving semiconductor portion 11-2 in the row direction X.

Exemplarily, as shown in FIG. 11 to FIG. 14, it is arranged that the first node N1 and the second node N2 in the pixel driving semiconductor portion 11 are respectively located on two opposite sides of the pixel driving semiconductor portion 11 in the second direction, and in the row direction, the patterns of the pixel driving semiconductor portions 11 in two adjacent pixel circuits arranged sequentially are different, and the patterns of two pixel driving semiconductor portions 11 spaced apart by one pixel driving semiconductor portion 11 are the same. Therefore, it can be ensured that the first node N1 in the first pixel driving semiconductor portion 11-1, the first node N1 in the second pixel driving semiconductor portion 11-2, the second node N2 in the third pixel driving semiconductor portion 11-3 and the second node N2 in the fourth pixel driving semiconductor portion 11-4 are arranged in the row direction X, that is, located at the same height in the horizontal direction. In this way, the pixel driving semiconductor portions 11 can be arranged in a compact manner, which facilitates the increase of the number of pixel driving semiconductor portions 11 per unit area, that is, the improvement of the resolution of the display panel. In an embodiment, in FIG. 11 and FIG. 13, it is taken as an example for illustration that the first node N1 in the first pixel driving semiconductor portion 11-1 and the first node N1 in the second pixel driving semiconductor portion 11-2 are located between the second node in the third pixel driving semiconductor portion 11-3 and the second node in the fourth pixel driving semiconductor portion 11-4 in the row direction X; and in FIG. 12 and FIG. 14, it is taken as an example for illustration that the second node N2 in the third pixel driving semiconductor portion 11-3 and the second node N2 in the fourth pixel driving semiconductor portion 11-4 are located between the first node N1 in the first pixel driving semiconductor portion 11-1 and the first node N1 in the second pixel driving semiconductor portion 11-2 in the row direction X.

In the embodiments described above, taking the first reset transistor being a single-gate transistor as an example, it is described in detail that by reasonably arranging the pixel driving semiconductor portions 11, it can be ensured that the pixel driving semiconductor portions are arranged in a compact manner, which facilitates the increase of the number of pixel driving semiconductor portions 11 per unit area, that is, the improvement of the resolution of the display panel, and the improvement of the display effect of the display panel.

Next, it is taken as an example for illustration that the first reset transistor is a dual-gate transistor.

Figure 15:
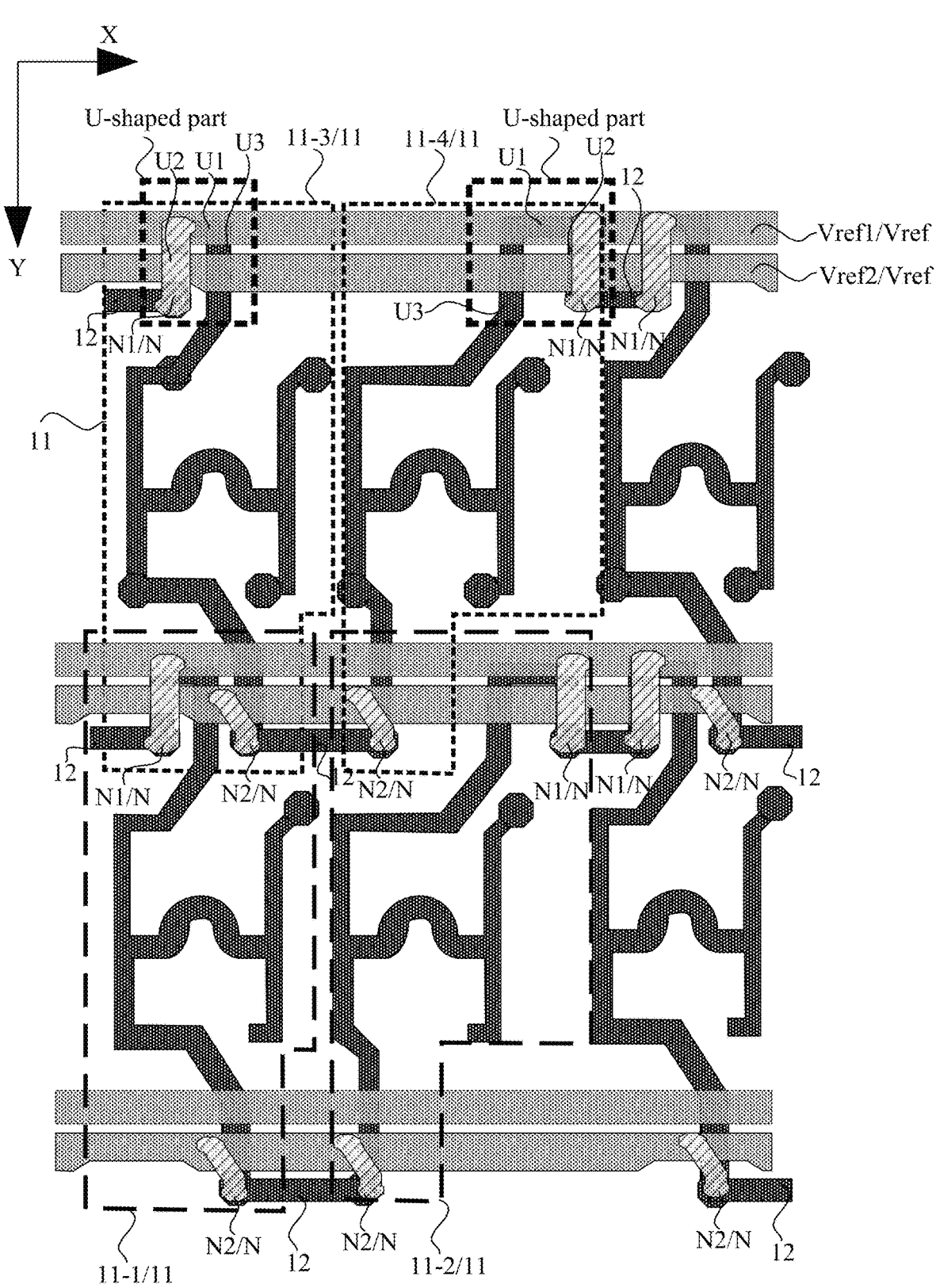
FIG. 15 is a structural diagram of another pixel driving semiconductor portion, pixel connecting semiconductor portion and reference signal line according to an embodiment of the present disclosure.
Figure 16:
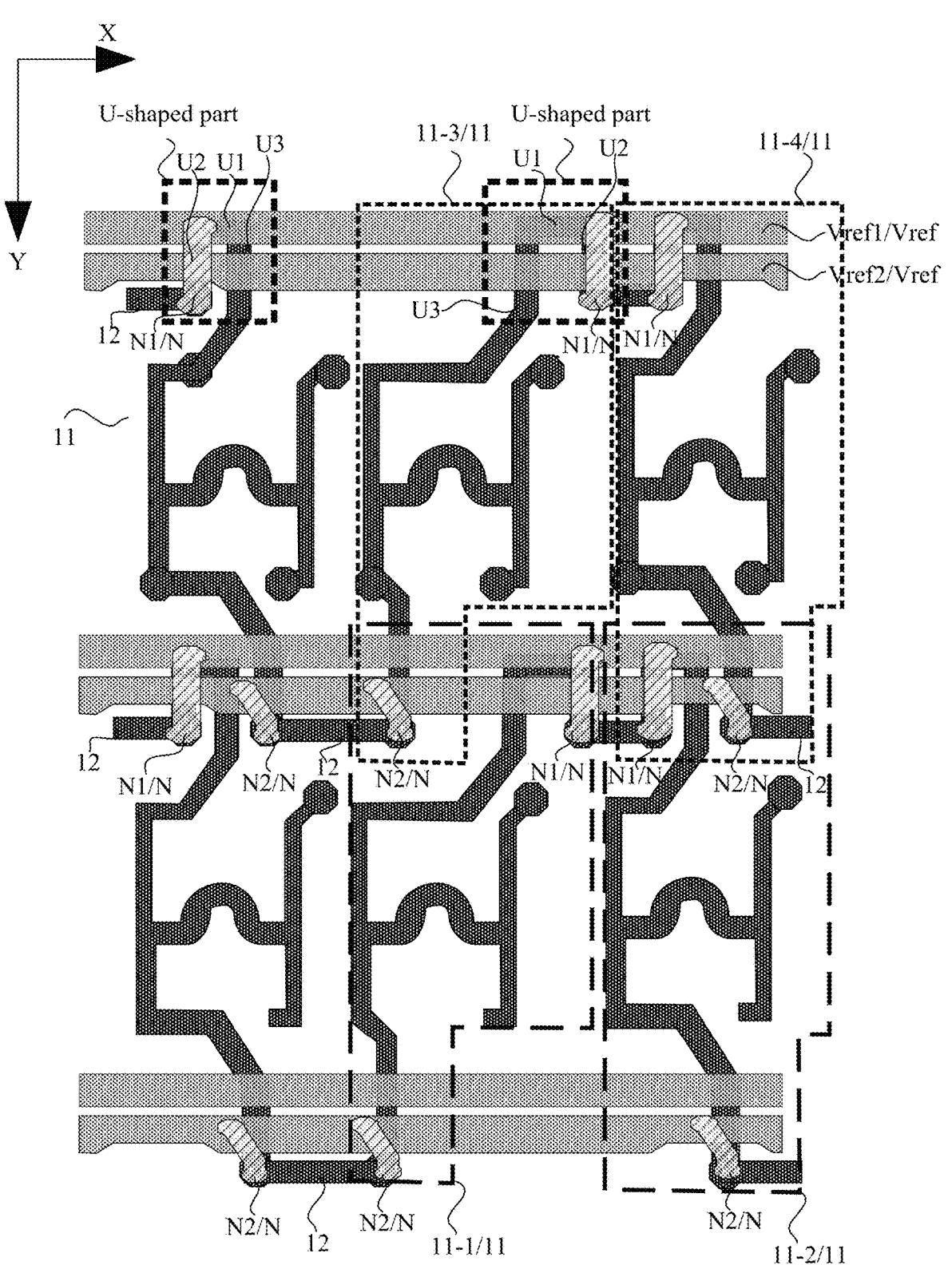
FIG. 16 is a structural diagram of another pixel driving semiconductor portion, pixel connecting semiconductor portion and reference signal line according to an embodiment of the present disclosure.

FIG. 15 is a structural diagram of another pixel driving semiconductor portion, pixel connecting semiconductor portion and reference signal line according to an embodiment of the present disclosure, and FIG. 16 is a structural diagram of another pixel driving semiconductor portion, pixel connecting semiconductor portion and reference signal line according to an embodiment of the present disclosure. Referring to FIG. 15 and FIG. 16, the pixel driving semiconductor portion 11 includes a U-shaped part, the U-shaped part includes a connecting part U1 a first branch part U2 and a second branch part U3, the first branch part U2 and the second branch part U3 are respectively connected to two ends of the connecting portion U1, and the first branch part U2 and the second branch part U3 are arranged in the row direction X and extend in the column direction. One terminal of the first branch part U2 away from the connecting portion U1 is the first node N1.

In the row direction X, the first branch parts U2 in the first pixel driving semiconductor portion 11-1 and the second pixel driving semiconductor portion 11-2 are located on sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4. Alternatively, in the row direction X, the second nodes N2 in the third pixel driving semiconductor portion 11-3 and the fourth pixel driving semiconductor portion 11-4 are located on the sides of the second branch parts U3 in the first pixel driving semiconductor portion 11-1 and the second pixel driving semiconductor portion 11-2 away from the first nodes N1 in the first pixel driving semiconductor portion 11-1 and the second pixel driving semiconductor portion 11-2.

Exemplarily, as shown in FIG. 15 and FIG. 16, the pixel driving semiconductor portion 11 includes the U-shaped part; in a direction perpendicular to the plane where the substrate is located, there are two overlapping regions between the first scanning line Scan1 and the U-shaped part; and the two overlapping regions correspondingly form channel regions of a dual-gate transistor, that is, the first reset transistor is a dual-gate transistor, which ensures a small leakage current of the first reset transistor and a stable gate potential of the drive transistor. Further, the U-shaped part includes the connecting portion U1, the first branch part U2 and the second branch part U3, and the first branch part U2 and the second branch part U3 are respectively connected to two ends of the connecting portion U1. The first branch part U2 and the second branch part U3 are arranged in the row direction X and extend in the column direction, one terminal of the first branch part U2 away from the connecting portion U1 is the first node N1, and the first branch part U2 and the second branch part U3 are disposed in different manners for the pixel driving semiconductor portions 11 at different positions. In an embodiment, as shown in FIG. 15, in the row direction X, the first branch parts U2 in the first pixel driving semiconductor portion 11-1 and the second pixel driving semiconductor portion 11-2 are located on the sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4, that is, the nodes N2 in the third pixel driving semiconductor portion 11-3 and the fourth pixel driving semiconductor portion 11-4 are closer to each other, and the nodes N2 in the third pixel driving semiconductor portion 11-3 and the fourth pixel driving semiconductor portion 11-4 in the same row and adjacent to each other are connected by the pixel connecting semiconductor portion 12, which ensures that the pixel connecting semiconductor portion 12 is provided in a simple manner and the extension length of the pixel connecting semiconductor portion 12 in the row direction X is short. Therefore, it can be ensured that the transmission loss of the signal on the pixel connecting semiconductor portion 12 is small and the display effect of the display panel is good. As shown in FIG. 16, in the row direction X, the first branch parts U2 in the first pixel driving semiconductor portion 11-1 and the second pixel driving semiconductor portion 11-2 are located on the sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4, that is, the first branch parts U2 in the first pixel driving semiconductor portion 11-1 and the second pixel driving semiconductor portion 11-2 are closer to each other, and the first branch parts U2 in the first pixel driving semiconductor portion 11-1 and the second pixel driving semiconductor portion 11-2 in the same row and adjacent to each other are connected by the pixel connecting semiconductor portion 12. That is, the nodes N1 in the first pixel driving semiconductor portion 11-1 and the second pixel driving semiconductor portion 11-2 in the same row and adjacent to each other are connected by the pixel connecting semiconductor portion 12, which ensures that the pixel connecting semiconductor portion 12 is provided in a simple manner and the extension length of the pixel connecting semiconductor portion 12 in the row direction X is short. Therefore, it can be ensured that the transmission loss of the signal on the pixel connecting semiconductor portion 12 is small and the display effect of the display panel is good.

In summary, the above-described embodiment describes multiple manners of arranging the pixel connecting semiconductors, and by arranging the pixel connecting semiconductor portion as a part of the pixel driving semiconductor portion, it is ensured that the pixel connecting semiconductor portion can be arranged in a simple way. Alternatively, by arranging the pixel connecting semiconductor portion to connect multiple pixel driving semiconductor portions in the column direction or row direction to form a continuous semiconductor trace, it is ensured that static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved. Further, in the case where multiple pixel driving semiconductor portions in the row direction form a continuous semiconductor trace by the pixel connecting semiconductor portions, it is ensured that the pixel connecting semiconductor portion can be arranged in a simple manner or multiple pixel driving semiconductor portions can be arranged into a compact structure by reasonably setting the positional relationship between the first node and the second node in the pixel driving semiconductor portion, which facilitates the improvement of the number of the pixel driving semiconductor portions per unit area, that is, the improvement of the resolution of the display panel, and the improvement of the display effect of the display panel.

A pixel circuit of a display panel is provided according to an embodiment of the present disclosure. Multiple pixel circuits are arranged in an array in a row direction and a column direction, each of the pixel circuits includes a pixel driving semiconductor portion, and the pixel driving semiconductor portion includes connecting nodes, the row direction intersects the column direction.

The display panel further includes a reference signal line and a pixel connecting semiconductor portion. The connecting nodes are electrically connected to the reference signal line.

At least two connecting nodes adjacent in a first direction are electrically connected by the pixel connecting semiconductor portion, and the first direction is parallel to a plane where the array substrate is located. Exemplarily, the first direction is the row direction.

As shown in the above FIG. 2 to FIG. 16, the connecting nodes are electrically connected to the reference signal line Vref. It is to be understood that the row direction is generally indicated as a direction in which the scan signal line extends, and the column direction is generally indicated as a direction in which the data signal line extends.

In an embodiment, the pixel circuit includes a drive transistor, a light-emitting element, a first reset transistor and a second reset transistor. The pixel driving semiconductor portion includes at least two connecting nodes, and the at least two connecting nodes include a first node and a second node. One terminal of the first reset transistor is electrically connected to the first node, and another terminal of the first reset transistor is electrically connected to a gate of the drive transistor. One terminal of the second reset transistor is electrically connected to the second node, and another terminal of the second reset transistor is electrically connected to an anode of the light-emitting element.

As shown in FIG. 2 to FIG. 16, the pixel circuit 10 includes the drive transistor T3, the light-emitting element D, the first reset transistor T5 and the second reset transistor T7. The pixel circuit 10 includes the pixel driving semiconductor portion 11. The pixel driving semiconductor portion 11 includes two connecting nodes N, respectively a first node N1 and a second node N2. One terminal of the first reset transistor T5 is electrically connected to the first node N1, and another terminal of the first reset transistor T5 is electrically connected to a gate of the drive transistor T3. One terminal of the second reset transistor T7 is electrically connected to the second node N2, and another terminal of the second reset transistor T7 is electrically connected to an anode P of the light-emitting element D. It is to be understood that the two connecting nodes included in the pixel driving semiconductor portion are at physical positions of the pixel driving semiconductor portion.

Figure 23:
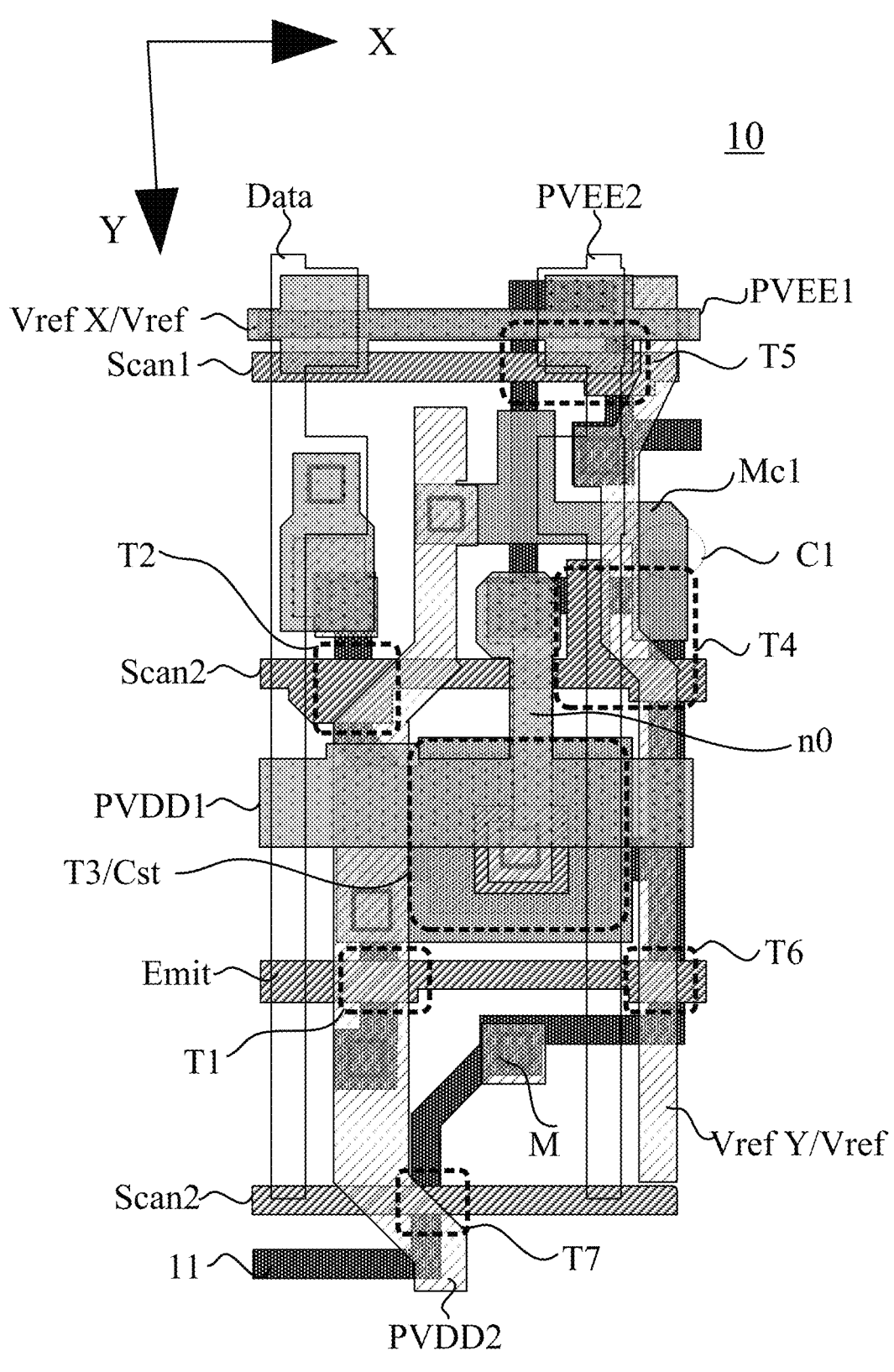
FIG. 23 is a schematic diagram of a structural layout of another pixel circuit according to an embodiment of the present disclosure.
Figure 24:
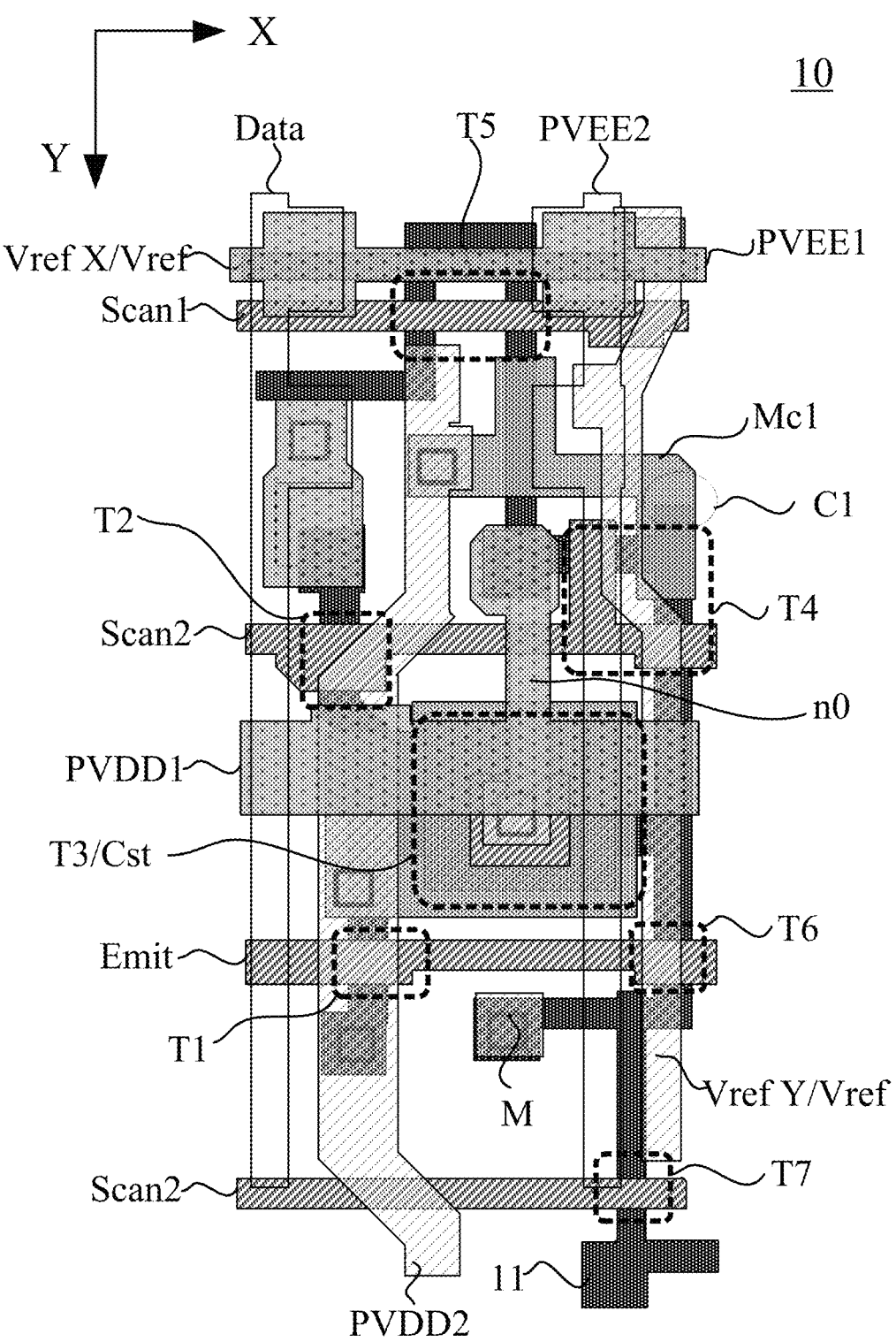
FIG. 24 is a schematic diagram of a structural layout of another pixel circuit according to an embodiment of the present disclosure.

Another pixel circuit of the display panel is provided according to an embodiment of the present disclosure. FIG. 23 is a schematic diagram of a structural layout of another pixel circuit according to an embodiment of the present disclosure, and FIG. 24 is a schematic diagram of a structural layout of another pixel circuit according to an embodiment of the present disclosure. As shown in FIG. 23 and FIG. 24, the pixel circuit 10 includes multiple transistors (T1 to T7) and at least one storage capacitor. The pixel driving semiconductor portion 11 includes active layers of the transistors, where the channel types of the transistors include a P type, and the active layers of the transistors include polycrystalline silicon etc. The transistors can be turned on through a low level and can be turned off through a high level.

Figure 25:
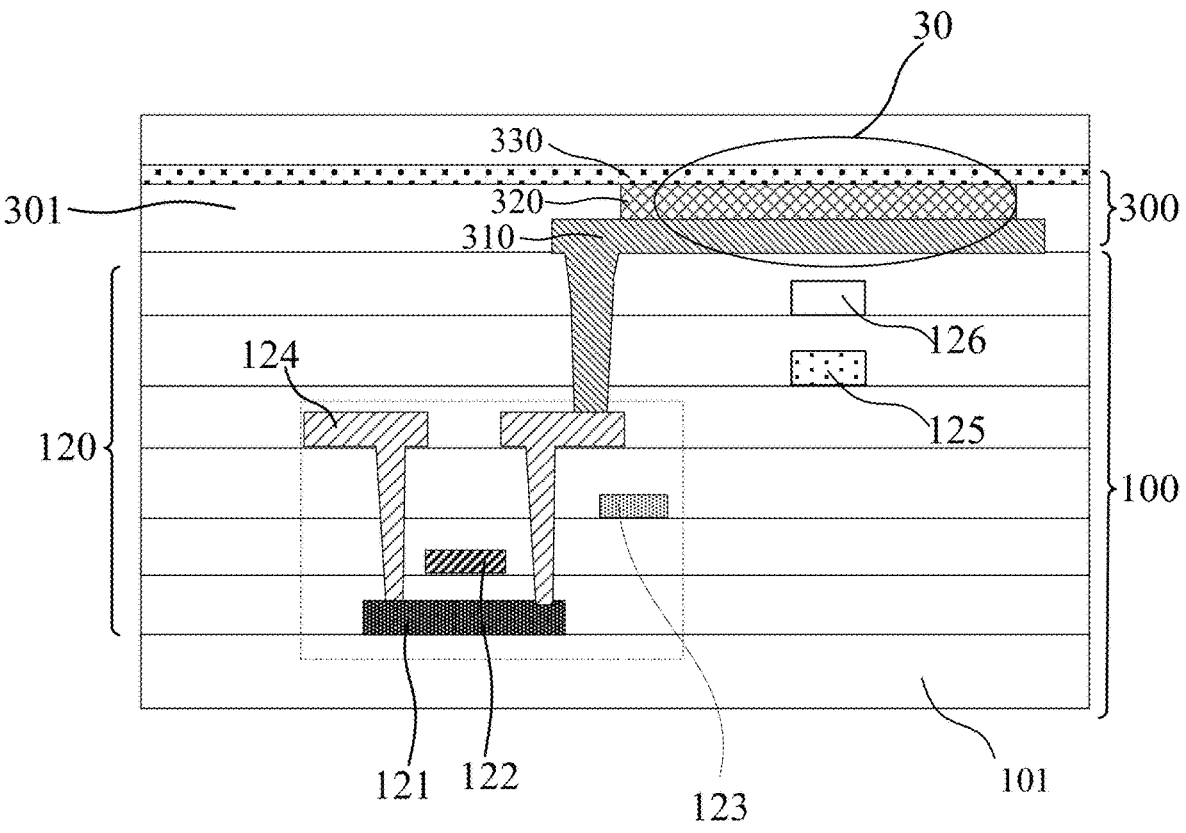
FIG. 25 is a schematic cross-sectional view corresponding to the pixel circuits shown in FIG. 23 and FIG. 24 according to an embodiment of the present disclosure.

FIG. 25 is a schematic cross-sectional view corresponding to the pixel circuits shown in FIG. 23 and FIG. 24 according to an embodiment of the present disclosure. As shown in FIG. 25, the display panel includes an array substrate 100 and a light-emitting device layer 300 arranged on a side of the array substrate 100. The array substrate 100 includes a substrate 101 and a drive circuit layer 120 disposed on the substrate 101. The drive circuit layer 120 includes a first semiconductor layer 121, a first metal layer 122, a capacitor metal layer 123, a second metal layer 124, a third metal layer 125, and a fourth metal layer 126 stacked in a direction away from the substrate, and an insulation layer is provided between every two adjacent metal layers. The light-emitting device layer 300 includes multiple light-emitting devices 30, and the light-emitting device 30 includes a first electrode 310, a light-emitting layer 320, and a second electrode 330 stacked in sequence. The display panel further includes a pixel definition layer 301 for spacing adjacent light-emitting devices 30.

With continued reference to FIG. 23 to FIG. 25, the pixel driving semiconductor portion 11 is located at the first semiconductor layer 121 in the drive circuit layer and on the side of the drive circuit layer close to the substrate. The first scanning signal line Scan1, the second scanning signal line Scan2, and the light emission control signal line Emit are located at the first metal layer 122 in the drive circuit layer. One electrode plate Cst1 of the electrode plates of a storage capacitor Cst may be located at the capacitor metal layer 123 in the drive circuit layer. As shown in FIG. 23, the reference signal line Vref includes a reference signal line Vref X extending in the row direction X and a reference signal line Vref Y extending in the column direction Y. The reference signal line Vref X and the capacitor metal layer 123 are arranged in the same layer, and the reference signal line Vref Y and the second metal layer 124 are arranged in the same layer. In an embodiment, among the multiple pixel circuits included in the display panel as shown in FIG. 23, the reference signal line Vref X and the reference signal line Vref Y included in at least one pixel circuit may overlap and be electrically connected to each other, and also the reference signal line Vref X and the reference signal line Vref Y included in at least one pixel circuit may overlap but not be electrically connected to each other.

With continued reference to FIG. 23 to FIG. 25, the power signal line PVDD includes a first power signal line PVDD1 extending in the row direction X and a second power signal line PVDD2 extending in the column direction Y. The first power signal line PVDD1 and the third metal layer 125 are arranged in the same layer, and the second power signal line PVDD2 and the second metal layer 124 are arranged in the same layer. The first power signal line PVDD1 extending in the row direction X and the second power signal line PVDD2 extending in the column direction Y are electrically connected through via holes to achieve a grid-shaped structure, and also are electrically connected to one electrode plates Cst1 of the electrode plates of the storage capacitor Cst, thereby reducing the voltage drop of the PVDD.

Further, the data signal line Data extends in the column direction Y and is located at the fourth metal layer 126, and a negative power signal line PVEE includes a first negative power signal line PVEE1 extending in the row direction X and a second negative power signal line PVEE2 extending in the column direction Y. The first negative power signal line PVEE1 is provided at the third metal layer 125, the second negative power signal line PVEE2 is provided at the fourth metal layer 126, and the first negative power signal line PVEE1 and the second negative power signal line PVEE2 are electrically connected through via holes to achieve a grid-shaped PVEE, thereby reducing the voltage drop of the PVEE.

Further, referring to FIG. 23 to FIG. 24, in a direction perpendicular to the plane where the display panel is located, the first negative power signal lines PVEE1 and the Vref X at least partially overlap, one terminal of a metal electrode Mc1 is electrically connected to the PVDD2, and another terminal of the metal electrode Mc1 overlaps with a semiconductor layer of the threshold compensation transistor T4 to form a capacitor C1, which serves to stabilize the voltage and reduce current leakage. A potential n0 connected to the gate electrode of the drive transistor T3 is hidden by the PVDD1.

It is to be understood that the pixel circuit shown in FIG. 23 and the pixel circuit shown in FIG. 24 have substantially the same structure, and the difference between them includes the structure of the pixel driving semiconductor portion disposed on the first semiconductor layer. In an embodiment the differences lie in that active layers of the first reset transistors T5 serving as double-gate transistors are bent in directions opposite to each other. For example, a first electrode of the first reset transistor T5 shown in FIG. 23 is electrically connected to the gate of the drive transistor T3, a second electrode of the first reset transistor T5 is disposed on a right side of the first electrode, and the semiconductor layer corresponding to this first reset transistor T5 is bent toward the right side. However, a first electrode of the first reset transistor T5 shown in FIG. 24 is electrically connected to the gate of the drive transistor T3, a second electrode of the first reset transistor T5 is disposed on a left side of the first electrode, and the semiconductor layer corresponding to this first reset transistor T5 is bent toward the left side. That is, the bending directions of the semiconductor layers of the first reset transistors T5 in the two pixel circuits are opposite.

Figure 26:
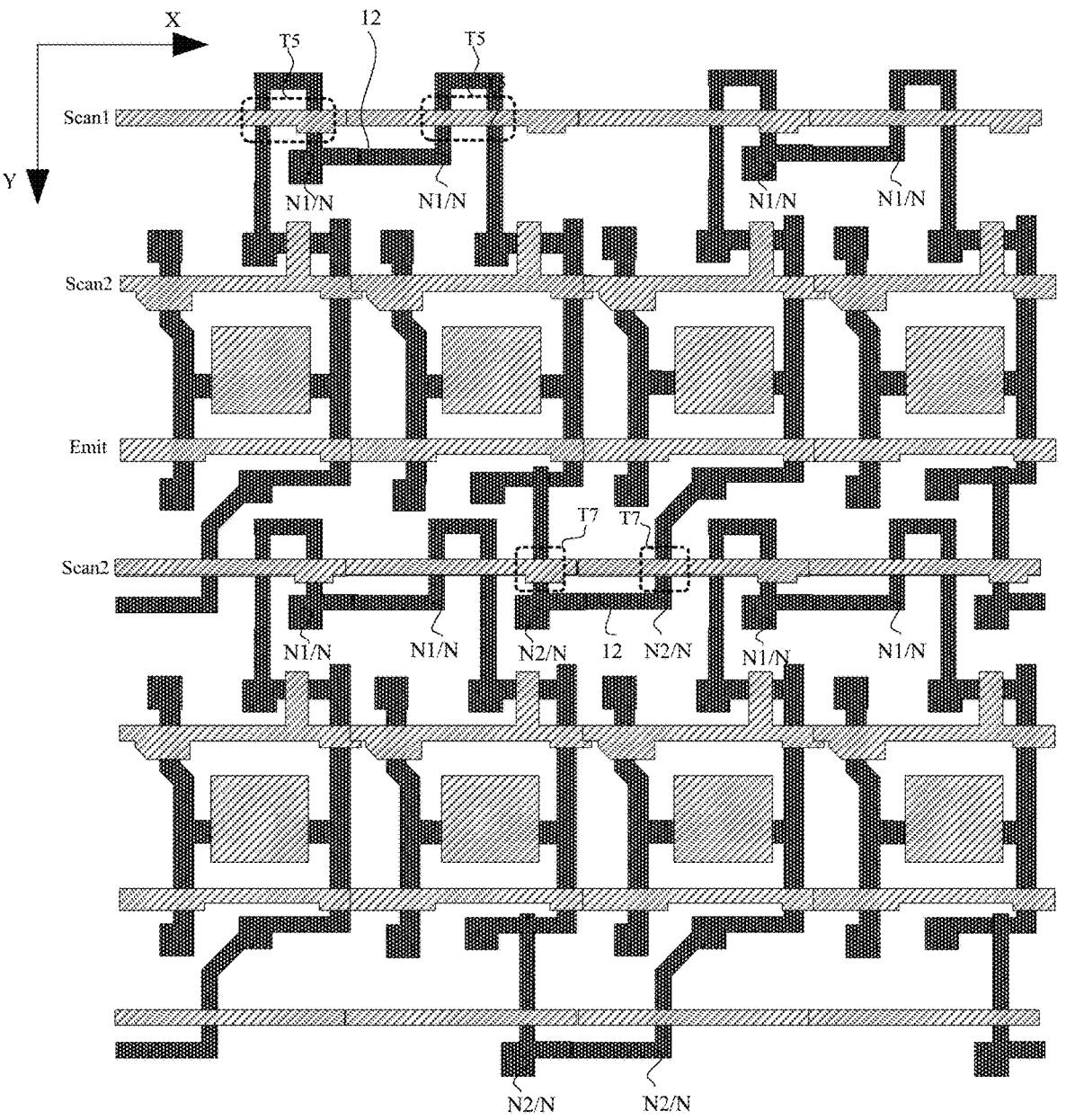
FIG. 26 is a structural diagram of another pixel driving semiconductor portion according to an embodiment of the present disclosure.

In an embodiment, a display panel according to an embodiment of the present disclosure includes the pixel circuit shown in FIG. 23 and the pixel circuit shown in FIG. 24. A structural diagram of pixel driving semiconductor portions formed by arranging the pixel driving semiconductor portions of the above two pixel circuits is mainly described hereinafter. FIG. 26 is a structural diagram of another pixel driving semiconductor portion according to an embodiment of the present disclosure. As shown in FIG. 26, the pixel driving semiconductor portion 11 includes at least two connecting nodes N, and the two connecting nodes include a first node N1 and a second node N2. As the physical positions shown in FIG. 26, one terminal of the first reset transistor T5 is electrically connected to the first node N1, and another terminal of the first reset transistor T5 is electrically connected to the gate of the drive transistor; and one terminal of the second reset transistor T7 is electrically connected to the second node N2, and another terminal of the second reset transistor T7 is electrically connected to the anode of the light-emitting element.

Exemplarily, with continued reference to FIG. 26, two connecting nodes adjacent in the row direction X are electrically connected by the pixel connecting semiconductor portion 12. In an embodiment, two first nodes N1 in two adjacent pixel circuits are electrically connected by the pixel connecting semiconductor portion 12, and also two second nodes N2 in two adjacent pixel circuits are electrically connected by the pixel connecting semiconductor portion 12. It is to be understood that the pixel driving semiconductor portions 11 and the pixel connecting semiconductor portions 12 are arranged in the same layer. The pixel driving semiconductor portion 11 includes the semiconductor layer of the first reset transistor T5 and the semiconductor layer of the second reset transistor T7, and further, the pixel connecting semiconductor portions 12, the semiconductor layer of the first reset transistor T5 and the semiconductor layer of the second reset transistor T7 are arranged in the same layer.

Figure 27:
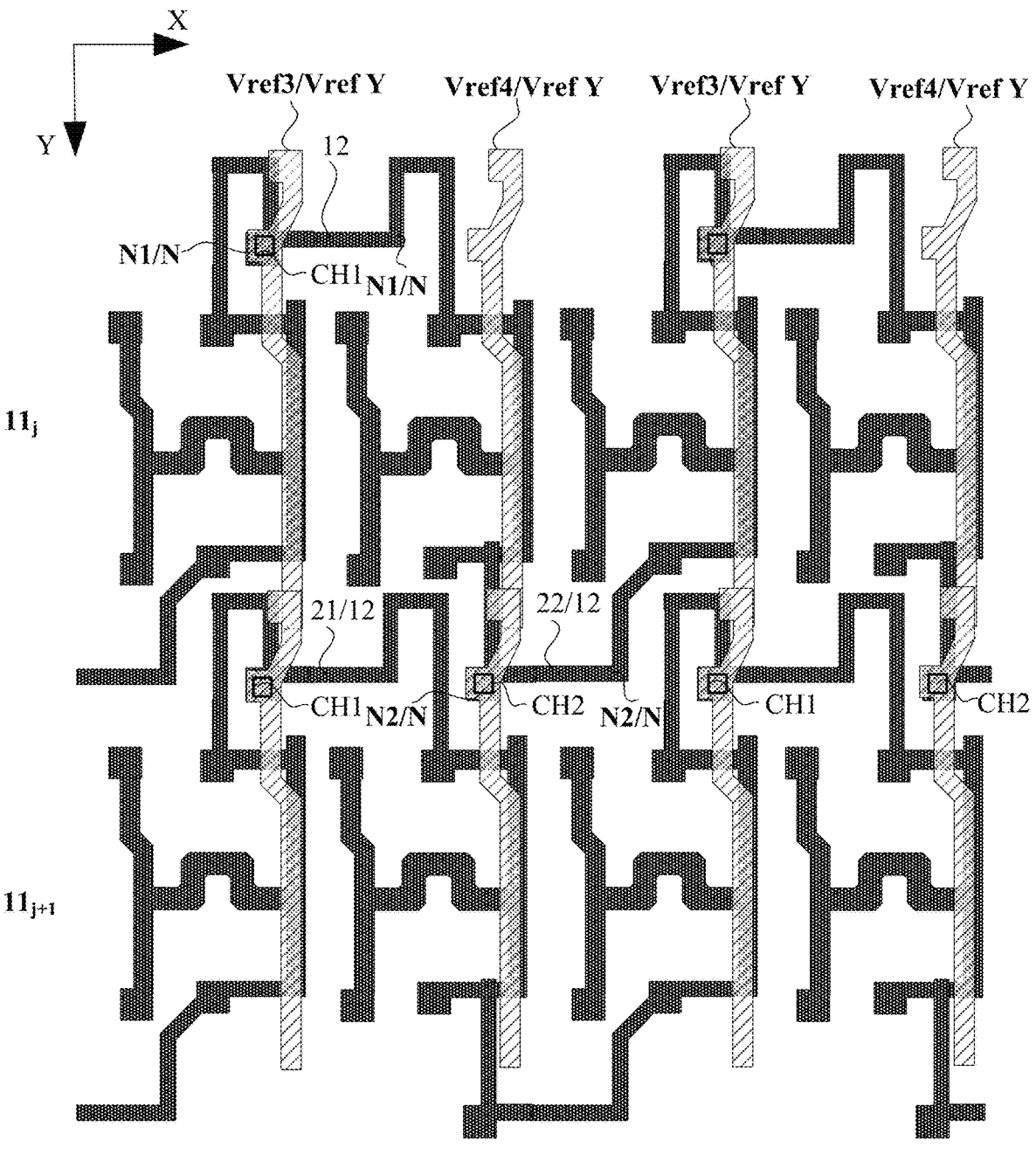
FIG. 27 is a structural diagram of another pixel driving semiconductor portion and reference signal lines according to an embodiment of the present disclosure.

FIG. 27 is a structural diagram of another pixel driving semiconductor portion and reference signal lines according to an embodiment of the present disclosure. As shown in FIG. 27, the reference signal line Vref includes a reference signal line Vref Y extending in the column direction Y. The reference signal line Vref Y includes multiple third reference signal lines Vref3 and multiple fourth reference signal lines Vref4 extending in the column direction Y. The first node N1 is electrically connected to the third reference signal line Vref3, the second node N2 is electrically connected to the fourth reference signal line Vref4, and this embodiment of the present disclosure includes the reference signal lines extending in the column direction. As shown in FIG. 27, the third reference signal line Vref3 is electrically connected to the position of the first node N1 through a first via hole CH1, and the fourth reference signal line Vref4 is electrically connected to the position of the second node N2 through a second via hole CH2. In the row direction X, the third reference signal lines Vref3 and the fourth reference signal lines Vref4 alternately arranged. It is to be understood that the third reference signal line Vref3 is electrically connected to one terminal of the first reset transistor T5, and writes a first initialization signal to the gate of the drive transistor T3 under the control of T5; and the fourth reference signal line Vref4 is electrically connected to one terminal of the second reset transistor T7, and writes a second initialization signal to the anode of the light-emitting element D under the control of T7. The first initialization signal and the second initialization signal are different.

Figure 28:
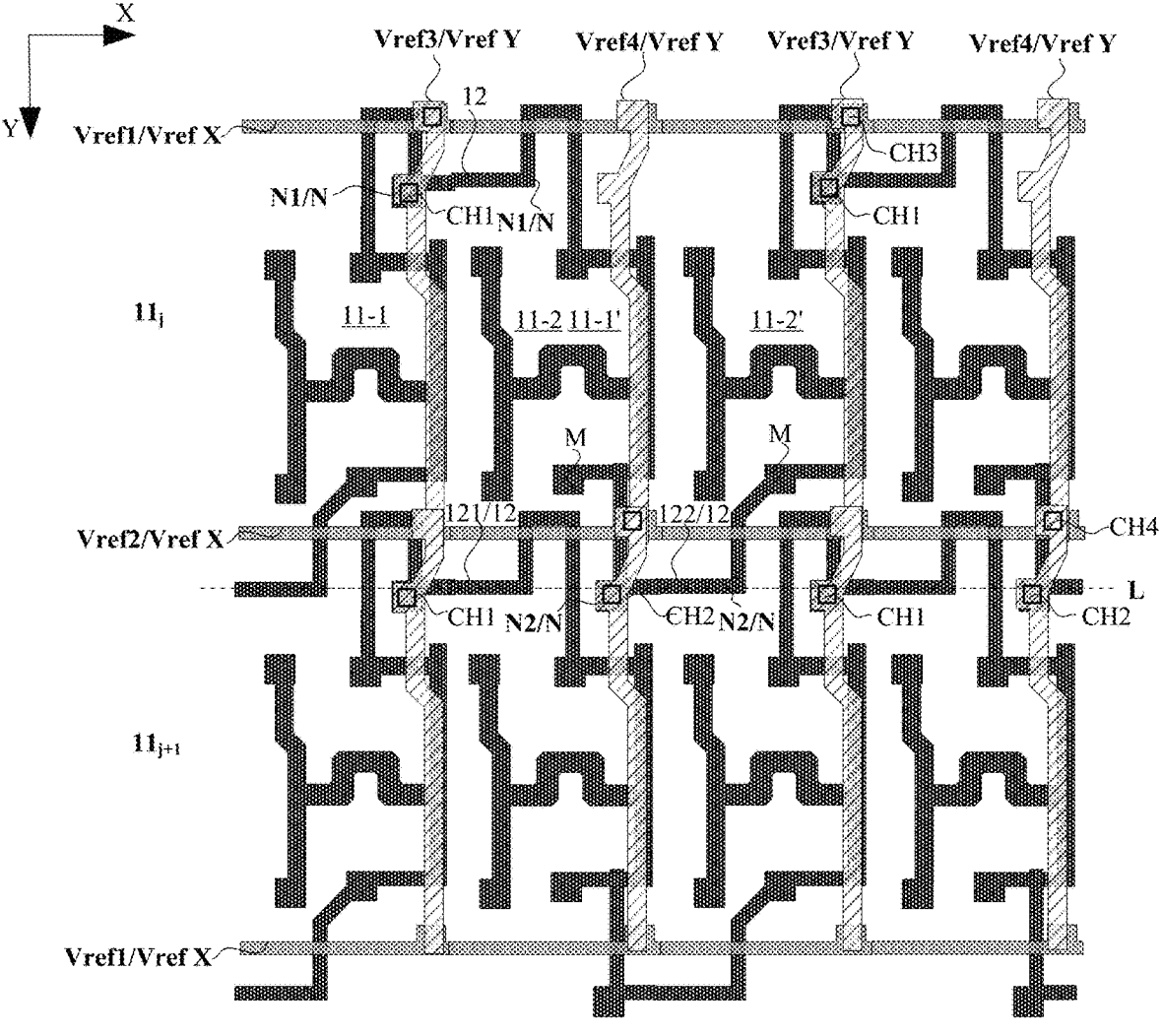
FIG. 28 is a structural diagram of another pixel driving semiconductor portion and reference signal lines according to an embodiment of the present disclosure.

FIG. 28 is a structural diagram of another pixel driving semiconductor portion and reference signal lines according to an embodiment of the present disclosure. FIG. 28 shows that at least one first reference signal line Vref1 and at least one second reference signal line Vref2 extending in the row direction X are added on the third reference signal line Vref3 and the fourth reference signal line Vref4 shown in FIG. 27.

The arrangement and connection manner of the third reference signal lines Vref3 and the fourth reference signal lines Vref4 are described in detail hereinafter.

As shown in FIG. 27 and FIG. 28, the reference signal line Vref includes multiple third reference signal lines Vref3 and multiple fourth reference signal lines Vref4 extending in the column direction, and multiple pixel driving semiconductor portions 11 include a pixel driving semiconductor portion in an i-th column, a pixel driving semiconductor portion in an (i+1)-th column, a pixel driving semiconductor portion in an (i+2)-th column, and a pixel driving semiconductor portion in an (i+3)-th column arranged in the row direction X in sequence, where i is a positive integer greater than or equal to 1.

The first node N1 in the pixel driving semiconductor portion in the i-th column and the first node N1 in the pixel driving semiconductor portion in the (i+1)-th column are electrically connected to one third reference signal line Vref3, the first node N1 in the pixel driving semiconductor portion in the (i+2)-th column and the first node N1 in the pixel driving semiconductor portion in the (i+3)-th column are electrically connected to another third reference signal line Vref3, and the second node N2 in the pixel driving semiconductor portion in the (i+1)-th column and the second node N2 in the pixel driving semiconductor portion in the (i+2)-th column are electrically connected to one fourth reference signal line Vref4.

Exemplarily, when i=1, the first node N1 in the pixel driving semiconductor portion in the first column and the first node N1 in the pixel driving semiconductor portion in the second column are electrically connected to one third reference signal line Vref3, the first node N1 in the pixel driving semiconductor portion in the third column and the first node N1 in the pixel driving semiconductor portion in the fourth column are electrically connected to another third reference signal line Vref3, and the second node N2 in the pixel driving semiconductor portion in the second column and the second node N2 in the pixel driving semiconductor portion in the third column are electrically connected to one fourth reference signal line Vref4.

In the row direction X, the third reference signal lines Vref3 and the fourth reference signal lines Vref4 are alternately arranged.

In an embodiment, with continued reference to FIG. 27 and FIG. 28, one third reference signal line Vref3 is electrically connected to the pixel driving semiconductor portion in the i-th column through the first via hole CH1, and in the direction perpendicular to the plane where the display panel is located, the third reference signal line Vref3 at least partially overlaps the first node N1 of the pixel driving semiconductor portion in the i-th column.

As shown in the figures, another third reference signal line Vref3 is electrically connected to the pixel driving semiconductor portion in the (i+2)-th column through the first via hole CH1, and in the direction perpendicular to the plane where the display panel is located, the third reference signal line Vref3 and the first node N1 of the pixel driving semiconductor portion in the (i+2)-th column at least partially overlap. For example, the third reference signal line Vref3 may be electrically connected to the pixel driving semiconductor portion at the first node N1.

Exemplarily, with continued reference to FIG. 27 and FIG. 28, one fourth reference signal line Vref4 is electrically connected to the pixel driving semiconductor portion in the (i+1)-th column through the second via hole CH2, and in the direction perpendicular to the plane where the display panel is located, the fourth reference signal line and the second node N2 of the pixel driving semiconductor portion in the (i+1)-th column at least partially overlap.

As shown in the figures, another fourth reference signal line Vref4 is electrically connected to the pixel driving semiconductor portion in the (i+3)-th column through the second via hole CH2, and in the direction perpendicular to the plane where the display panel is located, the fourth reference signal line Vref4 and the second node N2 of the pixel driving semiconductor portion in the (i+3)-th column at least partially overlap. It is to be understood that the fourth reference signal line Vref4 may be electrically connected to the pixel driving semiconductor portion at the second node N2.

It is to be noted that the manner in which the third reference signal line Vref3 and the fourth reference signal line Vref4 are electrically connected to the pixel driving semiconductor portions is not limited to the above-described embodiments of the present disclosure, and the third reference signal line Vref3 and the fourth reference signal line Vref4 may also be connected to connection points, for implementing electric connection, at any positions on the pixel connecting semiconductor portion, which is not limited in the present disclosure.

Exemplarily, referring to FIG. 28, the reference signal line includes a first reference signal line Vref1 and a second reference signal line Vref2 extending in the row direction.

Exemplarily, the number of rows of the pixel driving semiconductor portions in the column direction is N, the number of the first reference signal lines is n1, and the number of the second reference signal lines is n2, where 2N=n1+n2, and n1=n2. In this way, the distribution density of the reference signal lines in the row direction can be increased.

Exemplarily, at least one first reference signal line Vref1 extending in the row direction X is electrically connected to at least two third reference signal lines Vref3 arranged in the row direction.

At least one second reference signal line Vref2 extending in the row direction X is electrically connected to at least two fourth reference signal lines Vref4 arranged in the row direction. In an embodiment, the first reference signal line Vref1 is electrically connected to the third reference signal lines Vref3 through third via holes CH3, the second reference signal line Vref2 is electrically connected to the fourth reference signal lines Vref4 through fourth via holes CH4, that is, the first reference signal line Vref1 and the third reference signal lines Vref3 have the same potential, and the second reference signal line Vref2 and the fourth reference signal lines Vref4 have the same potential.

Exemplarily, each column of pixel circuits correspond to one reference signal line extending in the column direction, therefore, at least two reference signal lines extending in the row direction may be provided, i.e., including one first reference signal line Vref1 and one second reference signal line Vref2, the one first reference signal line Vref1 is electrically connected to all the third reference signal lines Vref3, and the one second reference signal line Vref2 is electrically connected to all the fourth reference signal lines Vref4. That is, the electrical connection of multiple third reference signal lines Vref3 and the electrical connection of multiple fourth reference signal lines Vref4 may be implemented, respectively. Apparently, multiple first reference signal lines Vref1 and multiple second reference signal lines Vref2 may also be provided in an embodiment of the present disclosure, and it is only necessary to achieve the electrical connection of the reference signal lines extending in the column direction, which is not limited in the embodiment of the present disclosure.

In an embodiment, the at least one first reference signal line Vref1 and the at least one second reference signal line Vref2 may be provided with reference signal buses Vref0 in a non-display region respectively, and the reference signal buses Vref0 may extend in the column direction to a binding region of the display panel.

In an embodiment, the first reference signal lines Vref1 and the second reference signal lines Vref2 are alternately arranged.

With continued reference to FIG. 28, at least one row of pixel driving semiconductor portions overlap one first reference signal line Vref1 and one second reference signal line Vref2 in the direction perpendicular to the plane where the display panel is located.

With continued reference to FIG. 27 and FIG. 28, in the row direction X, patterns of the pixel driving semiconductor portions in two adjacent pixel circuits arranged sequentially are different, and patterns of two pixel driving semiconductor portions spaced apart by one pixel driving semiconductor portion are the same.

Figure 29:
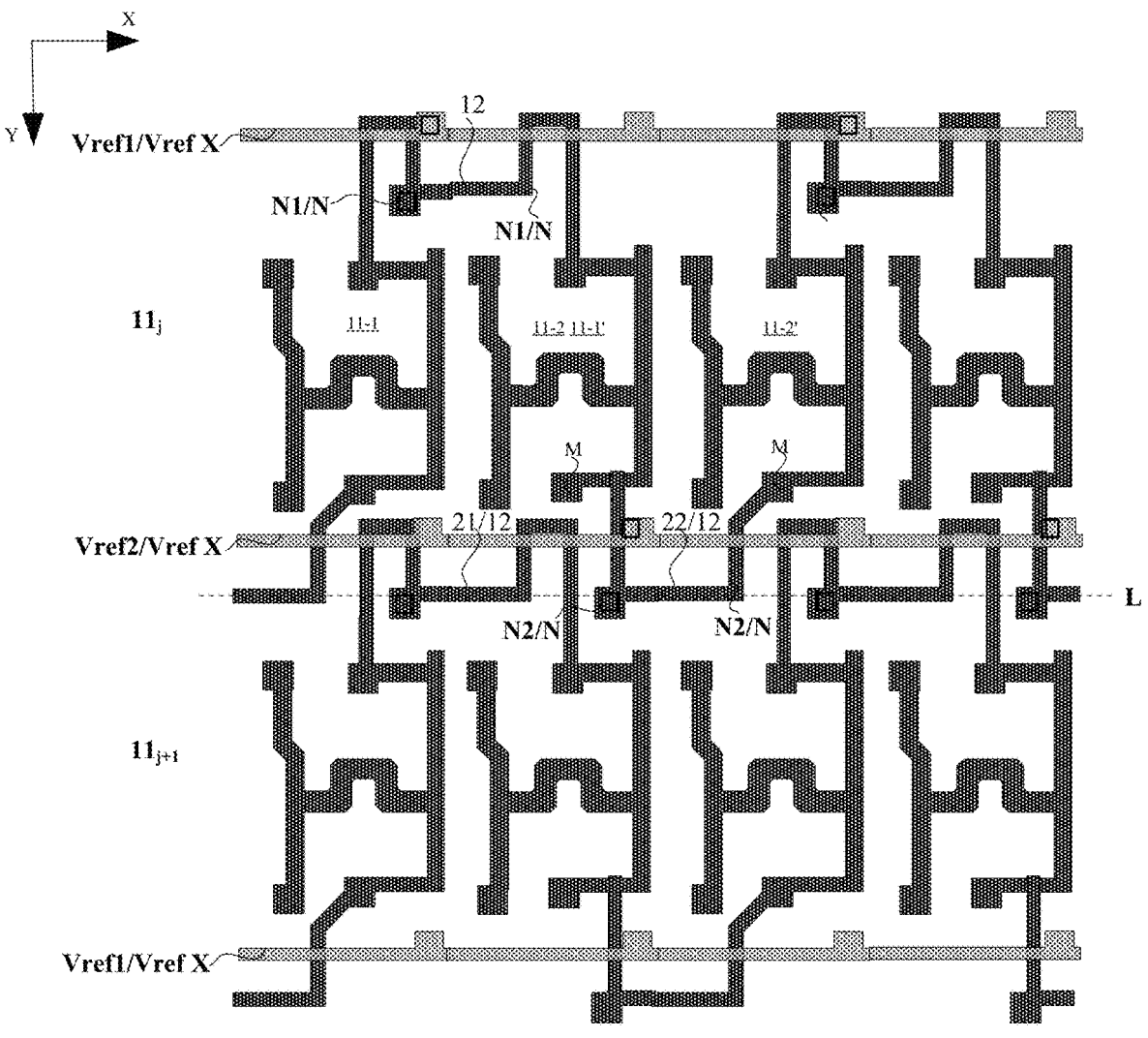
FIG. 29 is a structural diagram of another pixel driving semiconductor portion and reference signal lines according to an embodiment of the present disclosure.

FIG. 29 is a structural diagram of another pixel driving semiconductor portion and reference signal lines according to an embodiment of the present disclosure. As shown in FIG. 29, the reference signal line Vref includes a reference signal line Vref X extending in the row direction X. The reference signal line Vref X includes a first reference signal line Vref1 and a second reference signal line Vref2 extending in the row direction X. In the same pixel driving semiconductor portion, the first node N1 is electrically connected to the first reference signal line Vref1, and the second node N2 is electrically connected to the second reference signal line Vref2. The specific electrical connection manner in this embodiment is not shown, and any electrical connection manner can be adopted in the embodiment of the present disclosure.

The two pixel driving semiconductor portions adjacent in the row direction include a first pixel driving semiconductor portion 11-1 and a second pixel driving semiconductor portion 11-2, and the first node N1 in the first pixel driving semiconductor portion 11-1 is electrically connected to the first node N1 in the second pixel driving semiconductor portion 11-2 by the pixel connecting semiconductor portion 12, or the second node N2 in the first pixel driving semiconductor portion 11-1' is electrically connected to the second node N2 in the second pixel driving semiconductor portion 11-2' by the pixel connecting semiconductor portion 12.

Exemplarily, with continued reference to FIG. 29, the pixel driving semiconductor portions 11 arranged in the column direction Y include a pixel driving semiconductor portion $11_j$ in a j-th row and a pixel driving semiconductor unit $11_{j+1}$ in a (j+1)-th row, where j is an integer greater than or equal to 1. In the direction extending in the column direction Y, the second pixel connecting semiconductor portion 22 electrically connected to the second nodes N2 in the connected pixel driving semiconductor portions $11_j$ in the j-th row and a first pixel connecting semiconductor portion 21 electrically connected to the first nodes N1 in the connected pixel driving semiconductor portions $11_{j+1}$ in the (j+1)-th row are on the same dummy straight line L extending in the row direction X. It is to be understood that the first pixel connecting semiconductor portion 21 and the second pixel connecting semiconductor portion 22 are aligned on the dummy straight line L.

Exemplarily, referring to FIG. 23, FIG. 24 and FIG. 29, the pixel driving semiconductor portion includes an anode connecting point M, and the anode of the light-emitting element D is electrically connected to the anode connecting point M.

With continued reference to FIG. 28, in the column direction Y, the second reference signal line Vref2/Vref X is located between the dummy straight line L and the anode connecting points M of the pixel driving semiconductor portions in the j-th row.

In an embodiment, the first node N1 and the second node N2 in the pixel driving semiconductor portion 11 are respectively located on two opposite sides of the pixel driving semiconductor portion in the second direction, and the second direction is parallel to the plane where the array substrate is located and is parallel to the column direction Y or an included angle between the second direction and the column direction Y is an acute angle.

In the row direction X, patterns of the pixel driving semiconductor portions 11 in two adjacent pixel circuits arranged sequentially are different, and patterns of two pixel driving semiconductor portions spaced apart by one pixel driving semiconductor portion are the same.

Exemplarily, as shown in FIG. 6, FIG. 9 to FIG. 16 and FIG. 29, the first reference signal lines Vref1 and the second reference signal lines Vref2 are alternately arranged.

In an optional embodiment, as shown in FIG. 6 and FIG. 9 to FIG. 16, the number of rows of the pixel driving semiconductor portions in the column direction is N, and the number of the first reference signal lines is n1, and the number of the second reference signal lines is n2, where 2N=n1+n2, and n1=n2.

Figure 30:
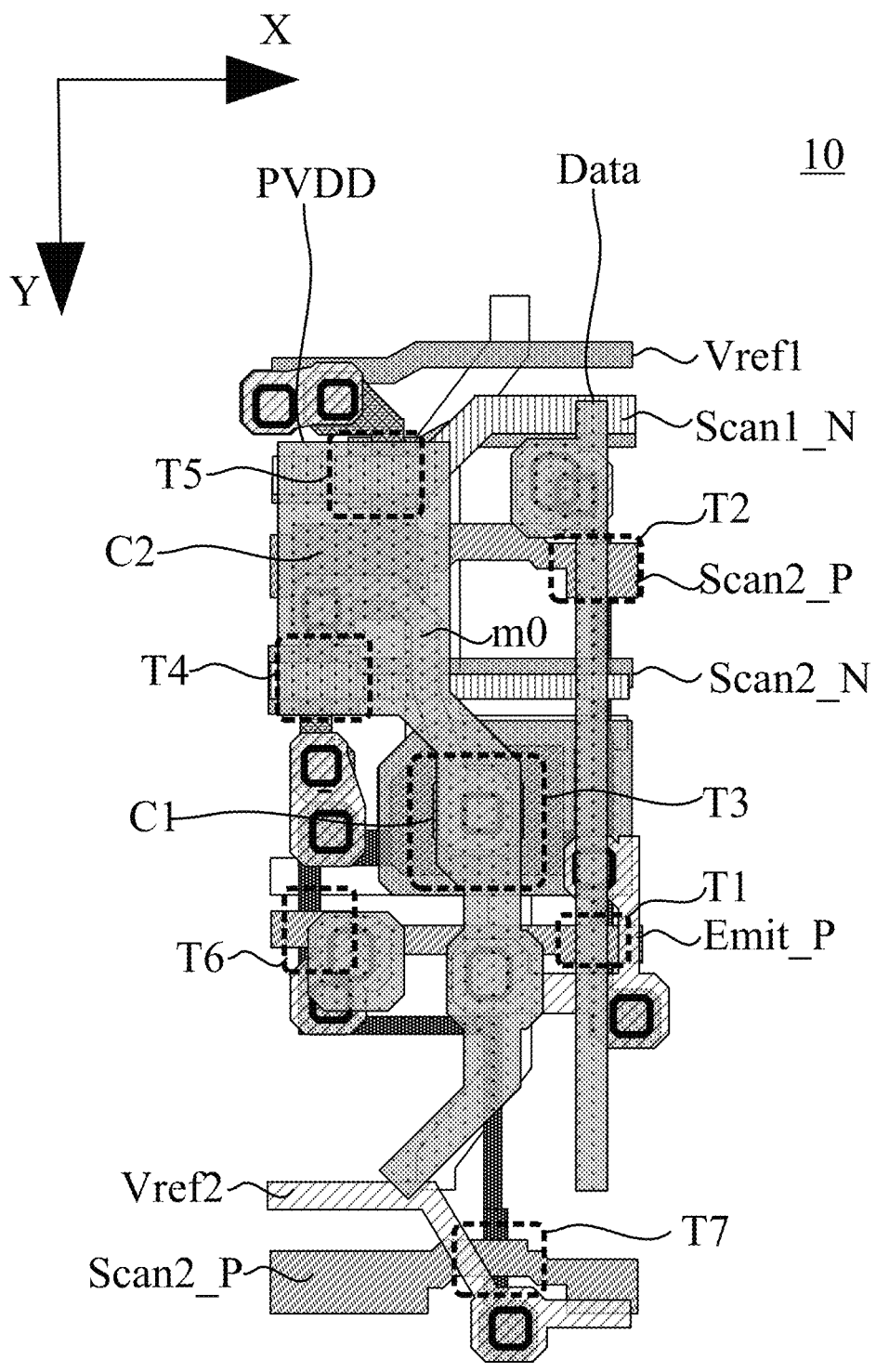
FIG. 30 is a schematic diagram of a structural layout of another pixel circuit according to an embodiment of the present disclosure.
Figure 31:
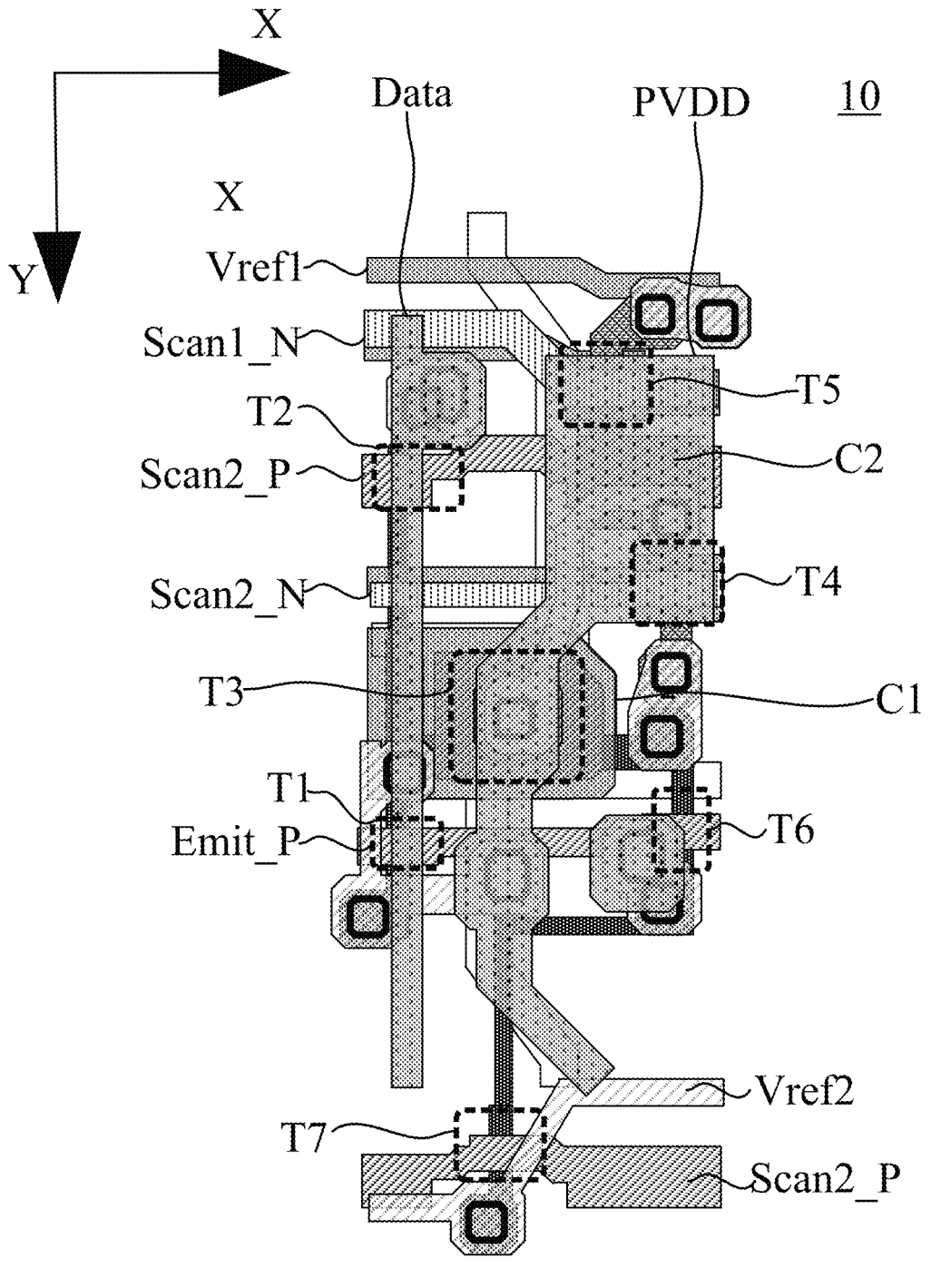
FIG. 31 is a schematic diagram of a structural layout of another pixel circuit according to an embodiment of the present disclosure.
Figure 32:
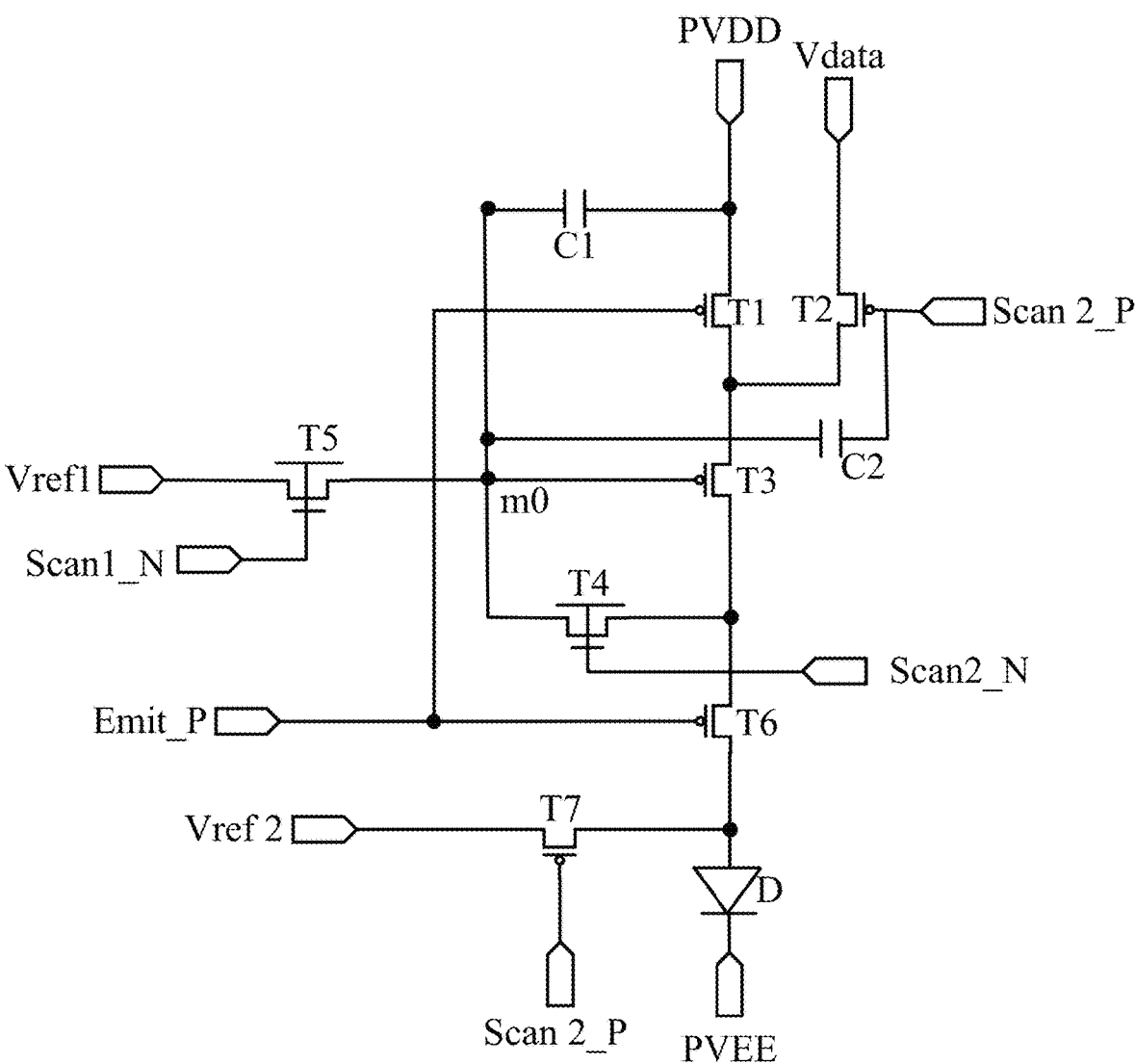
FIG. 32 is a structural diagram of a circuit structure of the pixel circuits shown in FIG. 30 and FIG. 31 according to an embodiment of the present disclosure.

In an embodiment, still another pixel circuit of the display panel is provided according to an embodiment of the present disclosure. FIG. 30 is a schematic diagram of a structural layout of another pixel circuit according to an embodiment of the present disclosure, FIG. 31 is a schematic diagram of a structural layout of another pixel circuit according to an embodiment of the present disclosure, and FIG. 32 is a structural diagram of a circuit structure of the pixel circuits shown in FIG. 30 to FIG. 31 according to an embodiment of the present disclosure. As shown in FIG. 30 to FIG. 32, the pixel circuit 10 includes multiple transistors (T1 to T7) and two storage capacitors (C1 and C2), and the pixel driving semiconductor portions 11 include semiconductor layers of the transistors. The pixel circuit 10 includes a drive transistor T3, a first light emission control transistor T1, and the array substrate includes a light emission control signal line Emit_P extending in the row direction.

In an embodiment, a display panel according to the embodiment of the present disclosure includes the above pixel circuit shown in FIG. 30 and the above pixel circuit shown in FIG. 31, and the structural diagram of the pixel driving semiconductor portions formed by arranging the pixel driving semiconductor portions of the above two types of pixel circuits is mainly described hereinafter.

In an embodiment, still another display panel is provided according to an embodiment of the present disclosure, the display panel includes an array substrate, and the array substrate includes multiple pixel circuits arranged in an array in the row direction and the column direction, each of the pixel circuits includes a pixel driving semiconductor portion 11, and the pixel driving semiconductor portion 11 includes connecting nodes N, where the row direction intersect the column direction.

The display panel includes multiple reference signal lines and the connecting nodes N are electrically connected to the reference signal lines Vref respectively.

The display panel further includes a pixel connecting semiconductor portion 12, at least two connecting nodes N adjacent in the first direction are electrically connected by the pixel connecting semiconductor portion 12, and the first direction is parallel to the plane where the array substrate is located.

The pixel circuit includes multiple transistors, and at least one transistor is an N-type transistor.

Exemplarily, as shown in FIG. 30 to FIG. 32, the pixel circuit includes multiple thin film transistors. The second reset transistor T7, the first light emission control transistor T1, the second light emission control transistor T6, the data writing transistor T2 and the drive transistor T3 are P-type transistors, and the threshold compensation transistor T4 and the first reset transistor T5 are N-type transistors.

In an embodiment, the active layer of the first reset transistor T5 includes an oxide semiconductor, and the oxide semiconductor includes indium gallium zinc oxide (IGZO) or other materials.

Figure 33:
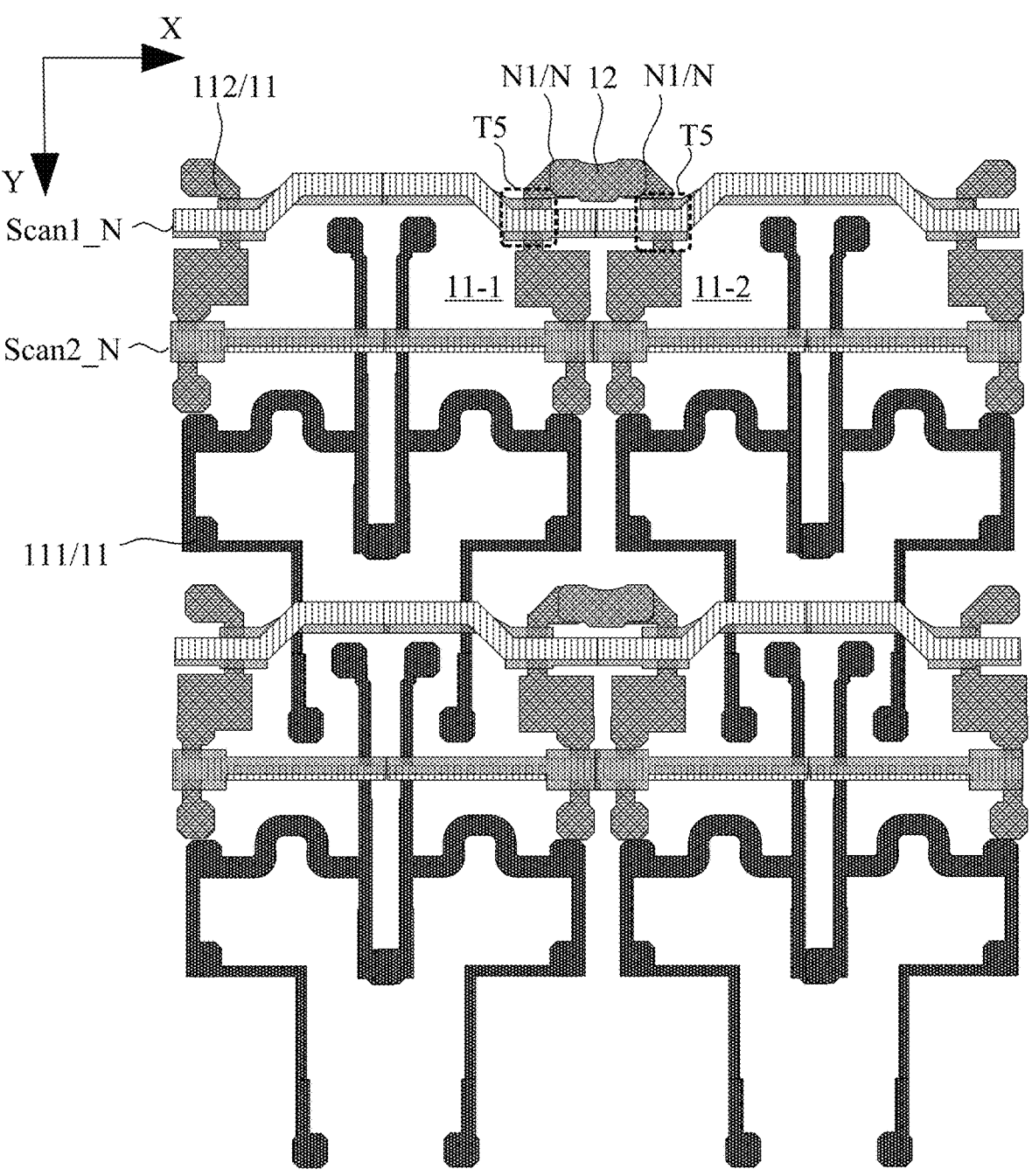
FIG. 33 is a structural diagram of another pixel driving semiconductor portion according to an embodiment of the present disclosure.
Figure 34:
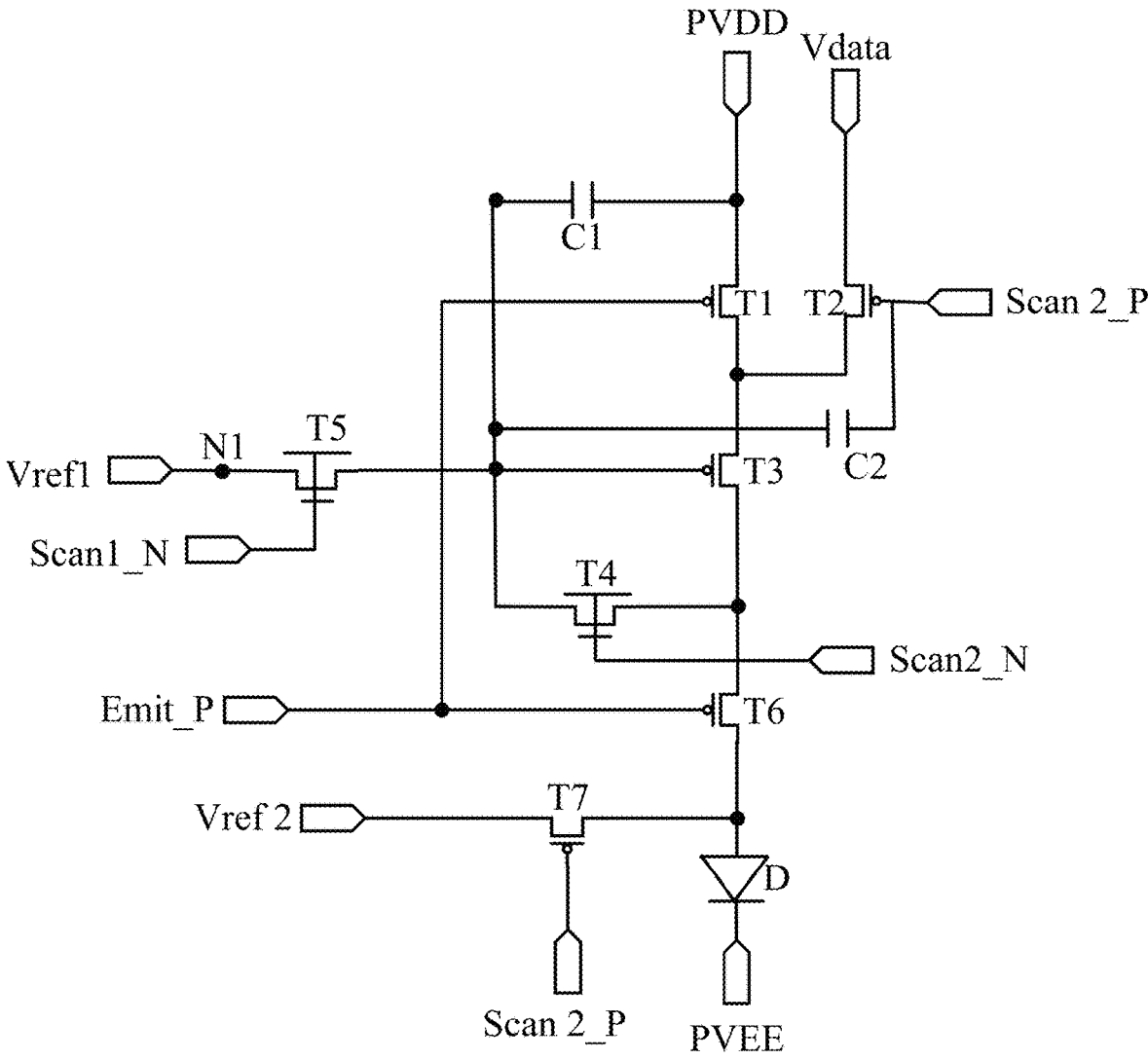
FIG. 34 is a structural diagram of a circuit structure of the pixel circuit shown in FIG. 33 according to an embodiment of the present disclosure.

FIG. 33 is a structural diagram of another pixel driving semiconductor portion according to an embodiment of the present disclosure, and FIG. 34 is a structural diagram of a circuit structure of the pixel circuit shown in FIG. 33 according to an embodiment of the present disclosure.

Further referring to FIG. 33, the pixel driving semiconductor portions 11 include the semiconductor layers corresponding to FIG. 30 and FIG. 31, and patterns of the pixel driving semiconductor portions in two pixel circuits arranged sequentially in the row direction X are mirror-symmetric. It is to be noted that the active layer of a transistor is the semiconductor layer of the transistor, including a semiconductor layer flowing from the source region to the drain region of the transistor. In an embodiment, the pixel driving semiconductor portions 11 include a first sub-pixel driving semiconductor portion 111 and a second sub-pixel driving semiconductor portion 112. It is to be understood that the first sub-pixel driving semiconductor portion 111 includes the semiconductor layers of the above multiple P-type transistors, and the second sub-pixel driving semiconductor portion 112 includes the semiconductor layers of the above N-type transistors.

As shown in FIG. 33 and FIG. 34, the pixel driving semiconductor portion 11 includes a connecting node N, and the connecting node N includes a first node N1, one terminal of the first reset transistor T5 is electrically connected to the first node N1, and another terminal of the first reset transistor T5 is electrically connected to the gate of the drive transistor T3. The reference signal line Vref includes a first reference signal line Vref1 electrically connected to the first node N1.

The two pixel driving semiconductor portions 11 adjacent in the row direction include a first pixel driving semiconductor portion 11-1 and a second pixel driving semiconductor portion 11-2. The first node N1 in the first pixel driving semiconductor portion 11-1 is electrically connected to the first node N1 in the second pixel driving semiconductor portion 11-2 by the pixel connecting semiconductor portion 12. It is to be understood that the pixel driving semiconductor portion 11 and the pixel connecting semiconductor portion 12 are arranged in the same layer, the pixel driving semiconductor portion 11 includes a second sub-pixel driving semiconductor portion 112, and the second sub-pixel driving semiconductor portion 112 includes the semiconductor layer of the first reset transistor T5. Further, the pixel connecting semiconductor portion 12 and the semiconductor layer of the first reset transistor T5 are arranged in the same layer.

It is to be noted that, the pixel driving semiconductor portion shown in FIG. 32 includes semiconductor layers of the transistors shown in FIG. 30 and FIG. 31. The pixel circuits shown in FIG. 30 and FIG. 31 are described in detail hereinafter.

Figure 35:
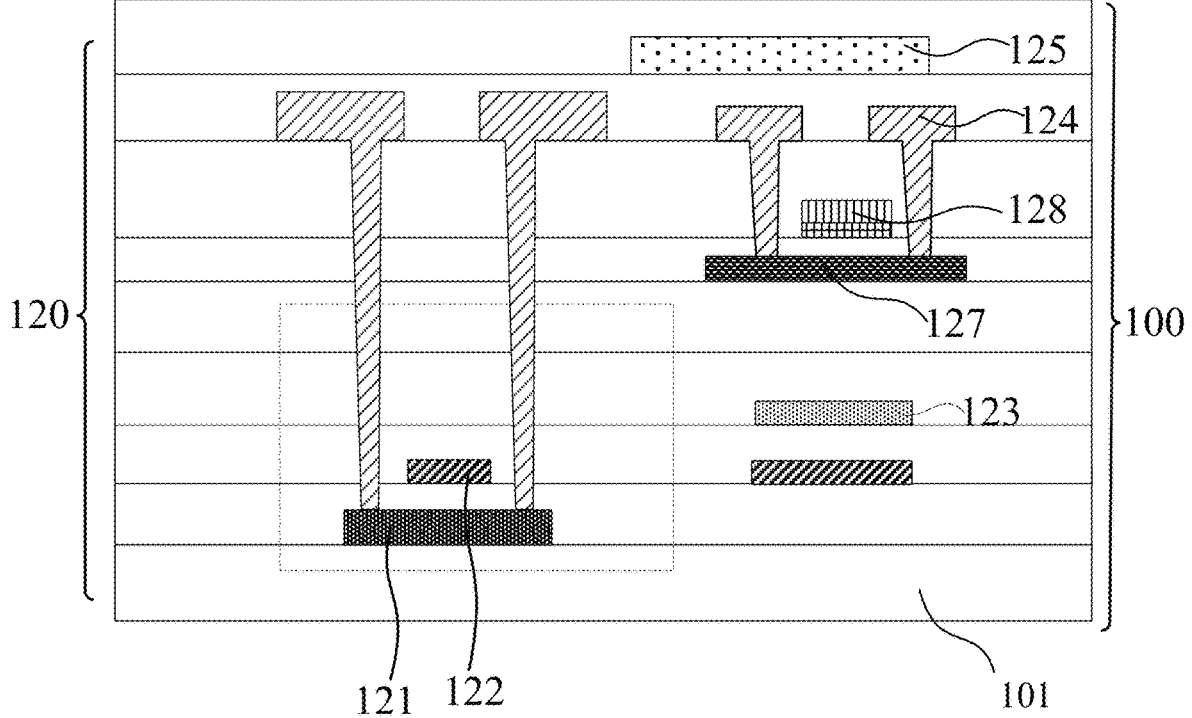
FIG. 35 is a schematic partial cross-sectional view corresponding to the pixel circuits shown in FIG. 30 and FIG. 31 according to an embodiment of the present disclosure.

FIG. 35 is a schematic partial cross-sectional view corresponding to the pixel circuits shown in FIG. 30 and FIG. 31 according to an embodiment of the present disclosure. As shown in FIG. 35, the display panel includes an array substrate 100, the array substrate 100 includes a substrate 101 and a drive circuit layer 120 disposed on the substrate 101, the drive circuit layer 120 includes a first semiconductor layer 121, a first gate electrode layer 122, a capacitor metal layer 123, a second semiconductor layer 127, a second gate electrode layer 128, a second metal layer 124, and a third metal layer 125 stacked in a direction away from the substrate, and an insulation layer is provided between every two adjacent metal layers.

It is to be understood that, as shown in FIG. 33 and FIG. 35, the first sub-pixel driving semiconductor portion 111 of the pixel driving semiconductor portion is disposed at the first semiconductor layer 121, and the second sub-pixel driving semiconductor portion 112 of the pixel driving semiconductor portion is disposed at the second semiconductor layer 127, that is, the active layer of the first reset transistor T5 is located at the second semiconductor layer 127.

Further, referring to FIG. 33 and FIG. 35, the pixel connecting semiconductor portion 12 and the pixel driving semiconductor portion 11 are arranged in the same layer. The pixel driving semiconductor portion 11 includes the second sub-pixel driving semiconductor portion 112, and the second sub-pixel driving semiconductor portion 112 includes the active layer of the first reset transistor T5, therefore, the pixel driving semiconductor portion 11 includes the active layer of the first reset transistor T5, and the pixel connecting semiconductor portion 12 and the active layer of the first reset transistor T5 are arranged in the same layer and are all arranged in the second semiconductor layer 127.

Figure 36:
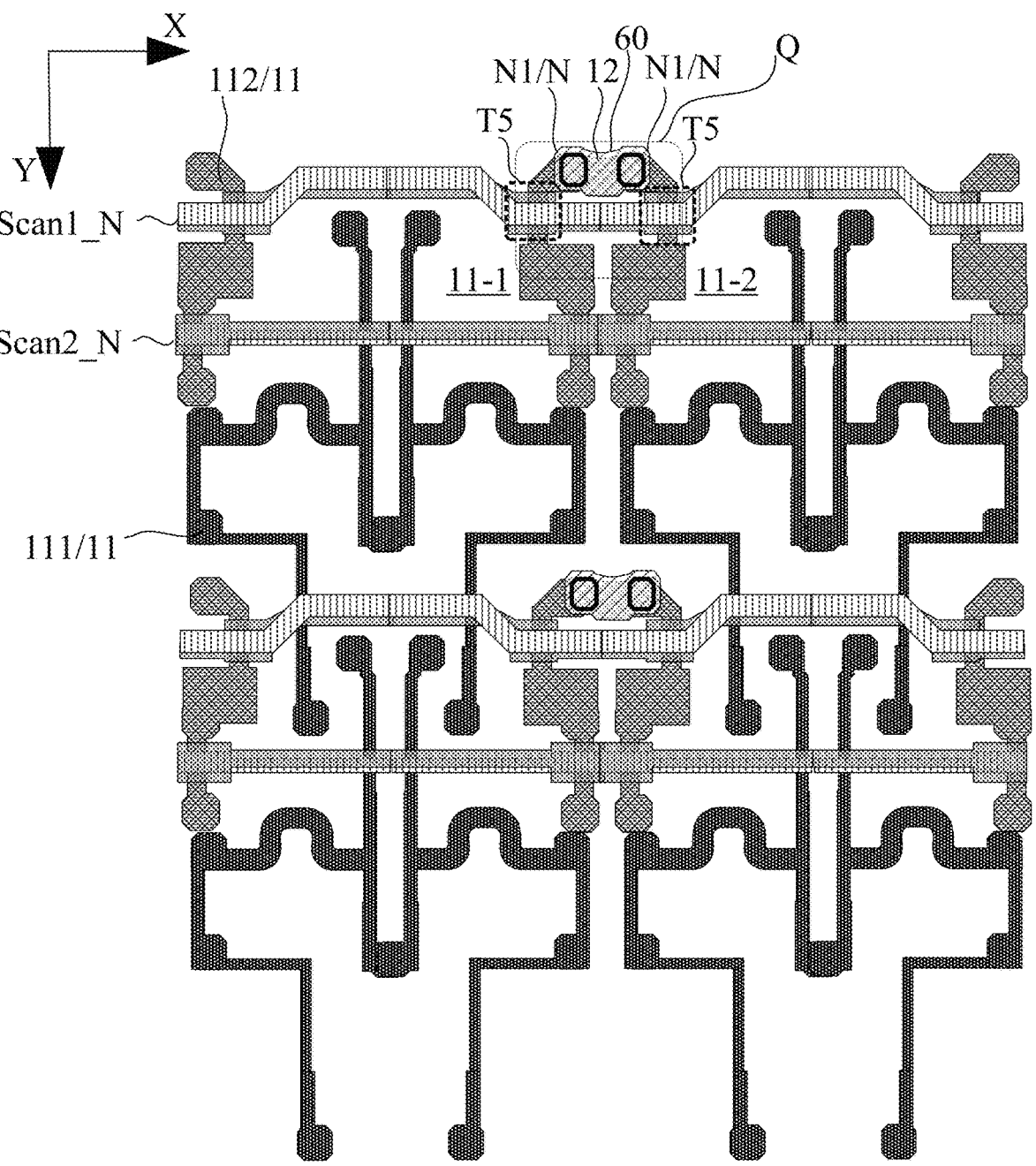
FIG. 36 is a structural diagram of another pixel driving semiconductor portion according to an embodiment of the present disclosure.

In an embodiment, FIG. 36 is a structural diagram of another pixel driving semiconductor portion according to an embodiment of the present disclosure. The difference of FIG. 36 from FIG. 33 lies in the connection manner in connecting the first reset transistor T5, that is, there is difference in the connection manner in connecting the two first nodes N1.

In an embodiment, referring to FIG. 36, the display panel further includes a connecting electrode 60, two pixel driving semiconductor portions 11 adjacent in the row direction include a first pixel driving semiconductor portion 11-1 and a second pixel driving semiconductor portion 11-2, and the first node N1 in the first pixel driving semiconductor portion 11-1 and the first node N1 in the second pixel driving semiconductor portion 11-2 are electrically connected by the connecting electrode 60. It can be known from the above description that the first node N1 in the first pixel driving semiconductor portion 11-1 is electrically connected to the first node N1 in the second pixel driving semiconductor portion 11-2 by the pixel connecting semiconductor portion 12. Therefore, it is to be understood that two first nodes N1 are electrically connected by the connecting electrode 60 and the pixel connecting semiconductor portion 12 connected in parallel.

In an embodiment, the connecting electrode 60 and the second metal layer 124 are arranged in the same layer. Apparently, other embodiments of the present disclosure may also include that the connecting electrode 60 is arranged in the same layer with any one of the first gate electrode layer 122, the capacitor metal layer 123, the second gate electrode layer 128, and the third metal layer 125, which is not limited in the present disclosure.

Figure 37:
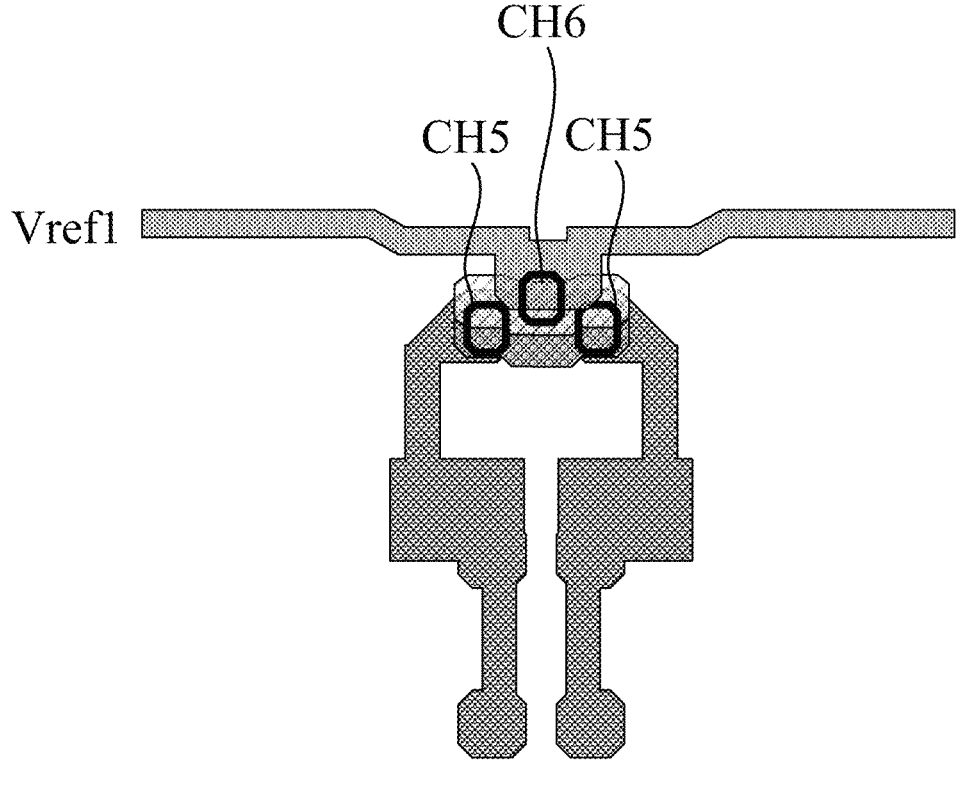
FIG. 37 is an enlarged structural view of a position Q shown in FIG. 36 according to an embodiment of the present disclosure.

In an embodiment, FIG. 37 is an enlarged structural view of a position Q shown in FIG. 36 according to an embodiment of the present disclosure. Referring to FIG. 36 and FIG. 37, the connecting electrode 60 is electrically connected to the first node N1 through a fifth via hole CH5. The reference signal line Vref1 is electrically connected to the connecting electrode 60 or the pixel connecting semiconductor portion 12 through a sixth via hole CH6. The fifth via hole CH5 and the sixth via hole CH6 do not overlap in the direction perpendicular to the plane where the display panel is located.

In an embodiment, with continued reference to FIG. 36, in the column direction, the width of the connecting electrode 60 is greater than the width of the active layer of the first reset transistor T5.

Figure 38:
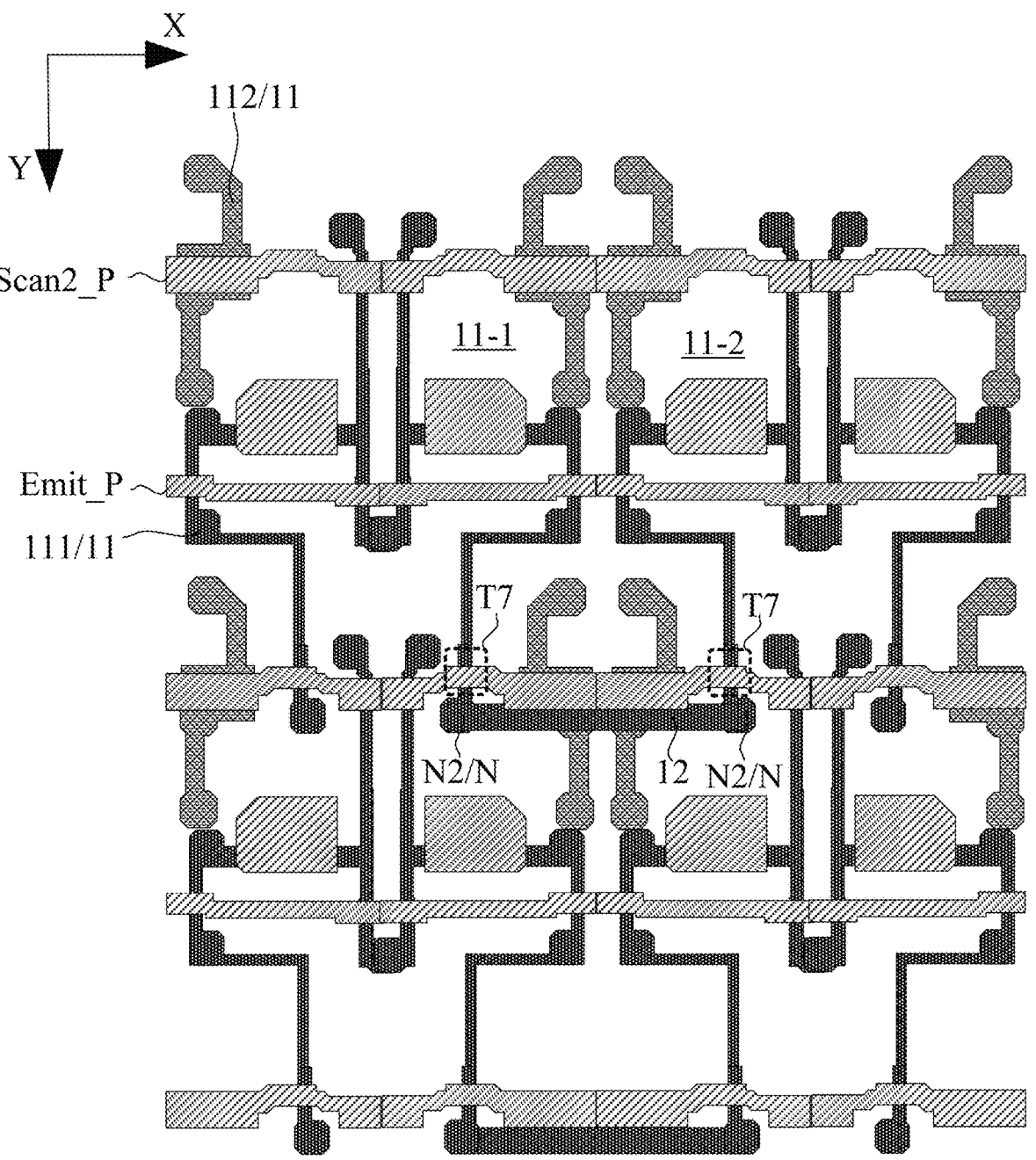
FIG. 38 is a structural diagram of another pixel driving semiconductor portion according to an embodiment of the present disclosure.
Figure 39:
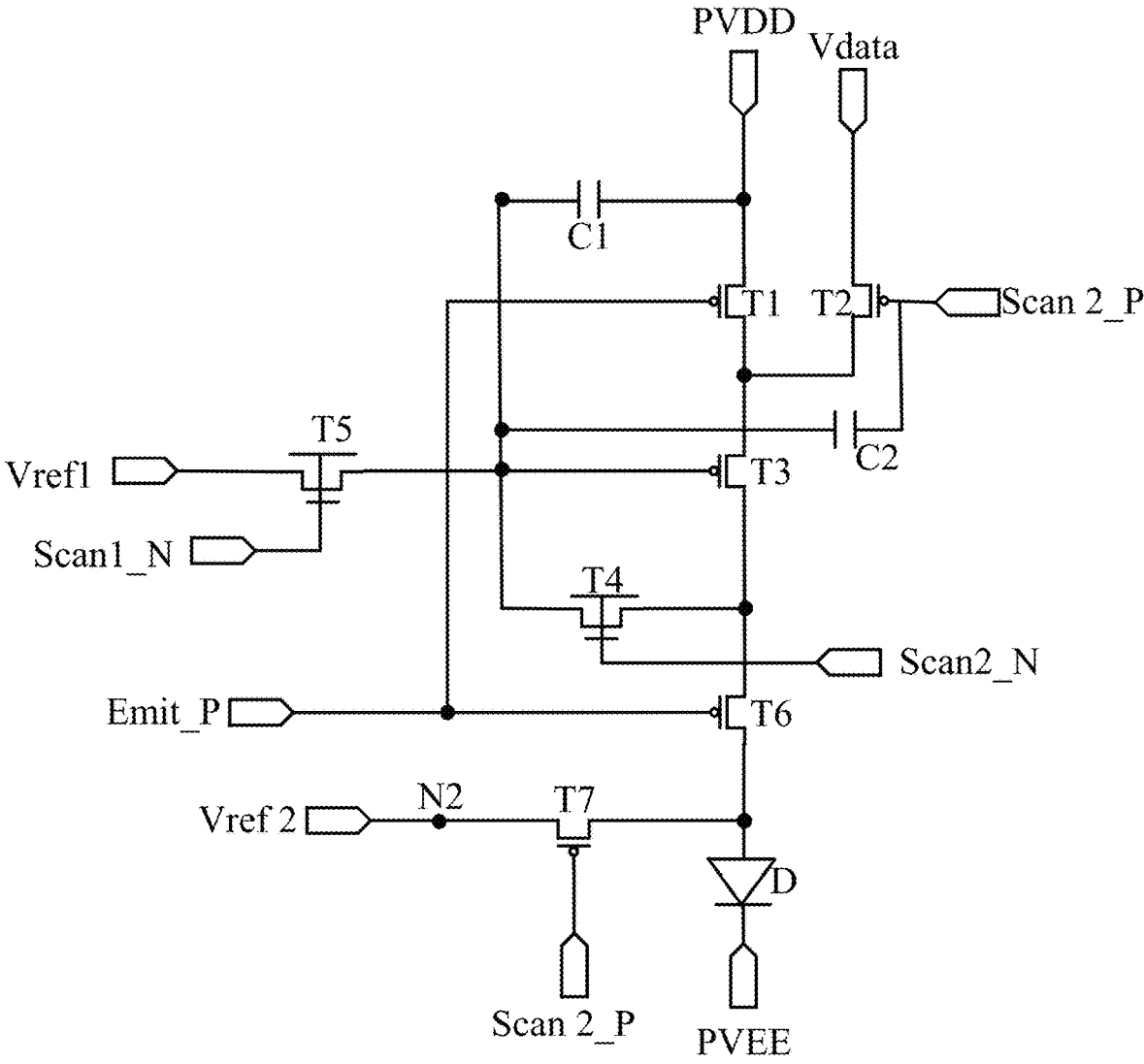
FIG. 39 is a schematic diagram of a circuit structure corresponding to the pixel circuit shown in FIG. 38 according to an embodiment of the present disclosure.

FIG. 38 is a structural diagram of another pixel driving semiconductor portion according to an embodiment of the present disclosure; and FIG. 39 is a schematic diagram of a circuit structure corresponding to the pixel circuit shown in FIG. 38 according to an embodiment of the present disclosure.

As shown in FIG. 38 and FIG. 39, the pixel circuit includes a drive transistor T3, a light-emitting element D, and a second reset transistor T7. The pixel driving semiconductor portion 11 includes a connecting node N, and the connecting node N includes a second node N2, one terminal of the second reset transistor T7 is electrically connected to the second node N2, and another terminal of the second reset transistor T7 is electrically connected to the anode of the light-emitting element D. The reference signal line Vref includes a second reference signal line Vref2 electrically connected to the second node N2.

As shown in FIG. 38, two pixel driving semiconductor portions 11 adjacent in the row direction include a first pixel driving semiconductor portion 11-1 and a second pixel driving semiconductor portion 11-2, and the second node N2 in the first pixel driving semiconductor portion 11-1 is electrically connected to the second node N2 in the second pixel driving semiconductor portion 11-2 through the pixel connecting semiconductor portion 12. It is to be understood that, referring to FIG. 35 and FIG. 38, the active layer of the second reset transistor T7 is located in the first semiconductor layer 121, and the pixel driving semiconductor portion 11 and the pixel connecting semiconductor portion 12 are arranged in the same layer. The pixel driving semiconductor portion 11 includes the semiconductor layer of the second reset transistor T7. Further, the pixel connecting semiconductor portion 12 and the semiconductor layer of the second reset transistor T7 are arranged in the same layer.

Figure 40:
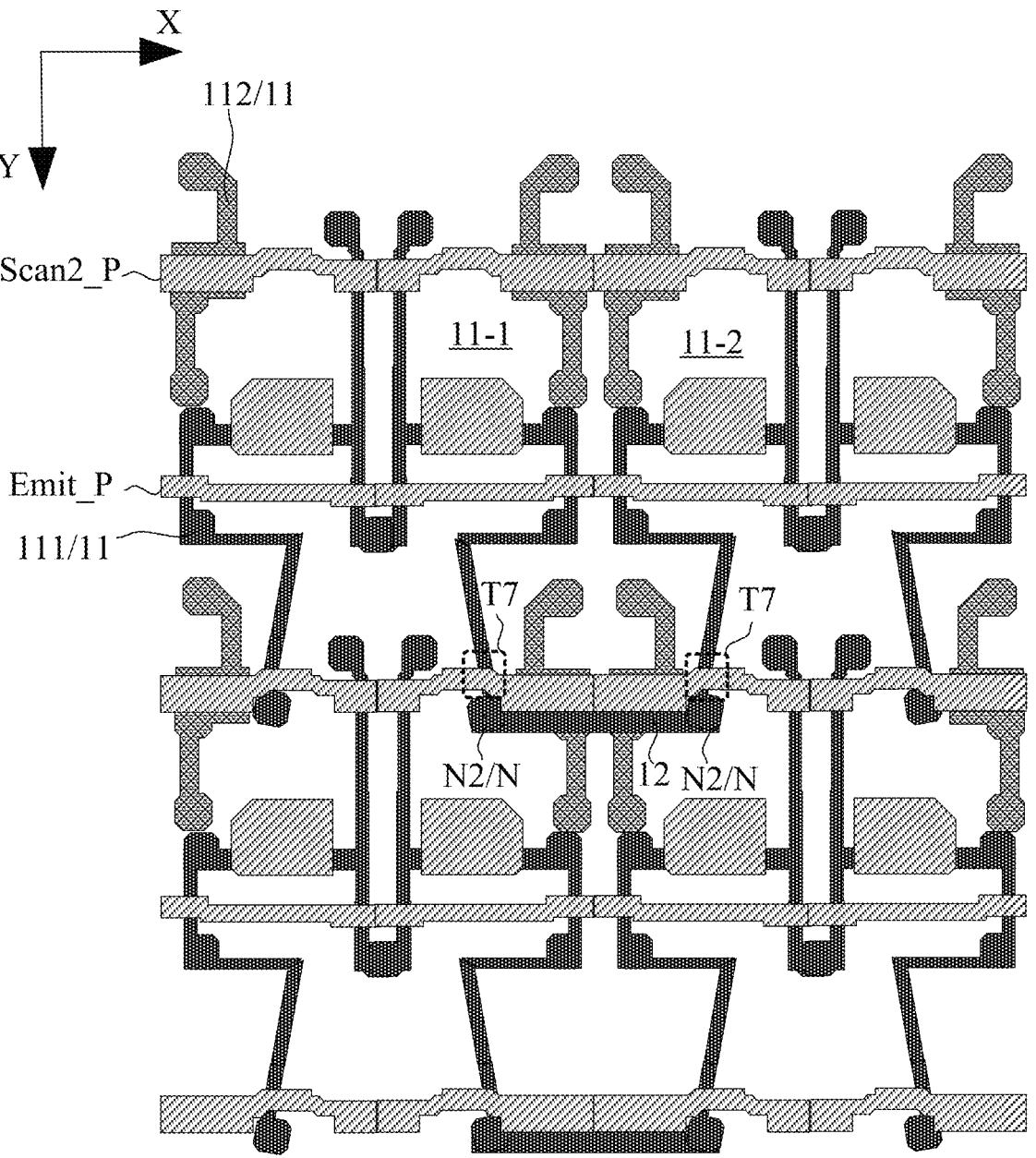
FIG. 40 is a structural diagram of another pixel driving semiconductor portion according to an embodiment of the present disclosure.

FIG. 40 is a structural diagram of another pixel driving semiconductor portion according to an embodiment of the present disclosure. As shown in FIG. 40, the active layers of two second reset transistors T7 electrically connected by the pixel connecting semiconductor portion 12 are inclined in directions in which they approach each other, that is, the two second nodes N2 electrically connected to each other by the pixel connecting semiconductor portion 12 approach each other in opposite directions.

Figure 41:
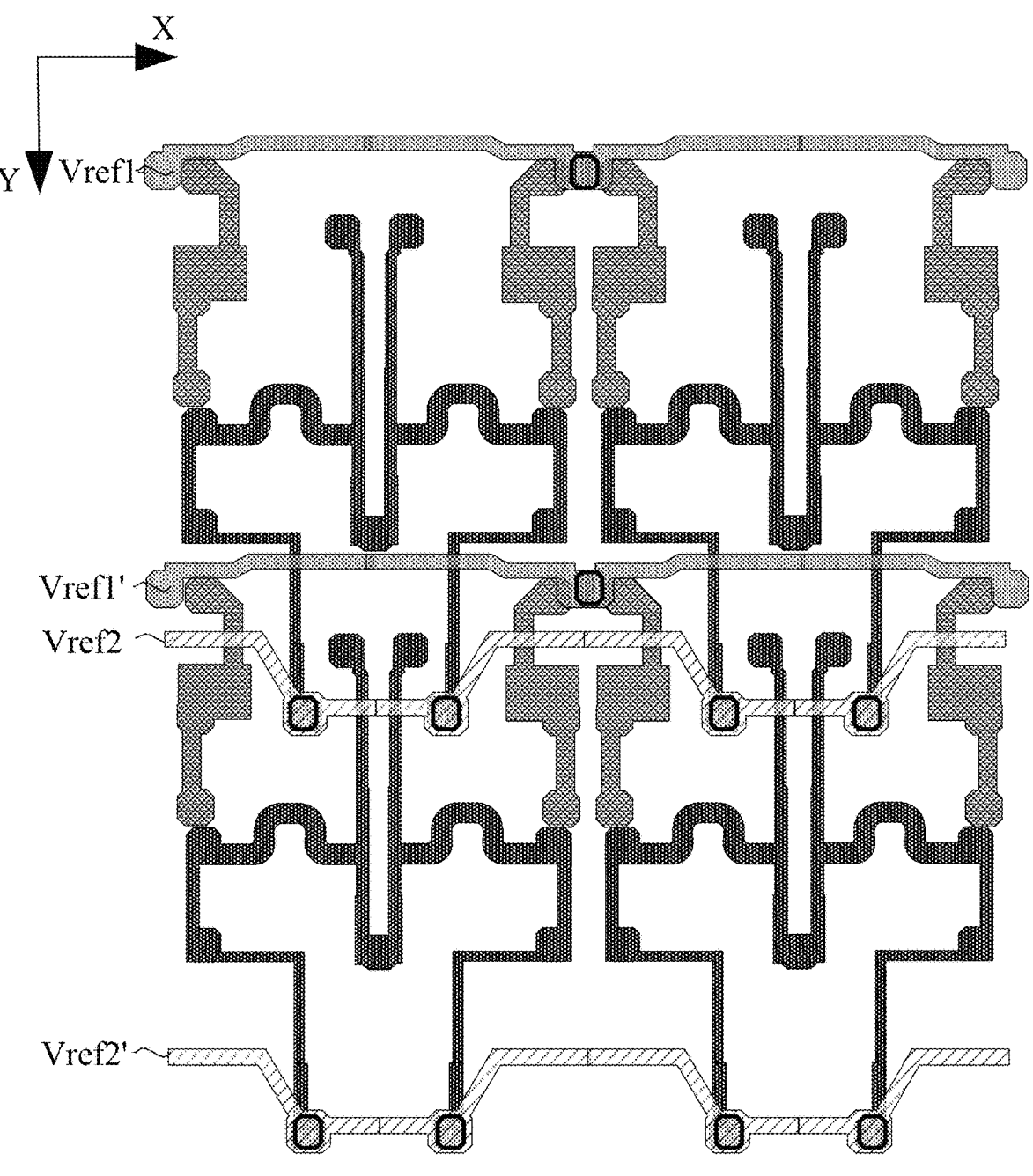
FIG. 41 is a structural diagram of another pixel driving semiconductor portion and reference signal lines according to an embodiment of the present disclosure.

FIG. 41 is a structural diagram of another pixel driving semiconductor portion and reference signal lines according to an embodiment of the present disclosure. Referring to FIG. 32 and FIG. 41, the reference signal line Vref includes first reference signal lines Vref1 and second reference signal lines Vref2 extending in the row direction X. One terminal of the first reset transistor T5 is electrically connected to the first reference signal line Vref1, and one terminal of the second reset transistor T7 is electrically connected to the second reference signal line Vref2.

Exemplarily, as shown in FIG. 41, the first reference signal lines Vref1 and the second reference signal lines Vref2 are alternately arranged in the column direction. In a case where the number of rows of the pixel driving semiconductor portion 11 in the column direction is N, the number of the first reference signal lines is n1, and the number of the second reference signal lines is n2; where 2N=n1+n2, and n1=n2.

Next, the film layer structures of the first reference signal line Vref1 and second reference signal line Vref2 in the layout are described with reference to FIG. 30, FIG. 31, FIG. 35, and FIG. 41.

As shown in FIG. 30, FIG. 31, FIG. 35, and FIG. 41, the first sub-pixel driving semiconductor portion 111 included in the pixel driving semiconductor portion 11 is located in the first semiconductor layer 121 in the drive circuit layer, and the second sub-pixel driving semiconductor portion 112 included in the pixel driving semiconductor portion 11 is located in the second semiconductor layer 127 in the drive circuit layer. The first scan signal line Scan2_P and the light emission control signal line Emit_P control the on and off of the P-type transistors, and are arranged at the first metal layer 122 in the drive circuit layer. The first scan signal line Scan1_N and the second scan signal line Scan2_N control the on and off of the N-type transistors, and each of the first scan signal line Scan' N and the second scan signal line Scan2_N includes two scan signal lines electrically connected to each other, and the two scan signal lines are arranged at the capacitor metal layer 123 and the second gate electrode layer 128, respectively, and are electrically connected to each other in the non-display region of the display panel. The reference signal line Vref includes a first reference signal line Vref1 and a second reference signal line Vref2 extending in the row direction. The first reference signal line Vref1 and the capacitor metal layer 123 are arranged in the same layer, and the second reference signal line Vref2 and the second metal layer 124 are arranged in the same layer.

Further, the data signal line Data extends in the column direction Y and is located at the third metal layer 125. The display panel further includes a power signal line PVDD extending in the column direction, and the power signal line PVDD and the third metal layer 125 are arranged in the same layer. The display panel further includes a light-blocking metal layer disposed on a side, of the first semiconductor layer close to the substrate, and the light-blocking metal layer is provided in a grid shape. Furthermore, the potential m0 connected to the gate electrode of the drive transistor T3 is hidden by the power signal line PVDD. The two electrode plates of the first capacitor C1 are respectively provided at the first gate electrode layer 122 and the capacitor metal layer 123. The electrode plate disposed at the first gate electrode layer 122 is also used as the gate electrode of the drive transistor T3, and the second capacitor C2 is formed by overlapping of the first scan signal line Scan2_P and the second semiconductor layer 127 at which the potential m0 is located.

Figure 17:
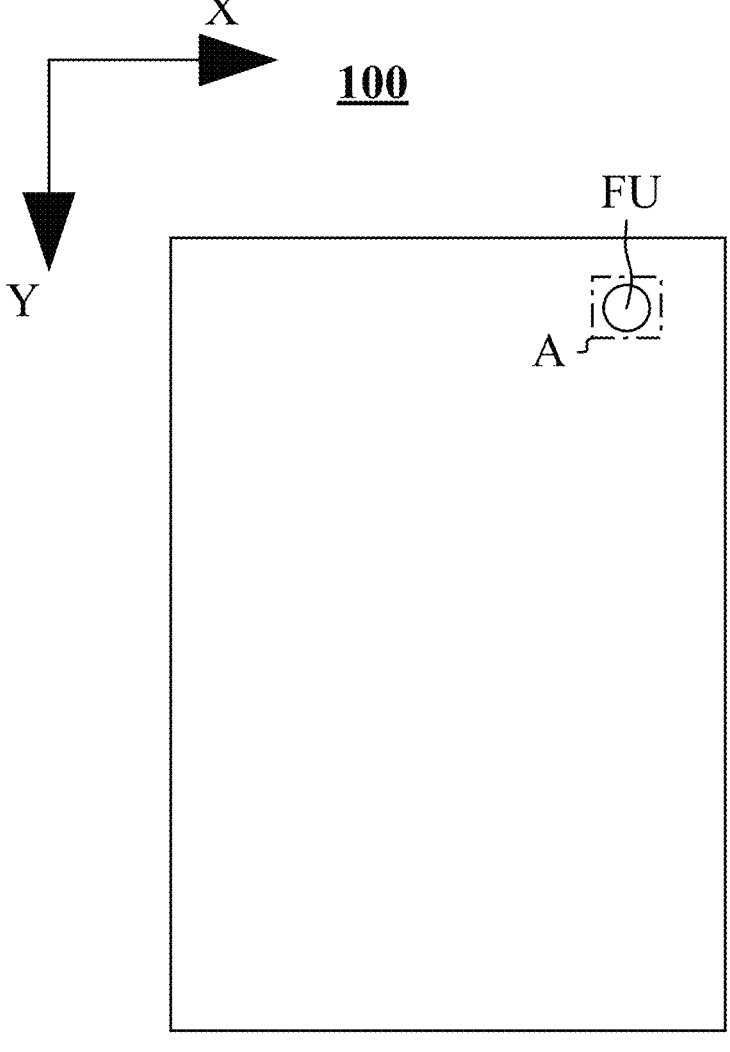
FIG. 17 is a structural diagram of another display panel according to an embodiment of the present disclosure.
Figure 18:
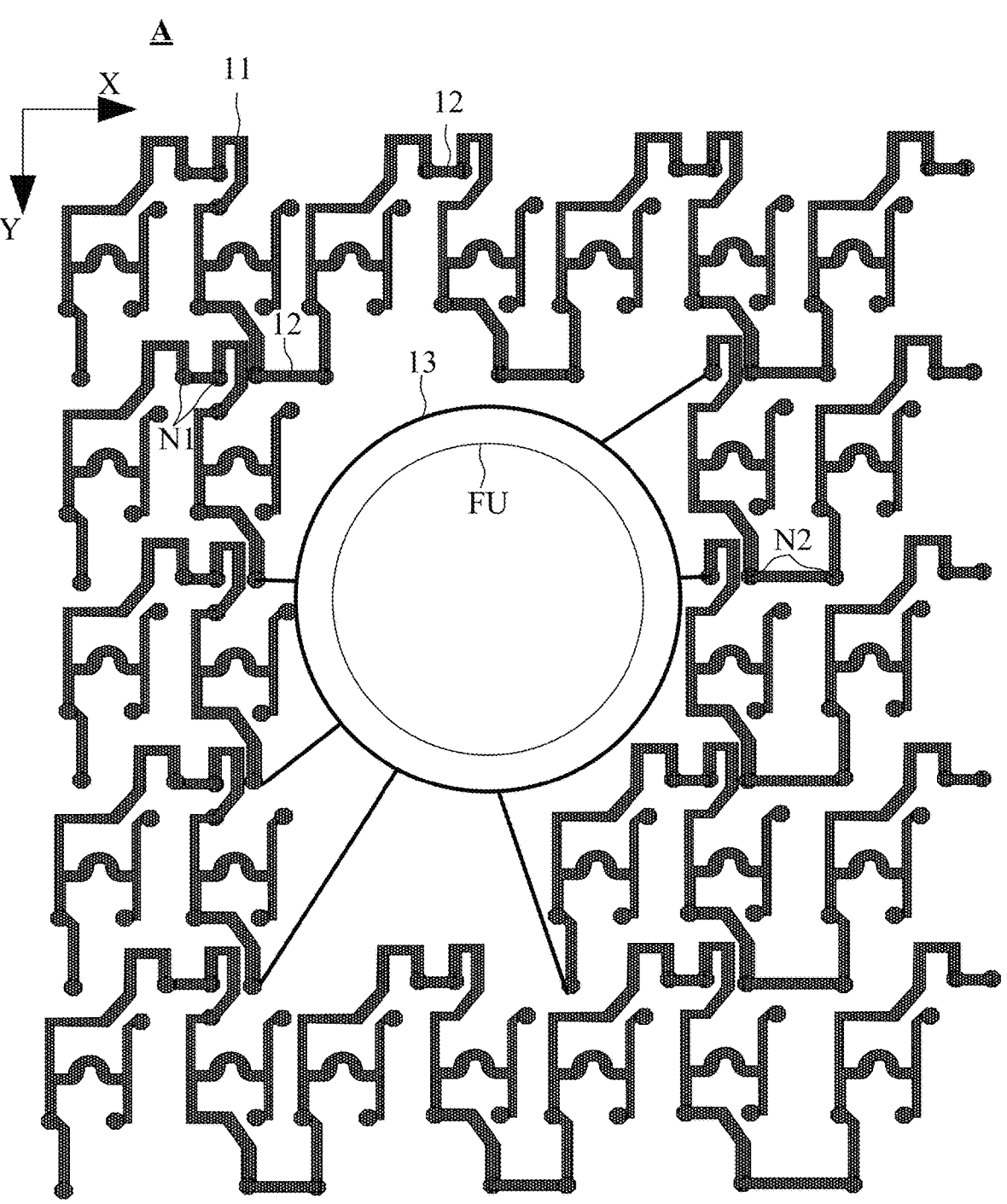
FIG. 18 is an enlarged exemplary view of a region A in FIG. 17.

On the basis of the above-described embodiment, FIG. 17 is a structural diagram of another display panel according to an embodiment of the present disclosure, and FIG. 18 is an enlarged exemplary view of a region A in FIG. 17. As shown in FIG. 17 and FIG. 18, the array substrate 100 may include a functional region FU, and pixel circuits 10 are arranged on two sides of the functional region FU in the row direction (the direction X as shown in FIGS. 17 and 18) or the column direction (the direction Y as shown in FIGS. 17 and 18).

The array substrate 100 further includes a region connecting semiconductor portion 13.

The region connecting semiconductor portion 13 extends around the functional region FU. The fixed potential nodes in the pixel driving semiconductor portions 11 located on two sides of the functional region FU in the row direction or the column direction are connected to the region connecting semiconductor portion 13.

Exemplarily, the array substrate 100 has the functional region FU, and functional devices such as a camera, a handset or an optical fingerprint sensor may be disposed at the position corresponding to the functional region FU. The shape of the functional region FU may be circular, rectangular, rounded rectangular, or the like, which is not limited in the present application. One or more functional regions FU may be provided, which is not limited in the present application. The functional region FU may be a non-display region or a display region. In the case where the functional region FU is the display region, it can be understood that the functional region FU also has corresponding pixel circuits. In order to improve the light transmission of the functional region FU, the pixel circuit corresponding to the functional region FU may be disposed in a region other than the functional region FU, for example, the pixel circuits 10 are arranged on two sides of the functional region FU in the column direction Y.

Further, as shown in FIG. 18, fixed potential nodes in the pixel driving semiconductor portions 11 located on two sides of the functional region FU in the row direction or the column direction are connected to the region connecting semiconductor portion 13. The fixed potential nodes in the pixel driving semiconductor portions 11 located on the two sides of the functional region FU are connected by the region connecting semiconductor portion 13, so that the pixel driving semiconductor portions 11 located on the two sides of the functional region FU in the row direction or the column direction are no longer separate, and the pixel driving semiconductor portions 11 located on the two sides of the functional region FU in the row direction or the column direction and the region connecting semiconductor portion 13 can be understood as also constituting a continuous semiconductor trace. Therefore, static electricity can be uniformly distributed on the continuous semiconductor trace corresponding to the functional region FU, and further, the reliability and uniformity of the performance of the pixel driving semiconductor portions 11 on the two sides of the functional region FU in the row direction or the column direction in the subsequent high-temperature fabrication process can be improved, the driving capabilities of the pixel circuits can be substantially consistent, the display uniformity can be achieved, and the display effect can be improved.

It is to be noted that, in FIG. 18, the pixel driving semiconductor portions 11 located on the two sides of the functional region FU in the row direction being connected to the region connecting semiconductor portion 13 is taken as an example for illustration, and the pixel driving semiconductor portions 11 located on the two sides of the functional region FU in the column direction are connected to the region connecting semiconductor portion 13 in the same manner as the above-described manner, which is not repeatedly described here. In each of the subsequent embodiments, the pixel driving semiconductor portions 11 located on the two sides of the functional region FU in the row direction being connected is taken as an example for illustration, and the connection of the pixel driving semiconductor portions in the column direction are the same as the connection of the pixel driving semiconductor portions in the row direction, which is not repeatedly described subsequently.

It is further to be noted that, in FIG. 18, only one structure of the pixel driving semiconductor portion 11 is taken as an example for illustration, and the connection relationship between the region connecting semiconductor portion 13 and the remaining structures of the pixel driving semiconductor portion 11 is the same as the above-described connection relationship, which is not repeatedly described here.

Figure 19:
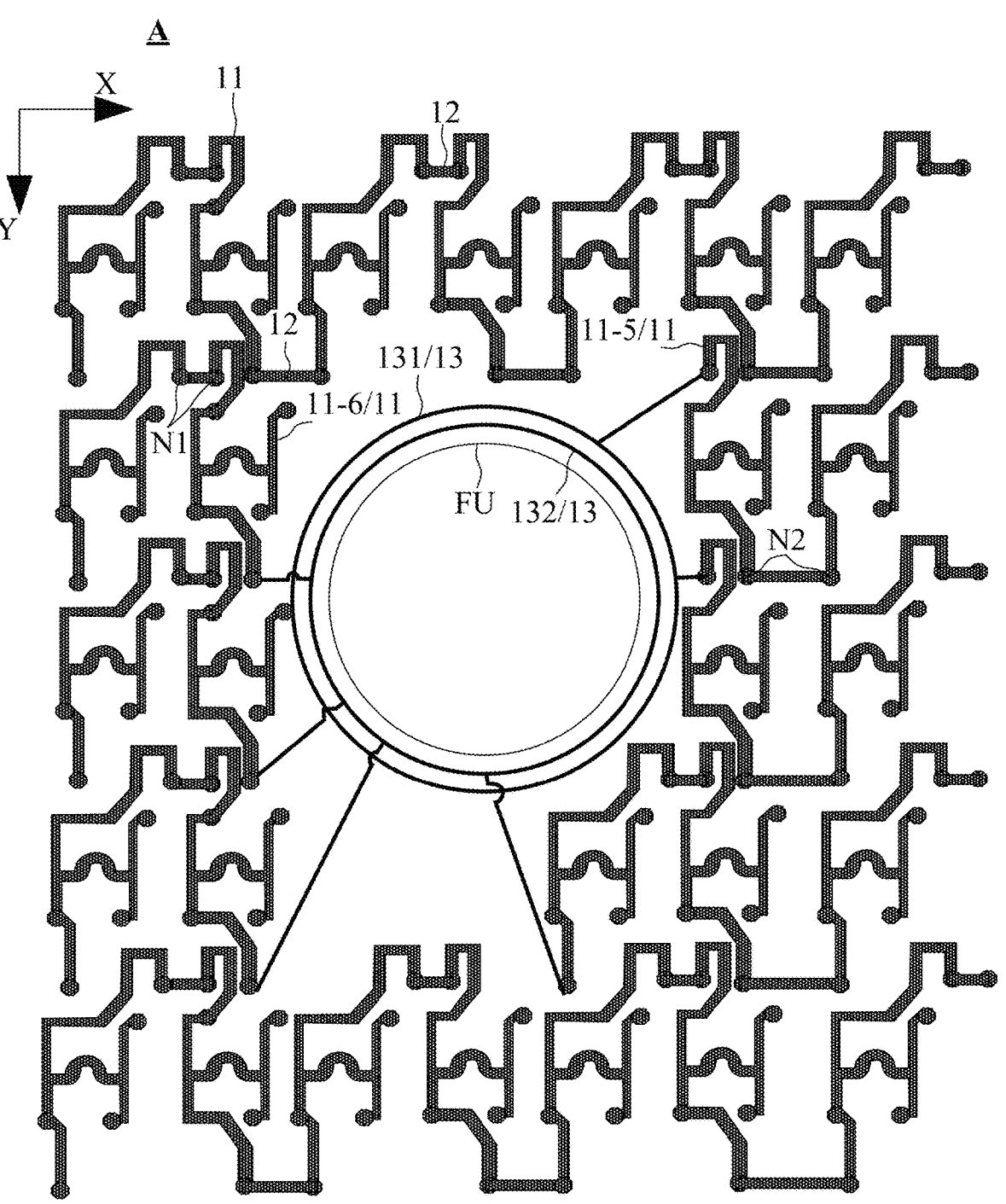
FIG. 19 is another enlarged exemplary view of the region A in FIG. 17.

On the basis of the above embodiments, FIG. 19 is another enlarged example diagram of the region A in FIG. 17. As shown in FIG. 19, the reference signal line includes the first reference signal line and the second reference signal line that extend in the row direction and are parallel to each other, and two fixed potential nodes include the first node and the second node. In the same pixel driving semiconductor portion, the first node is electrically connected to the first reference signal line, and the second node is electrically connected to the second reference signal line. The region connecting semiconductor portion 13 includes a first region connecting semiconductor portion 131 and a second region connecting semiconductor portion 132, and the pixel driving semiconductor portion 11 adjacent to the functional region FU includes a fifth pixel driving semiconductor portion 11-5 and a sixth pixel driving semiconductor portion 11-6. In the row direction X or the column direction Y, the second node N2 in the pixel driving semiconductor portion 11 located on the side of the fifth pixel driving semiconductor portion 11-5 away from the functional region FU is connected to the second node N2 in the fifth pixel driving semiconductor portion 11-5 by the pixel connecting semiconductor portion 12. In the row direction X or the column direction Y, the first node N1 in the pixel driving semiconductor portion 11 located on the side of the sixth pixel driving semiconductor portion 11-6 away from the functional region FU is connected to the first node N1 in the sixth pixel driving semiconductor portion 11-6 by the pixel connecting semiconductor portion 12. In the row direction X or the column direction Y, the first nodes N1 in at least two fifth pixel driving semiconductor portions 11-5 located on two sides of the functional region FU are connected by the first region connecting semiconductor portion 131. In the row direction X or the column direction Y, the second nodes N2 in at least two sixth pixel driving semiconductor portions 11-6 located on two sides of the functional region FU are connected by the second region connecting semiconductor portion 132.

Exemplarily, the reference signal line is not shown in FIG. 19, and for details of the scheme in which the reference signal line includes the first reference signal line and the second reference signal line, reference may be made to FIG. 2, FIG. 6, and FIG. 9 to FIG. 16, which are not repeatedly described here. By providing two reference signal lines, independent reference signals can be provided for the first node N1 and the second node N2 to ensure independent resetting of the gate of the drive transistor and the anode of the light-emitting element, thereby ensuring good resetting effect.

Further, in the row direction X or the column direction Y, the second node N2 in the pixel driving semiconductor portion 11 located on the side of the fifth pixel driving semiconductor portion 11-5 away from the functional region FU is connected to the second node N2 in the fifth pixel driving semiconductor portion 11-5 by the pixel connecting semiconductor portion 12, and the first node N1 in the pixel driving semiconductor portion 11 located on the side of the sixth pixel driving semiconductor portion 11-6 away from the functional region FU is connected to the first node N1 in the sixth pixel driving semiconductor portion 11-6 by the pixel connecting semiconductor portion 12, so that static electricity can be uniformly distributed on the continuous semiconductor trace corresponding to the two sides of the functional region FU, and further, the reliability and uniformity of the performance of the pixel driving semiconductor portions 11 on the two sides of the functional region FU in the row direction or the column direction in the subsequent high-temperature fabrication process can be improved. Therefore, the driving capabilities of the pixel circuits can be substantially consistent, the display uniformity can be achieved, and the display effect can be improved.

Further, among the pixel driving semiconductor portions 11 located on two sides of the functional region FU, at least the first nodes N1 in the fifth pixel driving semiconductor portions 11-5 are connected by the first region connecting semiconductor portion 131, and the first region connecting semiconductor portion 131 may transmit the first reference signal Vref to ensure to provide a reset signal for the first nodes N1 in the fifth pixel driving semiconductor portions 11-5 connected to the first region connecting semiconductor portion 131, thereby resetting the gates of the drive transistors in the fifth pixel driving semiconductor portions 11-5. Among the pixel driving semiconductor portions 11 located on two sides of the functional region FU, at least the second nodes N2 in the sixth pixel driving semiconductor portions 11-6 are connected by the second region connecting semiconductor portion 132, and the second region connecting semiconductor portion 132 may transmit the second reference signal Vref to ensure to provide a reset signal for the second nodes N2 in the sixth pixel driving semiconductor portions 11-6 connected to the second region connecting semiconductor portion 132, thereby resetting the anodes of the light-emitting elements corresponding to the sixth pixel driving semiconductor portions 11-6. In summary, the region connecting semiconductor portion 13 includes the first region connecting semiconductor portion 131 and the second region connecting semiconductor portion 132, and the first region connecting semiconductor portion 131 and the second region connecting semiconductor portion 132 can transmit different reference signals, thereby ensuring that the first nodes N1 and the second nodes N2 located on two sides of the functional region FU receive different signals separately, and ensuring that the pixel driving semiconductor portions 11 located on two sides of the functional region FU can provide different reset signals to the gates of the drive transistors and the anodes of the light-emitting elements corresponding to them, thereby ensuring the good reset effect.

Figure 20:
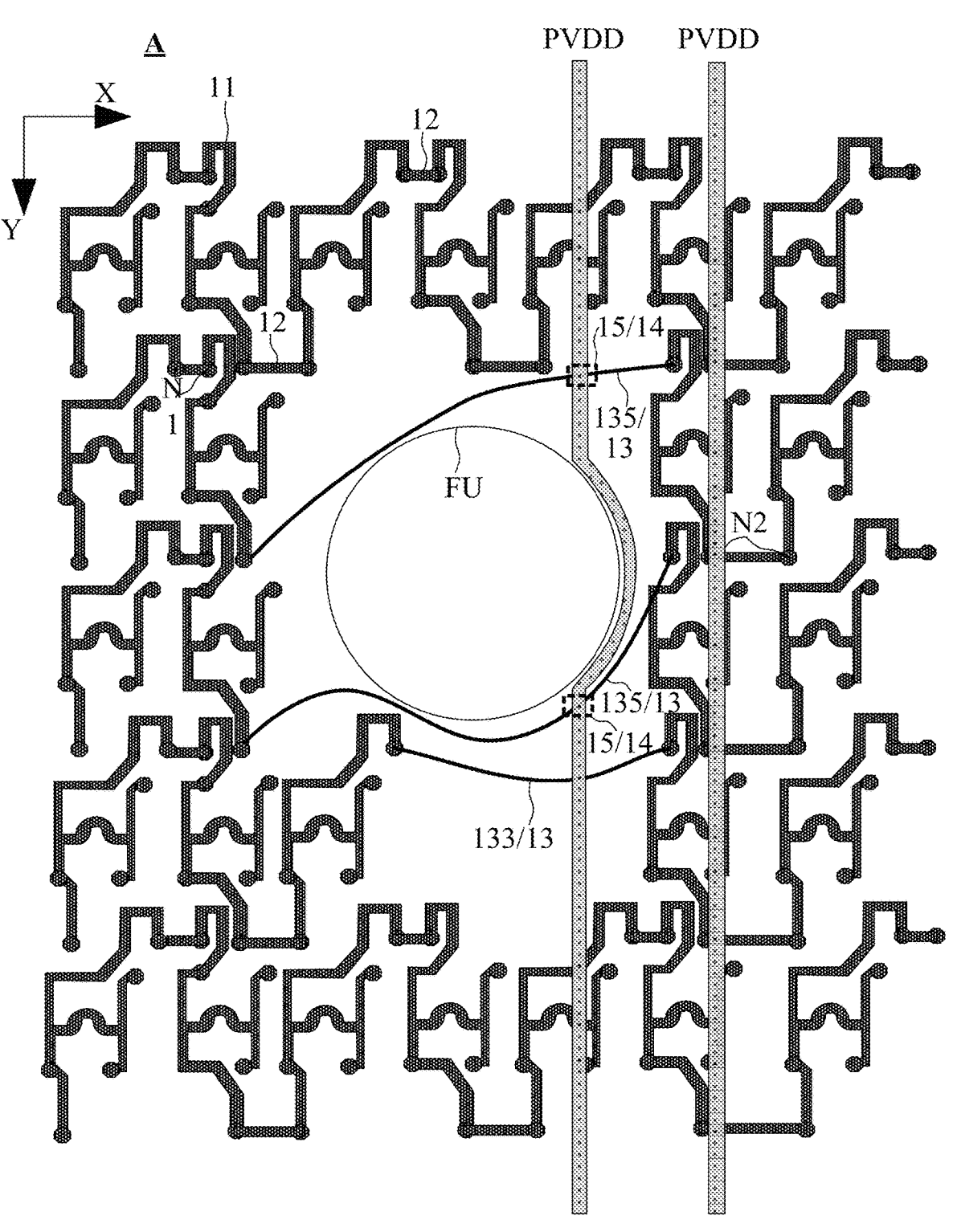
FIG. 20 is another enlarged exemplary view of the region A in FIG. 17.

On the basis of the above-described embodiment, FIG. 20 is another enlarged exemplary view of the region A in FIG. 17. As shown in FIG. 20, the region connecting semiconductor portion 13 includes a third region connecting semiconductor portion 133, and two first nodes N1 in pixel driving semiconductor portions 11 arranged in the row direction or the column direction and respectively located on two sides of the functional region FU are connected by the third region connecting semiconductor portion 133; and/or, the region connecting semiconductor portion 13 includes a fourth region connecting semiconductor portion, and two second nodes N2 in pixel driving semiconductor portions 11 arranged in the row direction or the column direction and respectively located on two sides of the functional region FU are connected by the fourth region connecting semiconductor portion; and/or, the region connecting semiconductor portion 13 includes a fifth region connecting semiconductor portion 135, and the first node N1 and the second node N2 in two pixel driving semiconductor portions 11 arranged in the row direction or the column direction and respectively located on two sides of the functional region FU are connected by the fifth region connecting semiconductor portion 135.

Exemplarily, only the third region connecting semiconductor portion 133 and the fifth region connecting semiconductor portion 135 are shown exemplarily in FIG. 20, and the fourth region connecting semiconductor portion is not shown in FIG. 20. The fourth region connecting semiconductor portion is configured to connect two second nodes N2 in pixel driving semiconductor portions 11 arranged in the row direction or the column direction and located on two sides of the functional region FU respectively, and the manner of connecting the fourth region connecting semiconductor portion to the second nodes N2 may refer to the manner of connecting the third region connecting semiconductor portion 133 to the first node N1, which is not repeatedly described here.

In an embodiment, the third region connecting semiconductor portion 133 is configured to connect two first nodes N1 in the pixel driving semiconductor portions 11 respectively located on two sides of the functional region FU in the row direction, the fourth region connecting semiconductor portion is configured to connect two second nodes N2 in the pixel driving semiconductor portions 11 respectively located on two sides of the functional region FU in the row direction, and the fifth region connecting semiconductor portion 135 is configured to connect the first node N1 and the second node N2 in the pixel driving semiconductor portions 11 respectively located on two sides of the functional region FU in the row direction, to ensure that two pixel driving semiconductor portions 11 respectively located on two sides of the functional region FU in the row direction are connected to form a continuous semiconductor trace, so that static electricity can be uniformly distributed on the continuous semiconductor trace corresponding to the two sides of the functional region FU, and further, the reliability and uniformity of the performance of the pixel driving semiconductor portions 11 on the two sides of the functional region FU in the row direction in the subsequent high-temperature fabrication process can be improved. Therefore, the driving capabilities of the pixel circuits can be substantially consistent, the display uniformity can be achieved, and the display effect can be improved.

Further, the first reference signal Vref may be transmitted over the third region connecting semiconductor portion 133 to ensure to provide a reset signal for the first nodes N1 in the pixel driving semiconductor portions 11 connected to the third region connecting semiconductor portion 133, thereby resetting the gates of the drive transistors in the pixel driving semiconductor portions 11. The second reference signal Vref may be transmitted over the fourth region connecting semiconductor portion to ensure to provide a reset signal for the second nodes N2 in the pixel driving semiconductor portions 11 connected to the fourth region connecting semiconductor portion, thereby resetting the anodes of the light-emitting elements corresponding to the pixel driving semiconductor portions 11, and ensuring the normal operation of the display circuits and the light-emitting elements connected to the pixel circuits.

With reference to FIG. 18, FIG. 19, and FIG. 20, for the case where the functional region is provided and the functional region blocks the connection relationship of the pixel driving semiconductor portions, the region connecting semiconductor portion may be provided to achieve the connection of the pixel driving semiconductor portions located on the two sides of the functional region in the row direction or the column direction. The region connecting semiconductor portion may be further divided into multiple cases, such as the first region connecting semiconductor portion, the second region connecting semiconductor portion, the third region connecting semiconductor portion, the fourth region connecting semiconductor portion, and the fifth region connecting semiconductor portion, depending on different connection cases, and reference may be made to the above description for the details. The region connecting semiconductor portion according to the embodiment of the present disclosure can be formed in the same film layer, made of the same material and fabricated in the same process as the pixel driving semiconductor portion, which ensures that the region connecting semiconductor portion can be easily arranged, and the display panel can be easily fabricated.

On the basis of the above-mentioned embodiments, with continued reference to FIG. 20, the region connecting semiconductor portion 13 includes the fifth region connecting semiconductor portion 135, and the array substrate 100 further includes a control portion 14. The control portion 14 at least partially overlap with and the fifth region connecting semiconductor portion 135 in the direction perpendicular to the plane where the array substrate is located, and the control portion 14 and the fifth region connecting semiconductor portion 135 constitute a switching element.

Exemplarily, since the fifth region connecting semiconductor portion 135 is configured to connect the first node N1 and the second node N2 in the pixel driving semiconductor portions 11 respectively located on two sides of the functional region FU in the row direction; however, since the reference signals required for the first node N1 and the second node N2 are different, the control portion 14 may be provided and the control portion 14 and the fifth region connecting semiconductor portion 135 constitute a switching element. Further, the switching element is controlled to turn off to control the open circuit between the first node N1 and the second node N2, to prevent the first node N1 and the second node N2 from being provided with the same reference signal transmitted through the fifth region connecting semiconductor portion 135, thereby avoiding the issue that the accuracy of resetting the gate of the drive transistor or the anode of the light-emitting element is not high.

Further, the switching element is provided such that the control portion 14 and the fifth region connecting semiconductor portion 135 at least partially overlap in the direction perpendicular to the plane where the array substrate is located. In this way, the control portion 14 and the fifth region connecting semiconductor portion 135 form a thin-film transistor, and a region where the control portion 14 and the fifth region connecting semiconductor portion 135 overlap serves as a conduction channel of the thin-film transistor.

The conduction channel is controlled by the control portion 14 to be cut off to achieve the turning off of the switching element, and further to control the open circuit between the first node N1 and the second node N2.

On the basis of the above-described embodiment, the control portion 14 may be further configured to be electrically connected to a fixed voltage terminal, and in this way, a fixed voltage signal may be transmitted in the control portion 14, and the fixed voltage signal may be used as a control signal for controlling the switching element to be turned off, so as to control the switching element to be kept in an off state.

For example, when the thin-film transistor formed by the control portion 14 and the fifth region connecting semiconductor portion 135 is a P-type thin-film transistor, the fixed voltage terminal may be controlled to transmit a high-level signal, and the high-level signal can control the P-type thin-film transistor to be in an off state. For another example, in the case where the thin-film transistor formed by the control portion 14 and the fifth region connecting semiconductor portion 135 is an N-type thin-film transistor, the fixed voltage terminal may be controlled to transmit a low-level signal, and the low-level signal can control the N-type thin-film transistor to be in an off state. In the embodiment of the present disclosure, it is taken as an example for illustration that the thin-film transistor formed by the control portion 14 and the fifth region connecting semiconductor portion 135 is a P-type thin-film transistor.

On the basis of the above described embodiment, and with continued reference to FIG. 20, the array substrate further includes a power signal line PVDD, and the power signal line PVDD extends along the column direction and is electrically connected to the pixel circuits. The power signal line PVDD includes a first branch part 15, and the first branch part 15 is also used as the control portion 14.

Exemplarily, it can be seen from the description of the structure and operation process of the pixel circuit with reference to FIG. 2 and FIG. 4 that the array substrate may further include the power signal line PVDD, and the power signal line PVDD is configured to provide a PVDD power signal for the light-emitting element to ensure that the light-emitting element can emit light normally. Generally, PVDD is a high-level signal. As shown in FIG. 20, the power signal line PVDD includes the first branch part 15, and the first branch part 15 is also used as the control portion 14, and the high-level PVDD power signal serves as the control signal of the switching element to control the switching element to remain off, thereby ensuring that the open circuit between the first node N1 and the second node N2 in the two pixel driving semiconductor portions located on the two sides of the functional region FU. In addition, the power signal line PVDD originally provided in the array substrate 100 serves as the control portion 14, which ensures that the control portion 14 can be provided in a simple way.

It is to be noted that, in FIG. 20, it is only taken as an example that the first branch part 15 is a part of the power signal line PVDD. It can be understood that according to the arrangement of the power signal line PVDD and the arrangement of the fifth region connecting semiconductor portion 135, the first branch part 15 may further include other arrangements, which is not limited in the embodiments of the present disclosure.

It is further to be noted that, only two power signal lines PVDD are shown in FIG. 20. It is to be understood that multiple power signal lines PVDD may be provided in the array substrate, for example, one power signal line PVDD may be provided for each column of the pixel driving semiconductor portions 11, and the specific arrangement of the power signal lines PVDD is not limited in the embodiment of the present disclosure. Further, the power signal line PVDD shown in FIG. 20 avoids the functional region FU and does not interfere with the arrangement of components in the functional region FU.

Figure 21:
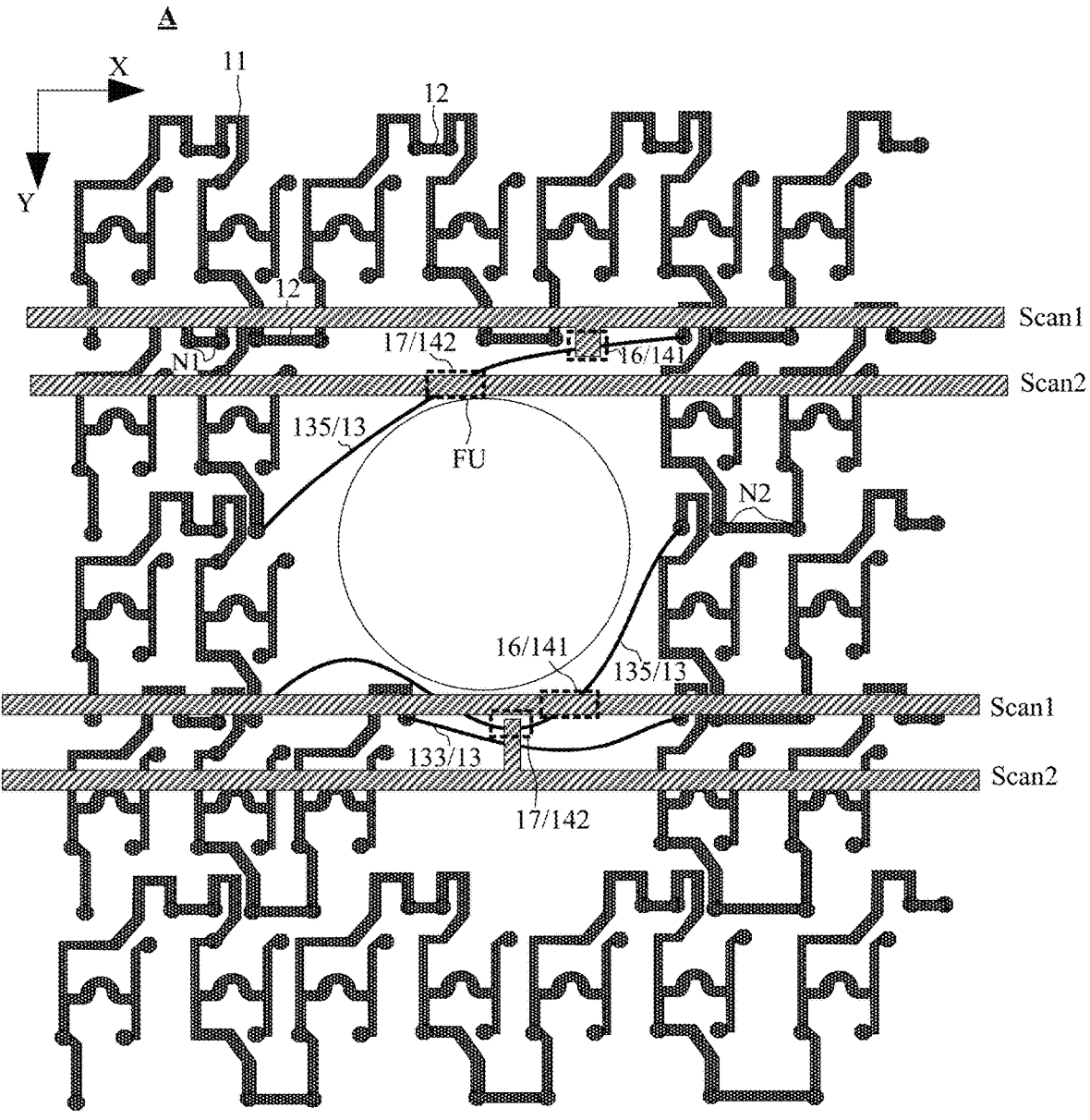
FIG. 21 is another enlarged exemplary view of the region A in FIG. 17.

In an embodiment, FIG. 21 is another enlarged exemplary view of the region A in FIG. 17. As shown in FIG. 21, the control portion 14 includes a first control portion 141 and a second control portion 142, the first control portion 141 and the second control portion 142 at least partially overlap with the same fifth region connecting semiconductor portion 135 in the direction perpendicular to the plane where the array substrate is located, and the first control portion 141 and the second control portion 142 do not overlap in the direction perpendicular to the plane where the array substrate is located. The first control portion 141 and the fifth region connecting semiconductor portion 135 as well as the second control portion 142 and the fifth region connecting semiconductor portion 135 respectively constitute a first sub-switching element and a second sub-switching element. The first control portion 141 and the second control portion 142 respectively receive different electrical signals, and at any time, at least one of the first sub-switching element and the second sub-switching element is in an off state.

Exemplarily, as shown in FIG. 21, the control portion 14 may further include a first control portion 141 and a second control portion 142. In the direction perpendicular to the substrate, each of the first control portion 141 and the second control portion 142 overlaps with the fifth region connecting semiconductor portion 135. Therefore, the first control portion 141 and one region of the fifth region connecting semiconductor portion 135 form a first sub-switch, and the second control portion 142 and another region of the fifth region connecting semiconductor portion 135 form a second sub-switch. At least one of the first sub-switching element and the second sub-switching element is in an off state, thereby ensuring that a signal transmitted in the fifth region connecting semiconductor portion 135 cannot be normally transmitted at the position of the first sub-switching element and/or the position of the second sub-switching element, and ensuring an open circuit between the first node N1 and the second node N2 in the two pixel driving semiconductor portions located on the two sides of the functional region FU.

On the basis of the above embodiment, with continued reference to FIG. 21, the array substrate further includes the first scan signal line Scan1 and the second scan signal line Scan2. The first scan signal line Scan1 extends in the row direction and is electrically connected to the pixel circuits, the first scan signal line includes a second branch part 16, and the second branch part 16 is also used as the first control portion 141. The second scan signal line Scan2 extends in the row direction and is electrically connected to the pixel circuits, the second scan signal line Scan2 includes a third branch part 17, and the third branch part 17 is also used as the second control portion 142.

Exemplarily, as can be seen from the description of the structure and operation process of the pixel circuits with reference to FIG. 2 and FIG. 4, the array substrate further includes the first scan signal line Scan1 and the second scan signal line Scan2, and the first scan signal line Scan1 and the second scan signal line Scan2 are configured to provide scan signals for the thin-film transistors in the pixel circuits to ensure normal operation of the pixel circuits. Generally, it can be known from the timing sequence diagram shown in FIG. 5 that at any time, at least one of the first scan signal line Scan1 and the second scan signal line Scan2 is a high-level signal. Therefore, in the case where the second branch part 16 in the first scan signal line Scan1 is also used as the first control portion 141 and the third branch part 17 in the second scan signal line Scan2 is also used as the second control portion 142, at least one signal of the signals of the second branch part 16 and the third branch part 17 is a high-level signal, so that at least one of the first sub-switching element and the second sub-switching element can be controlled to be in an off state. Thus, it can be ensured that the signal transmitted in the fifth region connecting semiconductor portion 135 cannot be normally transmitted at the position of the first sub-switching element and/or the position of the second sub-switching element and the open circuit between the first node N1 and the second node N2 in the two pixel driving semiconductor portions located on the two sides of the functional region FU can be ensued. In addition, the scan signal line originally provided in the array substrate 100 serves as the control portion 14, thereby ensuring that the control portion 14 can be provided in a simple manner.

It is to be noted that, in FIG. 21, the first scan signal line Scan1 and the second scan signal line Scan2 are shown only in a region corresponding to the fifth region connecting semiconductor portion 135. According to the foregoing description, each row of the pixel driving semiconductor portions 11 correspond to two scan signal lines, that is, the first scan signal line Scan1 and the second scan signal line Scan2. In FIG. 21, for the first scan signal line Scan1 and the second scan signal line Scan2 located above the functional region FU, it is taken as an example for illustration in FIG. 21 that the third branch part 17 is a part of the second scan signal line Scan2; and for the first scan signal line Scan1 and the second scan signal line Scan2 located below the functional region FU, it is taken as an example for illustration in FIG. 21 that the second branch part 16 is a part of the first scan signal line Scan1. It is to be understood that, according to the arrangements of the first scan signal line Scan1 and the second scan signal line Scan2 and the arrangement of the fifth region connecting semiconductor portion 135, the second branch part 16 and the third branch part 17 may also include other arrangements, which is not limited in the embodiment of the present application.

On the basis of the above-described embodiment, with continued reference to FIG. 2, the pixel circuit according to the embodiments of the present disclosure may further include a first connection part 18 and a second connection part 19, the reference signal line Vref includes the first reference signal line Vref1 and the second reference signal line Vref2 that extend in the row direction and are parallel to each other, and two fixed potential nodes include a first node N1 and a second node N2. The first node N1 and the first reference signal line Vref1 are electrically connected by the first connection part 18; and the second node N2 and the second reference signal line Vref2 are electrically connected by the second connection part 19.

Exemplarily, with continued reference to FIG. 2, the first node N1 is electrically connected to the first reference signal line Vref1 through the first connection part 18 to achieve the transmission of the first reference signal, thereby ensuring that the gate of the drive transistor can be reset. The second node N2 is electrically connected to the second reference signal line Vref2 by the second connection part 19 to achieve the transmission of the second reference signal, thereby ensuring that the anode of the light-emitting element can be reset and ensuring the normal operation of the display panel.

On the basis of the above-described embodiments, with continued reference to FIG. 2, the array substrate includes a substrate and a drive circuit layer arranged on the substrate, and the drive circuit layer includes a semiconductor layer, a first metal layer, a capacitive metal layer, a second metal layer, and a third metal layer that are stacked in a direction away from the substrate.

The pixel driving semiconductor portion is located on the semiconductor layer, the reference signal line is located on the first metal layer or the capacitive metal layer, and the first connection part and the second connection part are located on the second metal layer or the third metal layer.

It can be known from the foregoing that the pixel circuit may include multiple thin-film transistors and a storage capacitor, each of the thin-film transistors includes an active layer, a gate, a source and a drain; and the storage capacitor includes a first capacitor plate and a second capacitor plate. The array substrate further includes a scan signal line, a data signal line, a reference signal line, and a power signal line. Where the active layer is the pixel driving semiconductor portion, that is, the active layer is d located in the semiconductor layer located in the drive circuit layer and is located on the side of the drive circuit layer close to the substrate. Further, the gate, the first capacitor plate, and the scan signal line may be located in the first metal layer in the drive circuit layer. The second capacitor plate may be located in the capacitive metal layer in the drive circuit layer. The source and the drain and the data signal line may be located in the second metal layer. The power signal line may be located in the second metal layer and/or the third metal layer. Further, the reference signal line may be located in the first metal layer or the capacitive metal layer, the first connection part and the second connection part may be located in the second metal layer or the third metal layer, and the first connection part and the second connection part are electrically connected to the reference signal line through via holes, respectively, for implementing the transmission of reference signals. In this way, the arrangement of the first connection part and the second connection part is achieved by using the film layer in the drive circuit layer, thereby ensuring the arrangement of the first connection part and the second connection part to be simple and the film layer structure of the display panel to be simple.

Figure 22:
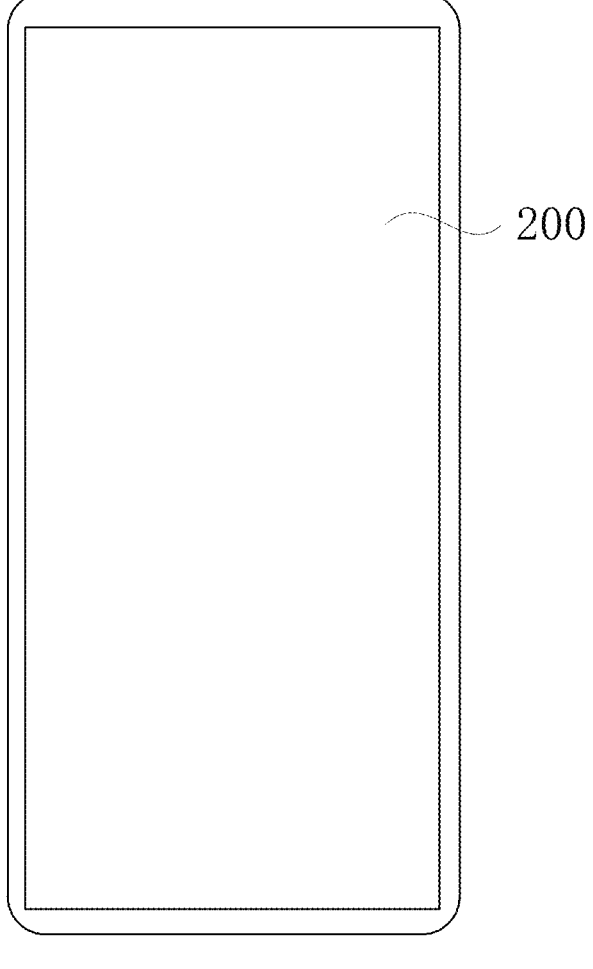
FIG. 22 is a structural diagram of a display device according to an embodiment of the present disclosure.

Based on the same concept described above, a display device is further provided according to an embodiment of the present disclosure. FIG. 22 is a structural diagram of a display device according to an embodiment of the present disclosure. As shown in FIG. 22, the display device includes the display panel 200 in the above-described embodiments. The display device includes a display panel according to any embodiment of the present disclosure, and therefore, the display device according to the embodiment of the present disclosure has corresponding advantageous effects of the display panel according to the embodiments of the present disclosure, and details are not described herein again. Exemplarily, the display device may be a mobile phone, a computer, a smart wearable device (for example, a smart watch), an onboard display device, and other electronic devices, which is not limited in the embodiments of the present disclosure.

It is to be noted that the above are merely preferred embodiments of the present disclosure and technical principles used therein. The combined implementation of multiple embodiments may be implemented on the premise that there is no contradiction in the combined implementation. The person skilled in the art will appreciate that the present disclosure is not limited to the particular embodiments herein and that various significant changes, readjustments, combinations and substitutions can be made for the person skilled in the art without departing from the scope of protection of the present disclosure. Therefore, while the present disclosure has been described in detail through the above-mentioned embodiments, the present disclosure is not limited to the above-described embodiments and may include more other equivalent embodiments without departing from the concept of the present disclosure. The scope of the present disclosure is determined by the scope of the appended claims.

What is claimed is:

1. A display panel, comprising an array substrate, wherein the array substrate comprises:

a plurality of pixel circuits, wherein the plurality of pixel circuits is arranged in an array in a row direction and a column direction, a pixel circuit comprises a pixel driving semiconductor portion, the pixel driving semiconductor portion comprises connecting nodes, and the row direction intersects the column direction;

a plurality of reference signal lines, wherein the connecting nodes are electrically connected to one of the plurality of reference signal lines; and a plurality of pixel connecting semiconductor portions, wherein at least two connecting nodes adjacent in a first direction are electrically connected by one of the plurality of pixel connecting semiconductor portions, and the first direction is parallel to a plane where the array substrate is located;

wherein the pixel circuit further comprises a drive transistor, a light-emitting element, a first reset transistor and a second reset transistor; the pixel driving semiconductor portion comprises at least two connecting nodes, and the at least two connecting nodes comprise a first node and a second node; one terminal of the first reset transistor is electrically connected to the first node, and another terminal of the first reset transistor is electrically connected to a gate of the drive transistor; one terminal of the second reset transistor is electrically connected to the second node, and another terminal of the second reset transistor is electrically connected to an anode of the light-emitting element; and wherein the plurality of reference signal lines comprises a plurality of third reference signal lines extending in the column direction and a plurality of fourth reference signal lines extending in the column direction, first nodes are electrically connected to the plurality of third reference signal lines, and second nodes are electrically connected to the plurality of fourth reference signal lines.

2. The display panel according to claim 1, wherein the plurality of reference signal lines comprises at least one first reference signal line and at least one second reference signal line that extend in the row direction; and in a same pixel driving semiconductor portion, the first node is electrically connected to one of the at least one first reference signal line, and the second node is electrically connected to one of the at least one second reference signal line; and two pixel driving semiconductor portions adjacent in the row direction comprise a first pixel driving semiconductor portion and a second pixel driving semiconductor portion; and the first node in the first pixel driving semiconductor portion is electrically connected to the first node in the second pixel driving semiconductor portion by one of the plurality of pixel connecting semiconductor portions, or, the second node in the first pixel driving semiconductor portion is electrically connected to the second node in the second pixel driving semiconductor portion by one of the plurality of pixel connecting semiconductor portions.

3. The display panel according to claim 2, wherein pixel driving semiconductor portions arranged in the column direction comprise pixel driving semiconductor portions in a j-th row and pixel driving semiconductor portions in a (j+1)-th row, wherein j is a positive integer; and in a direction extending in the column direction, a second pixel connecting semiconductor section electrically connected to second nodes in the pixel driving semiconductor sections in the j-th row and a first pixel connecting semiconductor section electrically connected to first nodes in the pixel driving semiconductor sections in the (j+1)-th row are on a same dummy straight line extending in the row direction;

the pixel driving semiconductor portion comprises an anode connecting point, and an anode of the light-emitting element is electrically connected to the anode connecting point; and in the column direction, one of the plurality of reference signal lines is located between anode connecting points of the pixel driving semiconductor portions in the j-th row and the dummy straight line.

4. The display panel according to claim 2, wherein the first node and the second node in the pixel driving semiconductor portion are respectively located on two opposite sides of the pixel driving semiconductor portion in a second direction, and the second direction is parallel to the plane where the array substrate is located and is parallel to the column direction or an included angle between the second direction and the column direction is an acute angle; and in the row direction, patterns of pixel driving semiconductor portions in two adjacent pixel circuits arranged sequentially are different and patterns of two pixel driving semiconductor portions spaced apart by one pixel driving semiconductor portion are the same.

5. The display panel according to claim 2, wherein a number of rows of pixel driving semiconductor portions in the column direction is N, and a number of the at least one first reference signal line is n1 and a number of the at least one second reference signal line is n2, wherein 2N=n1+n2, and n1=n2.

6. The display panel according to claim 5, wherein the n1 first reference signal lines and the n2 second reference signal lines are alternately arranged in the column direction.

7. The display panel according to claim 1, wherein the plurality of third reference signal lines and the plurality of fourth reference signal lines are alternately arranged in the row direction.

8. The display panel according to claim 1, wherein a plurality of pixel driving semiconductor portions comprise a pixel driving semiconductor portion in an i-th column, a pixel driving semiconductor portion in an (i+1)-th column, a pixel driving semiconductor portion in an (i+2)-th column, and a pixel driving semiconductor portion in an (i+3)-th column sequentially arranged in the row direction, wherein i is a positive integer; and the first node in the pixel driving semiconductor portion in the i-th column and the first node in the pixel driving semiconductor portion in the (i+1)-th column are electrically connected to one of the plurality of third reference signal lines, the first node in the pixel driving semiconductor portion in the (i+2)-th column and the first node in the pixel driving semiconductor portion in the (i+3)-th column are electrically connected to another one of the plurality of third reference signal lines, and the second node in the pixel driving semiconductor portion in the (i+1)-th column and the second node in the pixel driving semiconductor portion in the (i+2)-th column are electrically connected to one of the plurality of fourth reference signal lines.

9. The display panel according to claim 8, wherein the one of the plurality of third reference signal lines is electrically connected to the pixel driving semiconductor portion in the i-th column through a first via hole, and in a direction perpendicular to a plane where the display panel is located, the one of the plurality of third reference signal lines and the first node in the pixel driving semiconductor portion in the i-th column at least partially overlap.

10. The display panel according to claim 8, wherein the one of the plurality of fourth reference signal lines is electrically connected to the pixel driving semiconductor portion in the (i+1)-th column through a second via hole, and in a direction perpendicular to a plane where the display panel is located, the one of the plurality of fourth reference signal lines and the second node in the pixel driving semiconductor portion in the (i+1)-th column at least partially overlap.

11. The display panel according to claim 1, wherein in the column direction, the plurality of reference signal lines comprises first reference signal lines extending in the row direction and second reference signal lines extending in the row direction.

12. The display panel according to claim 11, wherein a number of rows of pixel driving semiconductor portions in the column direction is N, a number of the first reference signal lines is n1, and a number of the second reference signal lines is n2, wherein 2N=n1+n2, and n1=n2.

13. The display panel according to claim 11, wherein
at least one of the first reference signal lines extending in the row direction is electrically connected to at least two of the plurality of third reference signal lines arranged in the row direction; and
at least one of the second reference signal lines extending in the row direction is electrically connected to at least two of the plurality of fourth reference signal lines arranged in the row direction.

14. The display panel according to claim 11, wherein the first reference signal lines and the second reference signal lines are alternately arranged.

15. The display panel of claim 11, wherein in a direction perpendicular to a plane where the display panel is located, at least one row of pixel driving semiconductor portions overlaps one of the first reference signal lines and one of the second reference signal lines.

16. The display panel according to claim 1, wherein the pixel driving semiconductor portion and the plurality of pixel connecting semiconductor portions are arranged in a same layer.

17. The display panel according to claim 1, wherein the first direction is the row direction.

18. A display device, comprising the display panel according to claim 1.

19. A display panel, comprising an array substrate, wherein the array substrate comprises:
a plurality of pixel circuits, wherein the plurality of pixel circuits is arranged in an array in a row direction and a column direction, a pixel circuit comprises a pixel driving semiconductor portion, the pixel driving semiconductor portion comprises a connecting node, and the row direction intersects the column direction;
a plurality of reference signal lines, wherein the connecting node is electrically connected to one of the plurality of reference signal lines; and
a plurality of pixel connecting semiconductor portions, wherein at least two connecting nodes adjacent in a first direction are electrically connected by one of the plurality of pixel connecting semiconductor portions, and the first direction is parallel to a plane where the array substrate is located;
wherein the pixel circuit further comprises a plurality of transistors, and at least one of the plurality of transistors is an N-type transistor;
wherein the pixel circuit further comprises a drive transistor, a light-emitting element, and a first reset transistor, and the first reset transistor is an N-type transistor; the connecting node comprises a first node, one terminal of the first reset transistor is electrically connected to the first node, and another terminal of the first reset transistor is electrically connected to a gate of the drive transistor; and two pixel driving semiconductor portions adjacent in the row direction comprise a first pixel driving semiconductor portion and a second pixel driving semiconductor portion, and the first node in the first pixel driving semiconductor portion is electrically connected to the first node in the second pixel driving semiconductor portion by one of the plurality of pixel connecting semiconductor portions;
wherein an active layer of the first reset transistor comprises an oxide semiconductor layer; and
wherein the array substrate further comprises a substrate and a drive circuit layer disposed on the substrate, the drive circuit layer comprises a first semiconductor layer, a first gate electrode layer, a capacitor metal layer, a second semiconductor layer, a second gate electrode layer, a second metal layer and a third metal layer stacked in a direction away from the substrate; the active layer of the first reset transistor is located at the second semiconductor layer; and the pixel driving semiconductor portion further comprises the active layer of the first reset transistor, and the plurality of pixel connecting semiconductor portions and the active layer of the first reset transistor are arranged in a same layer.

20. The display panel according to claim 19, wherein the display panel further comprises a connecting electrode, and the first node in the first pixel driving semiconductor portion and the first node in the second pixel driving semiconductor portion are electrically connected by the connecting electrode; and
the connecting electrode and the second metal layer are arranged in a same layer.

21. The display panel according to claim 20, wherein
the connecting electrode is electrically connected to the first node through a fifth via hole;
one of the plurality of reference signal lines is electrically connected to the connecting electrode or one of the plurality of pixel connecting semiconductor portions through a sixth via hole; and
the fifth via hole and the sixth via hole do not overlap in a direction perpendicular to a plane where the display panel is located.

22. The display panel according to claim 20, wherein in the column direction, a width of the connecting electrode is greater than a width of the active layer of the first reset transistor.

23. The display panel according to claim 19, wherein the pixel driving semiconductor portion and the plurality of pixel connecting semiconductor portions are arranged in a same layer.

24. The display panel according to claim 23, wherein the pixel circuit further comprises a second reset transistor;

the connecting node further comprises a second node, one terminal of the second reset transistor is electrically connected to the second node, and another terminal of the second reset transistor is electrically connected to an anode of the light-emitting element; and the second node in the first pixel driving semiconductor portion and the second node in the second pixel driving semiconductor portion are electrically connected by one of the plurality of pixel connecting semiconductor portions.

25. The display panel according to claim 24, wherein an active layer of the second reset transistor is located at the first semiconductor layer; and the pixel driving semiconductor portion comprises the active layer of the second reset transistor, and the plurality of pixel connecting semiconductor portions and the active layer of the second reset transistor are arranged in a same layer.

26. The display panel according to claim 25, wherein active layers of two second reset transistors electrically connected by one of the plurality of pixel connecting semiconductor portions are inclined in directions in which the active layers approach each other.

* * * * *